US007118848B2

(12) United States Patent
Hotta et al.

(10) Patent No.: US 7,118,848 B2
(45) **Date of Patent: *Oct. 10, 2006**

(54) SUPPORT FOR LITHOGRAPHIC PRINTING PLATE AND ORIGINAL FORME FOR LITHOGRAPHIC PRINTING PLATE

(75) Inventors: Hisashi Hotta, Shizuoka (JP); Yoshinori Hotta, Shizuoka (JP); Kazuo Maemoto, Shizuoka (JP)

(73) Assignee: Fuji Photo Film Co., Ltd., Kanagawa (JP)

( * ) Notice: Subject to any disclaimer, the term of this patent is extended or adjusted under 35 U.S.C. 154(b) by 311 days.

This patent is subject to a terminal disclaimer.

(21) Appl. No.: 10/112,729

(22) Filed: Apr. 2, 2002

(65) Prior Publication Data

US 2003/0031860 A1 Feb. 13, 2003

(30) Foreign Application Priority Data

Apr. 3, 2001 (JP) .............................. 2001-104242
Jul. 23, 2001 (JP) .............................. 2001-221804

(51) Int. Cl.
*G03F 7/00* (2006.01)

(52) U.S. Cl. .................. 430/302; 430/138; 430/270.1; 428/141; 428/336

(58) Field of Classification Search ................ 430/138, 430/270.1, 302; 428/336, 141
See application file for complete search history.

(56) References Cited

U.S. PATENT DOCUMENTS 3,511,661 A * 5/1970 Rauner et al. ........... 430/278.1
3,865,595 A * 2/1975 Watkinson .................. 430/166
5,188,032 A * 2/1993 Lewis et al. ................ 101/453
5,632,204 A * 5/1997 Lewis ........................ 101/453
6,077,641 A 6/2000 Parsons et al.
6,136,425 A * 10/2000 Akiyama et al. ........ 428/314.2
6,207,348 B1 3/2001 Deboer et al.
6,238,839 B1 * 5/2001 Tomita et al. ........... 430/278.1
6,566,029 B1 * 5/2003 Kawamura et al. ......... 430/138
2003/0148207 A1 * 8/2003 Maemoto et al. ........... 430/138
2003/0165768 A1 * 9/2003 Hotta et al. ................. 430/146

FOREIGN PATENT DOCUMENTS

| | | | |
|---|---|---|---|
| EP | 1 078 736 | A1 | 2/2001 |
| EP | 1 142 708 | A1 | 10/2001 |
| EP | 1157854 | A2 * | 11/2001 |
| EP | 1 219 464 | A2 | 7/2002 |
| JP | 10-31304 | | 2/1998 |
| JP | 10-31317 | | 2/1998 |

* cited by examiner

*Primary Examiner*—Amanda Walke
(74) *Attorney, Agent, or Firm*—Sughrue Mion, PLLC

(57) ABSTRACT

This invention provides a support for a lithographic printing plate, and an original form of a heat-sensitive lithographic printing plate, which comprises a hydrophilic film formed on a metallic base whose surface has been roughened, said hydrophilic film having a heat conductivity of 0.05–0.5 W/(m·K) in the direction of its film thickness, which when used as the development on machine type, exhibits good on-press, or good non-treatment developability, a high sensitivity, a long press life and a preferable stain resistance and ink removal property upon printing and which, when used as a conventional thermal positive or negative type, makes efficient utilization of heat for the formation of image, has a high sensitivity and exhibits a long press life and a good stain resistance in a nonimage area, wherein the non-treatment in which the development is not performed.

15 Claims, 3 Drawing Sheets

SUPPORT FOR LITHOGRAPHIC PRINTING PLATE AND ORIGINAL FORME FOR LITHOGRAPHIC PRINTING PLATE

BACKGROUND OF THE INVENTION

1. Field of the Invention

This invention relates to a support for a lithographic printing plate and an original forme for the lithographic printing plate (hereinafter also abbreviated as lithographic printing original plate for ease of description). More specifically, the present invention relates to: an original forme for a heat-sensitive lithographic printing plate, which may be used suitably for the computer-to-plate system that does not require the development process, in particular a heat-sensitive lithographic printing plate which may be image-recorded by means of infrared-scanning exposure based on digital signals and may be mounted directly to a printing machine to perform printing without performing the conventional development process using a developer after exposure; and a support for the lithographic printing plate which is used therefore. Also, it relates to: an original forme for a heat-sensitive lithographic printing plate, which is printable after performing a conventional development process using a developer after the exposure; and a support for the lithographic printing plate which is used therefore.

2. Description of the Related Art

There have been many studies on a lithographic printing original plate used for the computer-to-plate system which has developed remarkably in recent years. In particular, aiming at a further rationalized printing process and the solution for the problem of waste liquor disposal, a number of studies have been conducted and a variety of proposals have been made as to a lithographic printing original plate which may be directly mounted to a printing machine after the exposure to carry out printing.

As a promising technique, there is a lithographic printing original plate which comprises as a heat-sensitive image-forming layer of a water receptive layer in which particles of hydrophobic thermoplastic polymer are dispersed in a hydrophilic binder polymer. This lithographic printing original plate utilizes the principle such that, when the heat-sensitive layer is heated, the particles of hydrophobic thermoplastic polymer are fused together so that the surface of a hydrophilic heat-sensitive layer is changed to an ink-receptive image area.

For such a lithographic printing original plate utilizing the thermal fusion of particles of hydrophobic thermoplastic polymer, as one means to reduce the number of treatment processes, there is a method called on-press development wherein the lithographic printing original plate after the exposure is mounted to the cylinder of a printing machine without performing thereon a treatment with developer solution and then nonimaged areas of the original forme is removed by feeding ink and/or damping solution while rotating the cylinder, or a lithographic printing original plate of a non-treatment type in which the development is not performed. In the latter method, the lithographic printing original plate is directly mounted to a printing machine after performing the exposure and printing is completed without performing the development according to a conventional printing process.

Such a lithographic printing original plate, which is suitable for the on-press development or non-treatment type printing plate, includes a heat-sensitive layer soluble in a damping solution or ink solvent and is required to have handleability under light which is suitable for performing the development on a printing machine placed in a light room.

For example, JP 2,938,397 B describes a lithographic printing plate wherein a heat-sensitive layer, in which fine particles of thermoplastic hydrophobic polymer are dispersed in a hydrophilic binder polymer, is formed on a hydrophilic support. In the specification thereof, it is described that the on-press development can be carried out by exposing the above-mentioned lithographic printing original plate to an infrared laser to thereby unite fine particles of thermoplastic hydrophobic polymer by heat to form an image, and then mounting it to a cylinder of a printing machine and feeding ink and/or damping solution.

JP 9-127683 A and WO 99/10186 describe the production of a lithographic printing plate by uniting thermoplastic fine particles by heat and then performing the on-press development.

Such a lithographic printing original plate, on which an image is formed by the uniting of fine particles by heat, exhibits a good on-press developability. However, it has such problems as reduced sensitivity due to loss of heat to the metal support, and an insufficient press life due to reduced hardness of an image area on the heat sensitive layer in the case where the uniting of the fine particles was insufficient.

As a countermeasure to these problems, a method has been proposed, in which a water-insoluble organic polymer is provided between an aluminum support and a heat-sensitive layer (for example, JP 2000-23983 A). Although this method provides higher sensitivity, it has a problem in that contamination occurs.

Incidentally, examples of the conventional thermal-type lithographic printing plates in which on-press development is not performed include: the so-called thermal type positive lithographic printing original plate wherein an infrared absorbent in the heat-sensitive layer expresses it photothermal conversion action and generates heat upon the exposure and the exposed areas of the heat-sensitive layer are alkali-solubilized with the heat thus generated to form a positive image; and the thermal type negative lithographic printing original plate wherein a radical-yielding agent and an acid-generating agent respectively generate radicals and acids with the heat thus generated, whereby the radical polymerization and acid bridging reactions proceed to insolubilize the exposed areas to thereby form a negative image. However, these have the problems as mentioned below.

That is, in such an image formation process of a thermal type, a heat is produced by a photothermal conversion in the heat-sensitive layer by means of laser beam and the thus produced heat causes a reaction for the image-formation. Here, in the aluminum support whose surface has been roughened and on which an anodized film is formed, the heat conductivity of the support is extremely higher than that of the heat-sensitive layer, so that the heat generated in the vicinity of the interface between the heat-sensitive layer and the support is dispersed into the inside of the support before it is adequately used for the formation of image. As a result, the following problems occur on the interface between the heat-sensitive layer and the support.

First, with respect to the positive type heat-sensitive layer, there is a problem of low sensitivity. That is, when the heat is dispersed into the inside of support to cause an insufficient alkali-solubilization reaction, a film remains on otherwise nonimage areas, which is regarded as an essential problem of a positive type heat-sensitive layer.

Further, in such a lithographic printing original plate of thermal positive type, an infrared absorbent having a photothermal conversion function must be provided. Such an infrared absorbent has a low solubility due to its relatively high molecular weight, and is difficult to remove since it is adsorbed onto the micro-openings formed through the anodic oxidation, so that during the development process using the alkaline developer, the problem of residual films can easily occur.

On the other hand, in the negative type heat-sensitive layer, when the heat is dispersed into the inside of support to cause insufficient developer-insolubilization of the heat-sensitive layer in the vicinity of the interface between the heat-sensitive layer and the support, an image may not be formed in a satisfactory manner in an area that should be the image area and is carried away during the development, or even if an image is formed, it may be easily peeled off during the printing.

SUMMARY OF THE INVENTION

The present invention has been made in view of the above, and an object thereof is to provide an original forme of a heat-sensitive lithographic printing plate which overcome the defects of the above-mentioned prior art, and a support for a lithographic printing plate which may be suitably used therefore. Namely, the object of the invention is to provide: an original forme of a heat-sensitive lithographic printing plate, which when used as the development on machine type, exhibits good on-press developability, a high sensitivity, a long press life and a preferable stain resistance and ink removal property upon printing and which, when used as a conventional thermal positive or negative type, makes efficient utilization of heat for the formation of image, has a high sensitivity and exhibits a long press life and a good stain resistance in a nonimage area; and a support for the lithographic printing plate, which may be suitably used therefore.

The present inventors, as a result of intensive studies, have found that the above object may be accomplished by forming a hydrophilic film having a heat conductivity of a specified range on a metallic base and/or aluminum base applied with a special surface treatment and then forming an image recording layer being exposable with infrared laser, thereby completing this invention.

Namely, the present invention provides the following inventions and any combination thereof.

There is provided a support for a lithographic printing plate, which comprises a hydrophilic film formed on a metallic base whose surface has been roughened, the hydrophilic film having a heat conductivity of 0.05–0.5 W/(m·K) in the direction of its film thickness.

Here, the film thickness of the above hydrophilic film is preferably 0.1–5 μm.

There is provided an original forme for a lithographic printing plate, which comprises a recording layer formed on the above-mentioned support for a lithographic printing plate, the recording layer being writable by exposure with infrared laser.

There is provided an original forme for a lithographic printing plate, comprising a recording layer which is writable by exposure with infrared laser and which is formed on a support for a lithographic printing plate, the support being subjected to electrochemical roughening treatment with an aqueous solution containing hydrochloric acid and including a hydrophilic film having a heat conductivity of 0.05–0.5 W/(m·K).

There is provided an original forme of a lithographic printing plate, comprising a recording layer which is writable by exposure with infrared laser and which is formed on a support for a lithographic printing plate, the support being subjected to electrochemical roughening treatment with an aqueous solution containing hydrochloric acid and including a hydrophilic film having a density of 1000–3200 kg/$m^3$ and/or a porosity of 20–70%.

There is provided an original forme of a lithographic printing plate, comprising a recording layer which is writable by exposure with infrared laser and which is formed on a support for a lithographic printing plate having a hydrophilic film, the hydrophilic film having a mean opening diameter of roughened small pits of 0.01–3 μm, a ratio of mean depth to mean opening diameter of the roughened small pits of 0.1–0.5, and a heat conductivity of 0.05–0.5 W/(m·K)

There is provided an original forme of a lithographic printing plate, comprising a recording layer which is writable by exposure with infrared laser and which is formed on a support for a lithographic printing plate having a hydrophilic film, the hydrophilic film having a mean opening diameter of roughened small pits of 0.01–3 μm, a ratio of mean depth to mean opening diameter of the roughened small pits of 0.1–0.5, and a density of 1000–3200 kg/$m^3$ and/or a porosity of 20–70%.

It is preferable that the mean opening diameter of large undulation of the support for a lithographic printing plate is 3–20 μm.

It is preferable that the hydrophilic film is an anodic oxide film.

It is preferable that the amount of the anodic oxide film formed is 3.2 g/$m^2$ or more than 3.2 g/$m^2$.

It is preferable that the pore diameter on the surface layer of the anodic oxide film is 40 nm or less than 40 nm.

It is preferable that the anodic oxide film is pore-sealed.

It is preferable that a layer of particles having a mean particle size of 8–800 nm is formed on the anodic oxide film.

It is preferable that the anodic oxide film is formed by anodic oxidation that consists of more than two steps.

It is preferable that the anodic oxidation is performed with an electrolyte containing sulfuric acid in the first step and then with an electrolyte containing phosphoric acid in the second and subsequent steps.

According to a preferable aspect of the present invention, the above-mentioned recording layer is a heat-sensitive layer containing one of: (a) fine polymer particles having heat reactive functional group; and (b) microcapsules including a compound having heat reactive functional group.

There is provided a plate-making and printing method for a lithographic printing plate, in which the above-mentioned original forme for a lithographic printing plate is printable by either exposing it to a laser beam and then directly mounting it to a printing machine, or directly exposing it to a laser beam after mounting it to a printing machine.

DETAILED DESCRIPTION OF THE INVENTION

Figure 1:
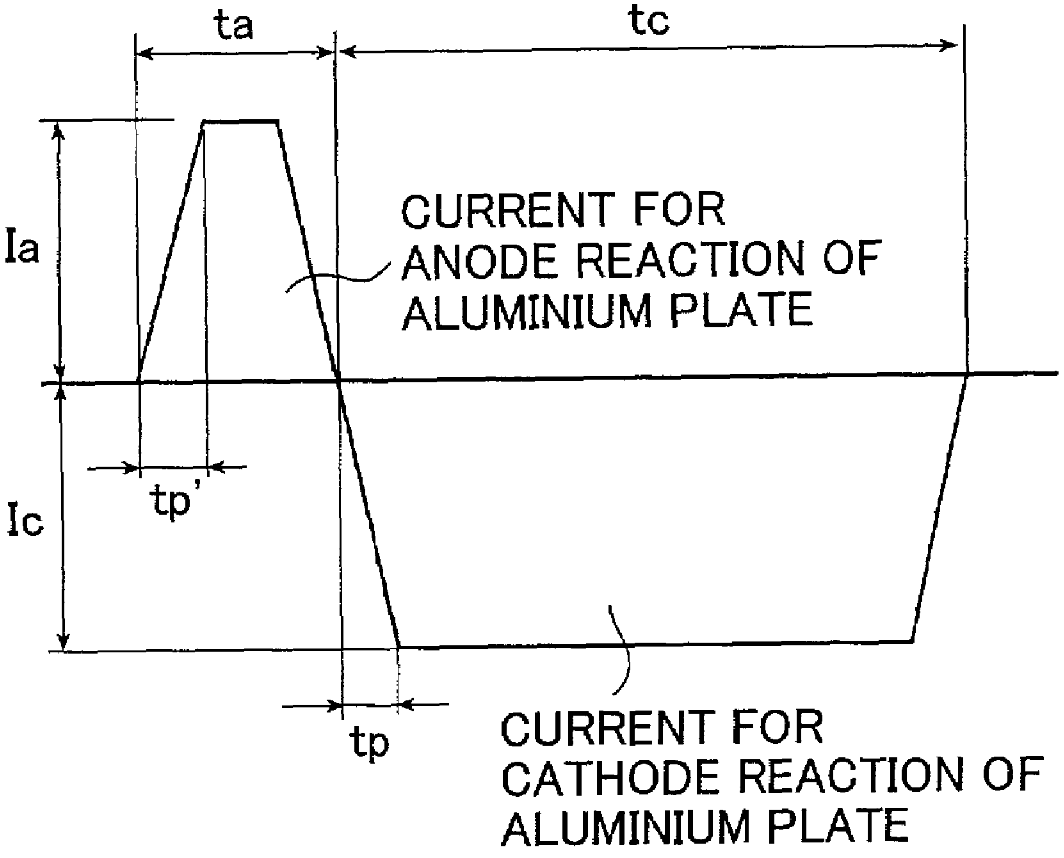
FIG. 1 is a waveform diagram showing an example of a trapezoidal wave used for an electrochemical surface roughening treatment using AC, which can be suitably used for the present invention.

This invention will be explained in detail hereinbelow.

[Support for Lithographic Printing Plate]

<Metallic Base>

The metallic base to be used as a support for a lithographic printing plate according to this invention is not particularly specified. Examples thereof include iron, stainless steel and aluminum. Above all, aluminum is preferred.

The aluminum plate used as aluminum base is a metal containing as its main component a dimensionally stable aluminum, which is formed of aluminum or aluminum alloy. Other than pure aluminum, an alloy plate containing aluminum as its main component and a slight amount of foreign elements, or a plastic film or paper laminated or vapor-deposited with aluminum or aluminum alloy may be used. Further, a composite sheet in which an aluminum sheet is bound on a polyethylene terephthalate film, such as one described in JP 48-18327 B, may also be used.

The aluminum plate to be used in this invention is not particularly limited. However, a plate formed of pure aluminum is used preferably. Since the production of completely pure aluminum is difficult with the currently available refining technique, aluminum containing a slight amount of foreign elements may be used. For example, known products described in "Aluminum Handbook, 4th ed., (Light Metal Association, 1990), specifically JIS 1050, JIS 1100, JIS 3003, JIS 3103, JIS 3005 etc., may be used. Moreover, an aluminum alloy, scrapped aluminum or aluminum plate using a secondary ground metal having an aluminum (Al) content of 99.4–95 wt % and containing at least more than 5 elements selected from iron (Fe), silicon (Si), copper (Cu), magnesium (Mg), manganese (Mn), zinc (Zn), chromium (Cr) and titanium (Ti) within the range described later may be used.

Further, in this invention, an aluminum plate having an Al content of 95–99.4 wt %, which enables reduction of cost, may be also used. If the content of Al exceeds 99.4 wt %, the maximum permissible amount of impurities is reduced so that the cost reduction effect may become less remarkable. If the content of Al is less that 95 wt %, such a large amount of impurities may cause troubles such as breakage of the plate during rolling. The more preferable content of Al is therefore 95–99 wt %, and in particular preferably 95–97 wt %.

The content of Fe is preferably 0.1–1.0 wt %. Fe is an element that is contained at about 0.1–0.2 wt % even in a new ground metal, which is hardly solid-solved in Al so that the almost all of Fe remains as intermetallic compounds. If the content of Fe exceeds 1.0 wt %, the breakage of the plate during rolling may occur easily; if it is less than 0.1 wt %, the cost reduction effect is reduced disadvantageously. The more preferable content of Fe is therefore 0.3–1.0 wt %.

The content of Si is preferably 0.03–1.0 wt %. Si is an element often contained in scraps of JIS 2000, 4000, 6000 series. Further, Si is an element contained at about 0.03–0.1 wt % even in a new ground metal and exists as solid solution or intermetallic compounds in Al. When an aluminum plate is heated during the production of the support, the Si that is solid-solved may be separated as simple substance. It is known that the intermetalllic compound of the simple Si and Fe—Si series adversely affect the resistance against severe ink stain. The term "severe ink stain" means dot- or ring-like stains which appear on a printed paper or the like due to the increased adhesion of ink to the surface of a nonimage area of the lithographic printing plate in the case where the printing is repeated with frequent interruptions. If the content of Si exceeds 1.0 wt %, Si may be not removed completely by, for example, the treatment with sulfuric acid mentioned later (desmutting); if the content of Si is less than 0.03 wt %, the cost reduction effect becomes less remarkable. A preferred content of Si is 0.05–1.0 wt %.

The content of Cu is preferably 0.000–1.0 wt %. Cu is an element often contained in scraps of JIS 2000 and JIS 4000 series. Cu is solid-solved relatively easily in Al. If the content of Cu exceeds 1.0 wt %, it may be not removed completely by the treatment with sulfuric acid as mentioned hereinafter. A preferred content of Cu is 0.000–0.03 wt %.

The content of Mg is preferably 0.000–1.5 wt %. Mg is an element that is contained in a large amount in scraps of JIS 2000, JIS 3000, JIS 5000, and JIS 7000 series. In particular, Mg is often contained in can end materials and is thus one of main impurity metals contained in scraps. Mg is relatively easily solid-solved in Al and forms intermetallic compounds together with Si. If the content of Mg exceeds 1.5 wt %, it may be not removed completely by, for example, the treatment with sulfuric acid as mentioned hereinafter.

The content of Mn is preferably 0.000–1.5 wt %. Mn is an element that is contained in a large amount in scraps of JIS 3000 series. Mn is often contained especially in can body materials and is thus one of main impurity metals contained in scraps. Mn is relatively easily solid-solved in Al and forms intermetallic compounds together with Al, Fe and Si. If the content of Mn exceeds 1.5 wt %, it may not be removed completely by, for example, the treatment with sulfuric acid as mentioned hereinafter.

The content of Zn is preferably 0.000–0.5 wt %. Zn is an element contained especially in scraps of JIS 7000 series. Zn is dissolved relatively easily in Al. If the content of Zn exceeds 0.5 wt %, it may be not removed completely by, for example, the treatment with sulfuric acid as mentioned hereinafter.

The content of Cr is preferably 0.000–0.1 wt %. Cr is an impurity metal, which is contained in a small amount in scraps of JIS A5000, 6000, 7000 series. If the content of Cr exceeds 0.1 wt %, it may not be removed completely by, for example, the treatment with sulfuric acid as mentioned hereinafter.

The content of Ti is preferably 0.003–0.5 wt %. Ti is an element which is added generally as a grain-refining agent in an amount of 0.005–0.04 wt %. Ti is contained in a relatively large amount as impurity metal in scraps of JIS 5000, 6000, 7000 series. If the content of Ti exceeds 0.5 wt %, it may not be removed completely by, for example, the treatment with sulfuric acid as mentioned hereinafter.

The aluminum plate to be used in this invention is produced by casting the raw materials as mentioned above in a conventional manner, subjecting the resulting cast to rolling and heat treatment as appropriate to provide a thickness of, for example, 0.1–0.7 mm and, if necessary, reforming its flatness. The thickness may be varied suitably according to the size of a printing machine and printing plate as well as the request of the user.

In addition, there may be used as the method for producing the aluminum plate, for example, DC casting, DC casting without soaking treatment and/or annealing, as well as continuous casting.

The supports for lithographic printing plate according to this invention can be obtained by roughening the metallic base surface and, further, forming a specified hydrophilic film. Here, in the production process of the support for a lithographic printing plate according to this invention, various kinds of processes may be included other than the roughening treatment and the formation of a hydrophilic film.

Hereinafter, the support for a lithographic printing plate according to this invention will be explained with respect to a case where an aluminum plate is used as the metallic base.

Preferably, the aluminum plate to be used as the support is subjected to: defatting step of removing an adhered rolling oil; desmutting step of dissolving the smut on the surface of an aluminum plate; roughening step of roughening the surface of the aluminum plate; and so on.

The production process for the support for a lithographic printing plate according to this invention preferably includes the roughening treatment, in which surface of the aluminum plate is electrochemically roughened by using alternating current in aqueous acid solution (electrochemical roughening treatment). In particular, the electrochemical roughening treatment using aqueous solution containing hydrochloric acid is more preferable.

Further, the production process for the support for a lithographic printing plate according to this invention may also include a surface treatment step of the aluminum plate in which mechanical roughening treatment, chemical etching in acid or alkaline aqueous solution and the like are performed in combination, other than the electrochemical roughening treatment as mentioned above. The production process of the support for a lithographic printing plate according to this invention, including the roughening treatment, may be performed according to both a continuous method and a non-continuous method; the continuous method is industrially preferable. Further, in the support for a lithographic printing plate according to this invention, the mean opening diameter of roughened small pits and the ratio of mean depth to the mean opening diameter of the pits are preferably set within a specified range.

The support for a lithographic printing plate according to this invention is provided with a hydrophilic film having a specified heat conductivity. Moreover, the support may be formed, if necessary, through pore-widening treatment (acid or alkaline treatment), pore-sealing treatment, and hydrophilic surface treatment. Further, if necessary, an undercoat layer may be provided after the formation of the support.

<Roughening Treatment (Graining)>

Now, the roughening treatment is explained.

An aluminum plate is grained in a more preferable form. The graining treatment includes mechanical graining (mechanical roughening), chemical etching, electrolytic graining etc. as described in JP 56-28893 A. Further, electrochemical graining (electrochemical roughening, electrolytic roughening) in which graining is performed electrochemically in an electrolyte of hydrochloric or nitric acid, and other mechanical graining (mechanical roughening) such as: wirebrush graining, in which the aluminum surface is scratched by metal wires; ball graining, in which the aluminum surface is grained with grinding balls and abrasives; and brush graining, in which the aluminum surface is grained with nylon brush and abrasive, may be used. These graining methods may be used alone or in combination thereof. For example, there may be used the combination of mechanical roughening treatment using nylon brush and abrasives with electrolytic roughening treatment using an electrolyte of hydrochloric and/or nitric acid, or the combination of a plurality of electrolytic roughing treatments. Above all, the electrochemical roughening treatment is preferred. Further, the combination of mechanical and electrochemical roughening treatment is also preferable and, in particular, it is preferable to perform the electrochemical roughening treatment after the mechanical roughening treatment.

The electrochemical roughening treatment is a process wherein an aluminum plate as electrode is applied with an alternating current in acid aqueous solution to thereby electrochemically roughen the surface of aluminum plate, which differs from the mechanical roughening treatment mentioned later.

As acid aqueous solution used for the electrochemical roughening, there may be used those used in the ordinary electrochemical roughening treatment using direct or alternating current. Of these, it is especially preferred to use acid aqueous solution containing mainly nitric or hydrochloric acid. Here, the phrase "containing mainly" means that the content of the main component in the aqueous solution is 30 wt % or more, preferably 50 wt % or more based on the whole components. The same will apply to other components hereinafter.

In this invention, it is preferred to use a base plate whose surface is roughened electrochemically with an electrolyte of aqueous solution containing hydrochloric acid. In the electrochemical roughening treatment using an electrolyte containing mainly hydrochloric acid, small pits having a mean opening diameter of 0.01-several μm and a ratio of depth to mean opening diameter of 0.1–0.5 are formed and, at the same time, a large undulation having a mean opening diameter of several to 10 μm is formed easily. That is, a double structure is formed, with a result that a roughened surface that is preferable in terms of stain resistance and press life may be obtained. If necessary, nitrates, chlorides, amines, aldehydes, phosphoric acid, cromic acid, boric acid, acetic acid, sulfuric acid, oxalic acid etc. can be added to the electrolyte; in particular, acetic and sulfuric acid are preferred.

In this invention, in the electrochemical roughening treatment as mentioned above, the ratio of $Q_C/Q_A$, wherein $Q_C$ is the quantity of electricity of aluminum plate as cathode and $Q_A$ is the quantity of electricity of aluminum plate as anode, is selected, for example, within the range of 0.95–2.5. In this way, uniform honeycomb pits may be formed on the surface of aluminum plate. If the ratio of $Q_C/Q_A$ is less than 0.95 or exceeds 2.5, nonuniform honeycomb pits can be formed easily. Preferably, the ratio of $Q_C/Q_A$ is within the range of 1.5–2.0.

The waveform of alternating current to be used for the electrochemical roughening includes sine, rectangular, triangular, trapezoidal wave etc. Above all, rectangular or trapezoidal wave is preferred. In view of the cost for manufacturing a power supply device, the frequency of alternating current is preferably 30–200 Hz, and more preferably 40–120 Hz.

An example of trapezoidal wave to be used preferably in this invention is shown in FIG. 1, in which the axis of ordinate shows a value of current and the axis of abscissa shows a time. Ta is an anode reaction time; tc is a cathode reaction time; tp and tp' each represents a time required for the current value to reach the peak value from zero; Ia is a peak value of current at the side of anode cycle; Ic is a peak value of current at the side of cathode cycle. When a trapezoidal wave is used as the waveform of alternating current, the time tp or tp' required for the current to reach the peak value from zero is preferably 0.1–2 msec, more preferably 0.3–1.5 msec. If tp and tp' are less than 0.1 msec, a large power source voltage may become required at the beginning of formation of current waveform, due to the influence of impedance of the power source circuit so that the installation cost of power source becomes higher. If the values of tp and tp' exceed 2 msec, the influence of trace components in the acid aqueous solution becomes great so that the uniform roughening treatment may become difficult to perform in some cases.

The duty of alternating current to be used in the electrochemical roughening treatment is preferably within the range of 0.25–0.5, more preferably 0.3–0.4, in view of achieving the uniform roughening of the surface of aluminum plate. The duty as described in this invention means the ratio of ta/T, wherein T is the period of alternating current and ta is the time during which the anode reaction of the aluminum plate continues (anode reaction time). Particularly, on the surface of the aluminum plate during the cathode reaction, a smut component comprising mainly aluminum hydroxide is formed and moreover the dissolution and breakage of an oxide film occur which serves the beginning points of the pitting reaction at the time of next anode reaction of the aluminum plate. Therefore, the selection of duty of alternating current may greatly affect the uniform roughening process.

As to the current density of alternating current, in a case of trapezoidal or rectangular wave, the current density Iap at the peak current value at the side of anode cycle and the current density Icp at the peak current value at the side of cathode cycle are preferably 10–200 $A/dm^2$ respectively. Further, the ratio of Icp/Iap is preferably within the range of 0.9–1.5.

In the electrochemical roughening treatment, the sum of quantity of electricity used for the anode reaction of the aluminum plate at the end of the electrochemical roughening treatment is preferably 50–1000 $C/dm^2$. The electrochemical roughening treatment is performed preferably for one second to 30 min.

As mentioned above, as acid aqueous solutions containing mainly nitric acid, there may be used solutions which are used in the ordinary electrochemical roughening treatment using a direct or alternating current. For example, more than one of nitrate compounds such as aluminum nitrate, sodium nitrate, ammonium nitrate etc. may be added for use at a concentration of from 0.01 g/L to saturation, to nitric acid aqueous solution having a nitric acid concentration of 5–15 g/L. In the acid aqueous solution containing mainly nitric acid, metals contained in aluminum alloys, such as iron, copper, manganese, nickel, titanium, magnesium, silicon etc. may be dissolved.

As acid aqueous solutions containing mainly nitric acid, in particular, there may be used preferably those solutions which contain nitric acid, salts of aluminum and nitrates and are obtained by adding aluminum and ammonium nitrate into a nitric acid aqueous solution having a nitric acid concentration of 5–15 g/L, such that concentration of aluminum ion becomes 1–15 g/L, preferably 1–10 g/L, and the ammonium ion is present at 10–300 ppm. The quantities of the aluminum and ammonium ions mentioned above spontaneously increase during the electrochemical roughening treatment. The temperature of solution at this time is preferably 10–95° C., more preferably 20–90° C., and especially preferably 40–80° C.

In the electrochemical roughening treatment, known electrolytic apparatus of vertical, flat, or radial type may be used. The electrolytic apparatus of radial type described in JP 5-195300 A is especially preferred.

Figure 2:
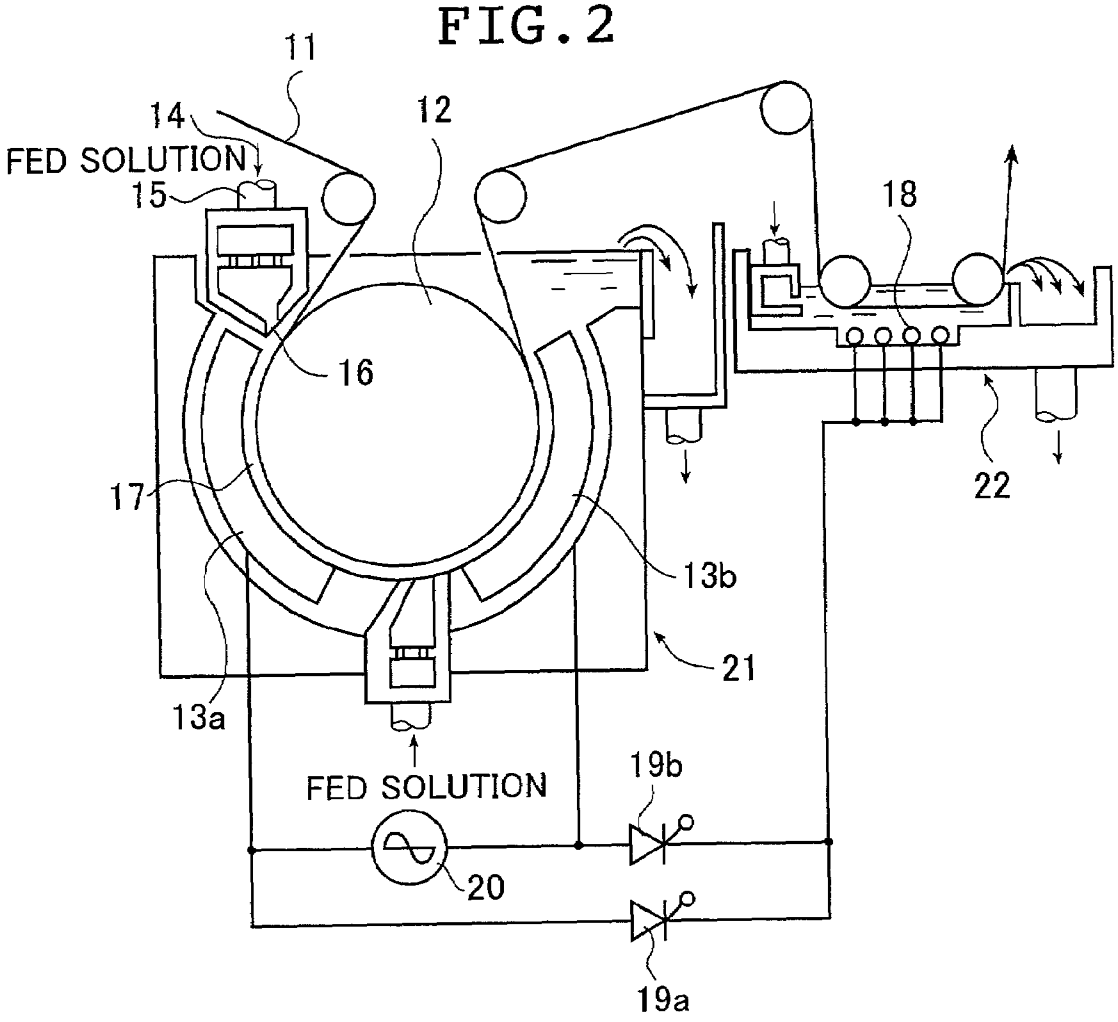
FIG. 2 is a side view showing an example of a radial cell used for an electrochemical surface roughening treatment, which can be suitably used for the production of an aluminum substrate for the original forme for a lithographic printing plate according to the present invention.

FIG. 2 shows an outline of an electrolytic apparatus of radial type to be used preferably in this invention. In the electrolytic apparatus of radial type shown in FIG. 2, an aluminum plate 11 is wound around a radial roller 12 arranged in the main electrolytic bath 21 and electrolyzed during the conveyance thereof by means of main electrodes 13*a* and 13*b* connected to an alternating current source 20. The acid aqueous solution 14 is fed from the solution feed opening 15 through a slit 16 to a solution passage 17 between the main electrodes 13*a* and 13*b*.

Then, the aluminum plate 11 to which treatment has been performed in the main electrolytic cell 21 is electrolyzed in an auxiliary anode bath 22. Auxiliary anodes 18 are arranged opposite to the aluminum plate 11 in the auxiliary bath 22 and the acid aqueous solution 14 is fed so as to flow between the auxiliary anodes 18 and the aluminum plate 11. The current supply to the auxiliary anodes is controlled by means of thyristors 19*a* and 19*b*.

The main electrodes 13*a* and 13*b* can be selected from carbon, platinum, titanium, niobium, zirconium, stainless steel, cathode used for fuel cell, etc.; of these, carbon is particularly preferred. Impermeable graphite for chemical equipment or resin-impregnated graphite commonly available on the market, etc. can be used.

The auxiliary anode 18 can be selected from the known oxygen-generating electrodes, such as ferrite, iridium oxide, and platinum, or platinum that is clad or plated with bulb metal such as titanium, niobium, zirconium, etc.

The feed direction of acid aqueous solution passing through the main electrolytic bath 21 and the auxiliary anode bath 22 may be parallel or counter to the advancement direction of aluminum plate 11. The flow rate of acid aqueous solution relative to the aluminum plate is preferably 10–1000 cm/sec.

One or more alternating current sources can be connected to an electrolytic apparatus. More than two electrolytic apparatuses may be also used. The electrolytic condition of each apparatus may be the same or different.

Further, after the finish of electrolytic treatment, it is preferred to perform liquid removal by a nip roller and the washing by spray so as not to leave the treating liquid to the next step.

In a case of using the electrolytic apparatus as mentioned above, it is preferable to maintain a constant concentration of the acid aqueous solution by adding acid and water while adjusting the amount of addition thereof based on the concentration of acid and aluminum ions, which are proportional to the current applied in the acid aqueous solution, in which the aluminum plate in the electrolytic apparatus reacts with the anode, and obtained, for example, from (i) electroconductivity of the solution, (ii) propagation velocity of supersonic wave and (iii) temperature; and by sequentially overflowing the same amount of acid aqueous solution as the volume of acid and water added.

Each of the surface treatments, such as mechanical roughening treatment, chemical etching in an acid or alkaline aqueous solution, and desmutting, will be explained in the stated order. Each surface treatment is performed before the electrochemical roughening treatment mentioned above, or after the electrochemical roughening treatment but before the anodic oxidation as mentioned hereinafter. However, the explanation of each surface treatment as mentioned below is merely an example and this invention is not limited to the following surface treatment. Further, each treatment including the surface treatment as mentioned above may be performed arbitrarily.

The mechanical roughening is the treatment in which the surface of aluminum plate is roughened by using brush etc., which is performed preferably before the electrochemical roughening.

The preferred mechanical roughening treatment is performed by using a rotary nylon brush roll having a bristle diameter of 0.07–0.57 mm and a slurry of abrasive that is fed to the surface of aluminum plate.

Preferred is a nylon brush having a low water absorption, for example, NYLON BRISTLE 200T from Toray Industries, Inc. (6,10-nylon; softening point: 180° C.; melting point: 212–214; specific gravity: 1.08–1.09; water partition rate: 1.4–1.8 at 20° C. and 65% R.H, 2–2.8 at 20° C. and 100% R.H.; dry tensile strength: 4.5–6 g/d; dry tensile elongation: 20–35%; reduction rate in boiling water: 1–4%; dry tensile resistance: 39–45 g/d; Young's modulus (dry): 380–400 kg/mm$^2$).

Any known abrasive can be used. Preferably, quartz sand, quartz, aluminum hydroxide or the mixture thereof described in JP 6-135175 A and JP 50-40047 B are used.

A slurry having a specific gravity within the range of 1.05–1.3 is preferred. As a method for feeding the slurry solution to the surface of aluminum plate, there are, for example: a method of spraying the slurry solution; a method in which wirebrushes are used; and a method of transferring the surface profile of an uneven reduction rolling roll onto the aluminum plate. The methods described in JP 55-074898 A, JP 61-162351 A, and JP 63-104889 A may be also used. Further, as described in JP 9-509108 A, a method can be used in which the surface of the aluminum plate is brushed in an aqueous slurry containing a mixture of aluminum and quartz particles at a mass ratio within the range of 95:5–5:95. The mean particle size of the above mixture is preferably 4–40 μm, particularly preferably within the range of 1–20 μm.

<Alkaline Etching>

The alkaline etching is the treatment in which the surface of an aluminum plate is etched chemically in an alkaline aqueous solution, and is preferably carried out both before and after the electrochemical roughening treatment. When the mechanical roughening treatment is performed before the electrochemical roughening treatment, it is carried out preferably after the mechanical roughening treatment. The alkaline etching is more advantageous than the acid etching mentioned hereinafter because the micro structure can be broken in a short period of time in the alkaline etching.

Examples of the alkaline aqueous solutions used in the alkaline etching treatment include aqueous solutions containing one or more of caustic soda, sal soda, aluminate of soda, metasilicate of soda, phosphate of soda, potassium hydroxide and lithium hydroxide. Especially, an aqueous solution mainly containing sodium hydroxide (caustic soda) is preferred. The alkaline aqueous solution may contain not only aluminum but alloy components contained in the aluminum plate in an amount of 0.5–10 wt %.

Preferably, the concentration of alkaline aqueous solution is 1–50 wt %, more preferably 1–30 wt %.

The alkaline etching is performed preferably at a temperature of the alkaline aqueous solution of 20–100° C., preferably 40–80° C. and for 1–120 sec, preferably 2–60 sec.

The amount of aluminum dissolved is preferably 5–20 g/m$^2$ when the alkaline etching is performed after the mechanical roughening treatment and 0.01–20 g/m$^2$ when the alkaline etching is performed after the electrochemical roughening treatment. When a chemical etching solution is mixed in an alkaline aqueous solution for the first time, it is preferred to prepare the treating solution by using liquid sodium hydroxide (caustic soda) and sodium aluminate (alumic acid soda).

Further, after finishing the alkaline etching, it is preferable to perform removal of the solution by the nip roller and the washing by spray so as not to leave the treating solution to the next step.

When the alkaline etching is performed after the electrochemical roughening treatment, the smut generated due to the electrochemical roughening treatment can be removed. As such alkaline etching, preferred are a method described in JP 53-12739 A in which the plate is contacted with sulfuric acid of 15–65 wt % and at a temperature of 50–90° C., and the alkaline etching method described in JP 48-28123 B.

<Acid Etching>

The acid etching is the treatment in which the aluminum plate is chemically etched in an acid aqueous solution, which is preferably performed after the electrochemical roughening treatment. When the acid etching is carried out before and/or after the electrochemical roughening treatment, it is also preferred to perform the acid etching after the alkaline etching.

When the acid etching is performed on the aluminum plate after the alkaline etching, intermetallic compounds containing silica or single substance Si on the surface of aluminum plate can be removed, whereby defects of an anodic oxide film that may be generated in the subsequent anodic oxidation treatment can be eliminated. As a result, a trouble may be prevented in which dot-like ink called as dust-like stain is adhered to the non-image area during the printing.

As acid solutions to be used in the acid etching, there are aqueous solutions containing phosphoric, nitric, sulfuric, chromic and hydrochloric acid, or a mixed acid of more than two acids thereof. In particular, sulfuric acid aqueous solution is preferred. The concentration of acid aqueous solution is preferably 50–500 g/L. The acid aqueous solution may contain not only aluminum but alloy components contained in the aluminum plate.

The acid etching is performed preferably at a temperature of the solution of 60–90° C., preferably 70–80° C., for 1–10 sec. And, the concentration of acid, for example, the concentration of sulfuric acid and aluminum ion are selected preferably within the range so that no separation occurs at ordinary temperature. The preferred concentration of aluminum ion is 0.1–50 g/L, more preferably 5–15 g/L.

Further, after finishing the acid etching, it is preferred to carry out removal of the solution by nip roller and washing by spray so as not to leave the treating solution to the next step.

<Desmut Treatment>

When the alkaline etching is performed before and/or after the above-mentioned electrochemical roughening treatment, smut is generally formed on the surface of the aluminum plate due to the alkaline etching. Therefore, the so-called desmutting, in which the smut is dissolved in an acid solution containing phosphoric, nitric, sulfuric, chromic, hydrochloric, hydrofluoric and borofluoric acid, or a mixed acid containing more than two of these acids, is preferably performed after the alkaline etching. Incidentally, after the alkaline etching treatment, it is sufficient to perform any one of the acid etching and desmutting.

The concentration of acid solution is preferably 1–500 g/L. Not only aluminum but alloy components contained in the aluminum plate may be dissolved in an amount of 0.001–50 g/L in the acid solution.

The temperature of acid solution is preferably 20–95° C., and more preferably 30–70° C. The treatment is performed preferably for 1–120 sec, more preferably for 2–60 sec.

As the desmut treatment solution (acid solution), the waste liquor of the acid aqueous solution used in the above-mentioned electrochemical roughening treatment is used preferably in view of reducing the amount of waste liquor.

After finishing the desmutting, it is preferred to carry out removal of the solution by a nip roller and washing by spray, so as not to leave the treating solution to the next step.

A preferred embodiment of the combination of these surface treatment is described below:

First, the mechanical roughening treatment and/or alkaline etching is performed and then the desmutting. Secondly, the electrochemical roughening treatment is performed, and then, any one of (1) acid etching, (2) alkaline etching and the subsequent desmutting, (3) alkaline etching and the subsequent acid etching is carried out.

The lithographic printing original plate according to this invention that has been subjected to the roughening treatment has preferably roughened small pits having a mean opening diameter of 0.01–3 μm, more preferably 0.05–2 μm, and especially preferably 0.05–1.0 μm. The above diameter range may ensure satisfactory stain resistance upon printing and satisfactory or excellent press life.

The ratio of the mean depth to the mean opening diameter of the small pits is preferably 0.1–0.5, more preferably 0.1–0.3, and especially preferably 0.15–0.2. The above range is preferred since it ensure that the stain resistance upon printing and the press life are not deteriorated.

The mean opening diameter of the large roughened undulation is preferably 3–20 μm, more preferably 3–17 μm, and especially preferably 4–10 μm. The above range is preferred as it ensures that the stain resistance and press life upon printing, as well as general stain resistant property are not deteriorated.

<Formation of Hydrophilic Film>

Treatment is performed with respect to the aluminum plate whose surface has been thus roughened and, if necessary, other treatments as described above, to form a hydrophilic film having a low heat conductivity.

The hydrophilic film has a heat conductivity in the direction of film thickness of 0.05 W/ (m·K) or more, preferably more than 0.08 W/ (m·K), but 0.5 W/ (m·K) or less preferably less than 0.3 W/ (m·K), and more preferably less than 0.2 W/ (m·K). If the heat conductivity in the direction of film thickness is 0.05–0.5 W/ (m·K), the heat generated on the recording layer by the exposure to laser beam is not diffused in the support. As a result, when the lithographic printing original plate is used as the on-press development type or the non-treatment type, a higher sensitivity is obtained; when it is used as a conventional thermal positive type, a higher sensitivity is obtained and the problem of a residual film is eliminated; and when it is used as a conventional thermal negative type, the problem such as insufficient formation of image is eliminated.

The heat conductivity of the hydrophilic film in the direction of its film thickness, which is defined in this invention, will be explained hereinafter:

There have been hitherto reported various kinds of methods for measuring the heat conductivity of a thin film. In 1996, Ono et al. reported on a method of measuring the heat conductivity of a thin film in the direction of its plane using a thermograph. An attempt has been also reported, in which a method of heating with alternating current was applied to the measurement of thermal properties of a thin film. Although the origin of the method of heating with alternating current can go back to a report in 1863, various methods have been proposed in recent years by the development of a heating method with laser and the combination thereof with Fourier transformation. An apparatus using the laser Ångstöm method is actually available on the market. All these methods are for measuring the heat conductivity of a thin film in the direction of its plane (direction in plane).

However, when measuring the heat conductivity of a thin film, the heat diffusion in the depth direction of the film is actually considered as a more important factor. Various reports suggest that the heat conductivity of a thin film is anisotropic and, particularly in this invention, it is very important to directly measure the heat conductivity of a thin film in the direction of its film thickness. In this respect, as an attempt to measure the heat properties of a thin film in the direction of its film thickness, a method using a thermocomparator was reported in the paper of Lambropoulos et al. (J, Appl. Phys., 66(9), (1 Nov. 1989) and the paper of Henager et al. (APPLIED OPTICS, Vol., 32, No.1 (1 Jan. 1993)). Moreover, recently, Hashimoto et al. reported a method in which the thermal difusivity of a thin polymer film was measured by the temperature wave thermal analysis applying Fourier analysis (Netsu Sokutei, 27(3) (2000)).

The heat conductivity of a hydrophilic film in the direction of its film thickness defined in this invention is measured by a method using a thermocomparator. The method will be explained hereinafter in detail. The fundamental principle thereof is described in detail in the paper of Lambropoulos et al and Henager et al. The apparatus to be used for the method is not limited to the apparatus described hereinafter.

Figure 3:
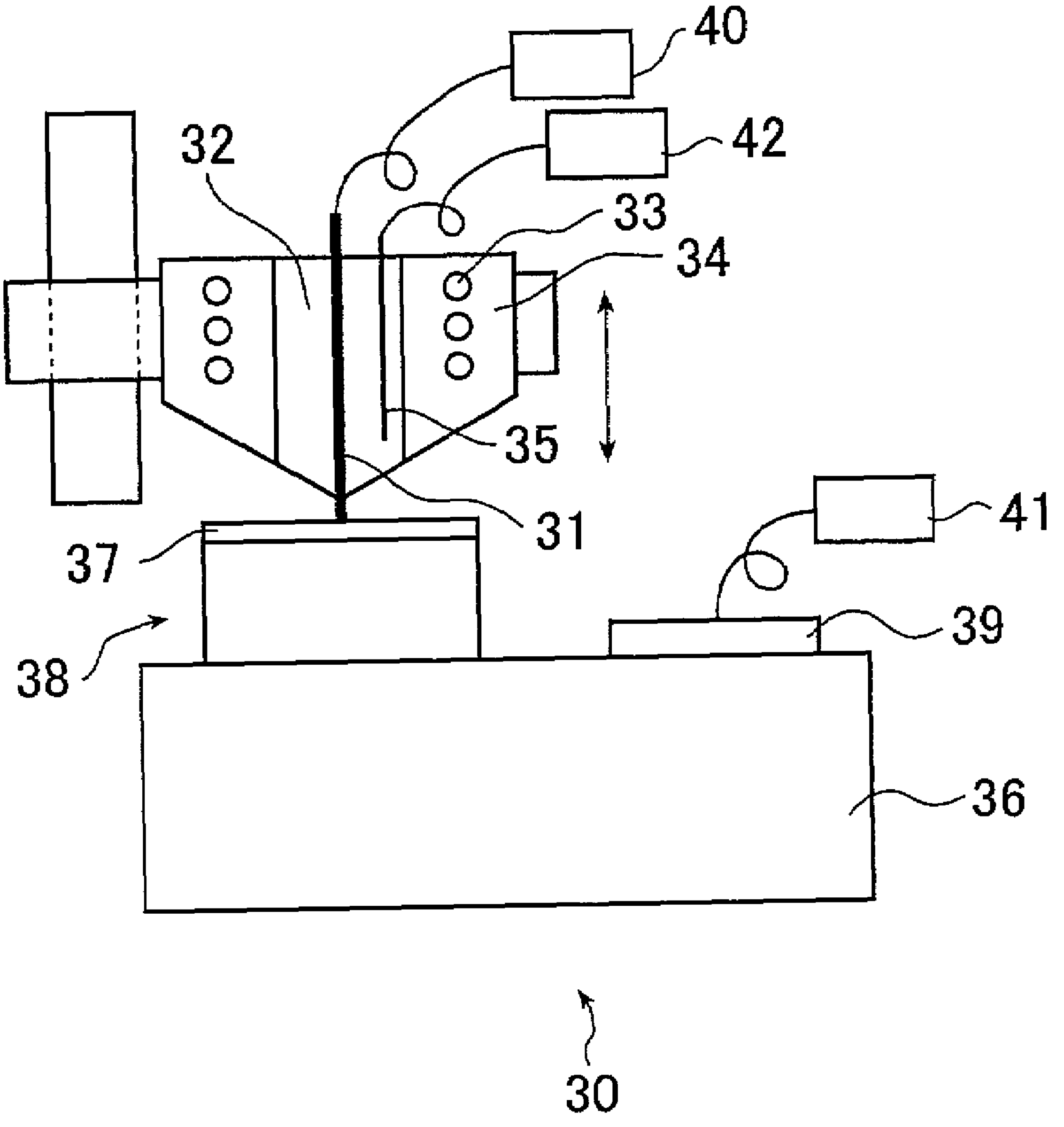
FIG. 3 is a schematic view of a thermocomparator which can be used to measure the thermal conductivity in a film thickness direction of a hydrophilic film that is included in the original forme for a lithographic printing plate according to the present invention.

FIG. 3 shows the outline of a thermocomparator 30 which can be used for the measurement of the heat conductivity of a hydrophilic film for the lithographic printing plate according to this invention, in the direction of its film thickness. The method using a thermocomparator is affected largely by the contact area with a thin film and the state (roughness) of the contact surface. Therefore, it is important that the tip end of the thermocmoparator which contacts with the thin film be made as small as possible. For example, a tip (wire rod) 31 formed of oxygen-free copper and having a vary small point (radius $r_1$=0.2 mm) is used.

The tip 31 is fixed at the center of a reservoir 32 formed of constantan and a heating jacket 34 formed of oxygen-free copper and having electric heaters 33 is fixed around the reservoir 32. When the heating jacket 34 is heated by the electric heaters 33 and the temperature of the reservoir 32 is controlled so as to be 60±1° C. while feed-backing the output of a thermocouple 35 equipped inside the reservoir 32, the tip 31 is heated up to the temperature of 60±1° C. On the other hand, a heat sink 36 formed of oxygen-free copper and having a radius of 10 cm and a thickness of 10 mm is prepared, and a metallic base 38 having thereon a film 37 to be determined is placed on the heat sink 36. The temperature of the surface of the heat sink 36 is measured by a contact type thermometer 39.

After the thermocomparator 30 is placed as mentioned above, the point of the heated tip 31 is closely contacted with the surface of the film 37. The thermocomparator 30 is, for example, attached instead of an indenting tool, to the point of a dynamic small handness meter so as to be vertically driven, and is adapted such that the tip 31 may abut with the surface of the film 37 and be pressed up to the load of 0.5 mN. Thus, variation in the contact area between the film 37 to be determined and the tip 31 can be minimized.

When the heated tip 31 is contacted with the film 37, the temperature at the point of the tip 31 is lowered but it reaches a steady state at a certain constant temperature. This is because the heat quantity which is imparted by the electric heater 33 to the tip 31 through the heating jacket 34 and reservoir 32 is balanced with the heat quantity which is diffused from the tip 31 to the heat sink 36 the thorough the metallic base 38. Then, at this time, the temperature at the point of the tip, the temperature of the heat sink and the temperature of the reservoir are recorded by a temperature recorder 40 for recording the temperature at the point of the tip, a temperature recorder 41 for recording the temperature of the heat sink and a temperature recorder 42 for recording the temperature of the reservoir, respectively.

The relationship between these temperatures and the heat conductivity of the film is represented as the following equation (1):

[Equation 1]

$$\frac{(T_r - T_b)}{(T_r - T_t)} = \left(\frac{4K_1 r_1}{K_{tf} A_3}\right)t + \left(1 + \left(\frac{4K_1 r_1}{K_2 A_2}\right)t_2 + \left(\frac{K_1 r_1}{K_4 r_1}\right)\right) \tag{1}$$

Wherein the symbols in the equation are as follows:

$T_t$: Temperature at the point of tip;
$T_b$: Temperature of heat sink;
$T_r$.: Temperature of reservoir;
$T_{tf}$: Heat conductivity of film;
$K_1$: Heat conductivity of reservoir;
$K_2$: Heat conductivity of tip (tip formed of oxygen-free copper: 400 W/(m·K))
$K_4$: Heat conductivity of metallic base (when film is not formed);
$r_1$: Radius of curvature of the point of tip;
$A_2$: Contact area between reservoir and tip;
$A_3$: Contact area between tip and film;
$t_1$: Thickness of film;
$t_2$: Contact thickness (nearly 0).

Each temperature (Tt, Tb and Tr) is measured while varying the film thickness (t) and plotted, so that the gradient of the equation (1) and the heat conductivity of film may be obtained. Namely, as is apparent from the equation (1), the gradient is given by the heat conductivity of reservoir ($K_1$), the radius of curvature of the point of the tip ($r_1$), the heat conductivity of film ($K_{tf}$) and the contact area between the tip and the film ($A_3$). Since the values of $K_1$, $r_1$, and $A_3$ are known, the value of $K_{tf}$ may be obtained from the gradient.

The present inventors used the measurement method as mentioned above to seek the heat conductivity of an anodic oxide film ($Al_2O_3$) formed on the aluminum base plate. The heat conductivity of $Al_2O_3$, which was obtained from the gradient of a graph plotted by measuring the temperature with varying the film thickness and, was 0.69 W/(m·K). The value coincides with the result from the paper of Lambropoulos et al. as mentioned above. The result also proves that the thermophysical properties of a thin film is different from these of bulk (the heat conductivity of $Al_2O_3$ of bulk is 28 W/(m·K)).

It is preferable to apply the method as mentioned above to the measurement of heat conductivity in the direction of film thickness of a hydrophilic film of the lithographic printing plate according to this invention, because a result without variations or inconsistencies can be obtained also with respect to the roughened surface for the lithographic printing plate since it allows the point of the tip to be made very small and the press load can be kept constant. The heat conductivity will be obtained preferably as a mean value of measurements performed at a plurality of different points on a sample, for example, at five points.

The film thickness of the hydrophilic film is, in view of scratch resistance and press life, preferably 0.1 μm or more, more preferably more than 0.3 μm, and especially preferably more than 0.6 μm. Since, in view of manufacturing cost, formation of a thick film requires a large amount of energy, the film thickness is preferably 5 μm or less, more preferably less than 3 μm, and especially preferably less than 2 μm.

In view of the effect on the heat insulation, the strength of film and the stain resistance upon printing, the density of the hydrophilic film according to this invention is preferably 2000–3200 kg/$m^3$.

The density to be measured can be calculated according to the following equation using, for example, the mass determined by Mason's method (i.e. a method of weighing an anodic oxide film by dissolving it in mixture of chromic and phosphoric acids) and the film thickness determined by observing the section of the film with SEM.

Density (kg/$m^3$)=(Mass of hydrophilic film per unit area/Film thickness)

The method for forming the hydrophilic film is not especially limited; anodic oxidation, vapor deposition, CDV, Sol-Gel method, spattering, ion plating, diffusion etc. may be used suitably. Also, there may be used a method of coating on the plate a solution in which hydrophilic resin or sol-gel solution is admixed with hollow particles.

Above all, it is most preferable to use the treatment for forming an oxide by the anodic oxidation, i.e., the anode oxidation treatment. The anode oxidation treatment can be performed in a manner known in this field. Specifically, when a direct or alternating current is fed to the aluminum plate in aqueous or non-aqueous solution containing a single or a combination of more than two of sulfuric, phosphoric, chromic, oxalic, sulfuric or benzensulfonic acid etc., an anodic oxide film as a hydrophilic film can be formed on the surface of the aluminum plate.

The condition of anode oxidation treatment can not be uniquely determined because it may vary depending on the electrolyte to be used. However, the following will be generally appropriate: 1–80 wt %; temperature of solution: 5–70° C.; density of current: 0.5–60 A/$dm^2$; voltage: 1–200 V; and time period of electrolysis: 1–1000 sec.

Among these anode oxidation treatments, the method described in BP 1412768 A, that is, anodic oxidation is performed at high current density in a sulfuric acid electrolyte, and the method described in U.S. Pat. No. 3,511,661 A, that is, anodic oxidation performed in a phosphoric acid electrolyte, are preferred. Further, a multiple anode oxidation treatment comprising performing the anodic oxidation in sulfuric acid and then in phosphoric acid may be performed.

In this invention, in view of scratch resistance and press life, the basis weight of anodic oxide film is preferably more than 0.1 g/$m^2$, more preferably 0.3 g/$m^2$ or more, especially preferably 2 g/$m^2$ or more, and further more preferably 3.2 g/$m^2$ or more. Considering a large amount of energy required to form a thick film, it is preferably less than 100 g/m, more preferably less than 40 $g/m^2$, and especially preferably less than 20 $g/m^2$.

Fine concaves called as micro pores are formed with uniform distribution on the surface of the anodic oxide film. The density of micro pores formed on the anodic oxide film may be adjusted by selecting suitably the condition of treatment. Increasing the density of micro pores can result in heat conductivity in the direction of film thickness of the anodic oxide film of 0.05–0.5 W/(m·K).

The diameter of micro pores formed on the anodic oxide film may be adjusted by selecting suitably the condition of treatment. Increasing the diameter if micro pores can result in heat conductivity in the direction of film thickness of the anodic oxide film of 0.05–0.5 W/(m·K).

In this invention, for the purpose of decreasing the heat conductivity, it is preferable to perform pore-widening treatment to increase the diameter of micro pore after the anodic oxidation. In the pore-widening treatment, the aluminum base plate having an anodic oxide film formed thereon is dipped in acid or alkaline aqueous solution to dissolve the film and thus widen the diameter of a micro pore. The pore-widening treatment is performed in such a manner that the amount of the anodic oxide film dissolved is within the range of preferably 0.01–20 $g/m^2$, more preferably 0.1–5 $g/m_{2 1}$ and especially preferably 0.2–4 $g/m^2$.

When using an acid aqueous solution for the pore-widening treatment, an aqueous solution of inorganic acid, such as sulfuric, phosphoric, nitric, and hydrochloric acid, or of the mixture thereof is used preferably. The concentration of acid solution is preferably 10–1000 g/L, and more preferably 20–500 g/L. The temperature of acid solution is preferably 10–90° C., and more preferably 30–70° C. The dipping time in the acid solution is preferably 1–300 sec, and more preferably 2–100 sec.

On the other hand, when using an alkaline aqueous solution for the pore-widening treatment, an alkaline solution of alkali selected from the group consisting of sodium, potassium and lithium hydroxide is used preferably. The pH value of the alkaline solution is preferably 10–13, and more preferably 11.5–13.0. The temperature of the alkaline aqueous solution is preferably 10–90° C., and more preferably 30–50° C. The dipping time in the alkaline aqueous solution is preferably 1–500 sec, and more preferably 2–100 sec.

However, if the diameter of a micro pore on the uppermost surface is widen too much the stain resistance in press working deteriorates. Preferably the diameter of a micro pore on the uppermost surface is 40 or less than 40 μm, more preferably 20 or less than 20 μm, most preferably 10 or less than 10 μm. If it is set within the range mentioned above the heat insulating property in anodic oxide film is consistent with stain resistance.

As to the more preferably shape of the pores in anodic oxide film the pore diameter on the uppermost surface is 0–40 μm and the pore diameter in the inside is 20–300 μm.

For example, it is known that the diameter of a micro pore performed by anodic oxidation treatment is proportionally increased by the electric voltage charged in electrolysis within the same electrolyte. By using this tendency the following producing method may be applied. When the electric voltage gradually increases in electrolysis the pore diameter in the bottom of the pore may be widen. It is also known that the diameter of a micro pore produced in anodic oxidation treatment varies according to the variation of electrolytes. The diameter of a micro pore produced by anodic oxidation treatment in various electrolytes increases in the order of sulfuric acid<oxalic acid<phosphoric acid.

It is preferable that the anodic oxide film is formed by anodic oxidation that consists of more than two steps. And more preferably the anodic oxidation is performed with an electrolyte containing sulfuric acid in the first step and then with an electrolyte containing phosphoric acid in the second and subsequent steps. Furthermore the support treated by anodic oxidation treatment and/or pore widening treatment may be treated by the pore-sealing process as described below.

Other than the anodic oxide film as mentioned above, the hydrophilic film may be an inorganic film formed by spattering, CVD method etc. The compounds forming the inorganic film include, for example, oxides, nitrides, silicates, borates and carbides. The inorganic film may consist of only simple compound or of a mixture of compounds.

As compounds for forming the inorganic film, specific examples thereof include: aluminum, silicon, titanium, zirconium, hafnium, vanadium, niobium, tantalum, molybdenum, wolfram and chromium oxide; aluminum, silicon, titanium, zirconium, hafnium, vanadium, niobium, tantalum, molybdenum, wolfram, chromium and boron nitride; titanium, zirconium, hafnium, vanadium, niobium, tantalum, molybdenum, wolfram and chromium silicate; titanium, zirconium, hafnium, vanadium, niobium, tantalum, molybdenum, wolfram and chromium boride; aluminum, silicon, titanium, zirconium, hafnium, vanadium, niobium, tantalum, molybdenum, wolfram and chromium carbide.

<Pore-Sealing Treatment>

In this invention, the support for lithographic printing plate according to this invention, on which a hydrophlic film is formed, may be subjected to pore-sealing treatment.

As the pore-sealing treatment to be used in this invention, there is mentioned the pore-sealing treatment for the anodic oxide film by means of pressure steam or hot water, which is described in JP 4-176690 A and Japanese Patent Application No. 10-106819 (JP 11-301135 A). Known treatment methods using silicate, dichromate aqueous solution, nitrite, ammonium acetate, electrodeposition sealing, triethanolamine, barium carbonate, hot water containing extremely small amount of phosphate etc. may be used. The pore-sealed film is formed, for example, from the bottom of pores in the case where electrodeposition sealing is performed, and from the upper parts of pores in the case where steam sealing is performed; the manner of the formation of pore-sealed film is different depending on the type of the pore-sealing treatment performed.

Alternatively examples thereof include dipping in solution, spraying, coating, vapor deposition, spattering, ion-plating, flame coating, plating etc., but are not limited to these treatments.

Above all, especially preferred is the pore-sealing treatment using particles having a mean particle size of 8–800 nm, described in JP 2001-9871 A.

In the pore-sealing treatment using particles, the treatment is performed with particles having a mean particles size of 8–800 nm, preferably 10–500 nm, and more preferably 10–150 nm. Within the range of mean particle size, there is little fear of the particles entering into micro pores on the hydrophilic film, and a sufficient sensitization effect can be obtained. Further, the adhesion of film to the image recording layer becomes satisfactory, whereby an excellent press life can be attained. The thickness of the particle layer is preferably 8–800 nm, and more preferably 10–500 nm.

The heat conductivity of particles to be used in this invention is preferably less than 60W/(m·K), more preferably less than 40W/(m·K), and especially preferably 0.3–10 or less than 0.3–10W/(m·K). If the heat conductivity is less than 60W/(m·K), the heat diffusion to the aluminum base plate is prevented sufficiently and thus satisfactory sensitization effect can be obtained.

As the method for forming a particle layer, there are mentioned, for example, dipping in solution, spraying, coating, electrolysis, vapor deposition, spattering, ion-plating, flame coating, plating etc.; however, the method is not limited to these treatment.

The electrolysis is performed with direct or alternating current. The waveform of alternating current used for the electrolysis includes sine, rectangular, triangular and trapezoidal wave etc. In view of the cost of manufacturing power source, the frequency of alternating current is preferably 30–200 Hz, and more preferably 40–120 Hz. When using a trapezoidal wave as the waveform of alternating current, the time tp necessary for the current to reach the peak value from zero is preferably 0.1–2 msec, and more preferably 0.3–1.5 msec respectively. If tp is less than 0.1 msec, a large power source voltage becomes required at the beginning of formation of current waveform due to the influence of the power source circuit so that the installation cost of power source may become higher.

As the hydrophilic particles, single or a combination of more than two of $Al_2O_3TiO_2$, $SiO_2$, and $ZrO_2$ is used preferably. The electrolyte is obtained, for example, by suspending the hydrophilic particles in water etc. in such manner that the content thereof is 0.01–20% of the whole. The pH value of the electrolyte may be adjusted, for example, by adding sulfuric acid to charge positive or negative. The electrolysis is performed using the aluminum plate as cathode and with direct current, by using the electrolyte as mentioned above at an voltage of 10–200V for 1–600 sec. According to this method, the micro pores in the anodic oxide film may be sealed while leaving spaces inside the micro pores.

For the pore-sealing treatment, there is mentioned a method of forming by coating a layer such as: a layer composed of a compound having at least one amino group and at least one group selected from the group consisting of carboxyl and the salt thereof and sulfonyl and the salt thereof, which is described in JP 60-149491 A; a layer composed of a compound selected from compounds having at least one amino group and at least one hydroxy group and their salts, which is described in JP 60-232998 A; a layer containing phosphate described in JP 62-19494 A; and a layer composed of a high molecular compound in molecule at least one monomer unit having sulfo group as repeated unit, which is described in JP 59-101651 A.

Other examples thereof include a method of forming a layer composed of a compound that is selected from: carboxymethylcellulose; dextrim; gum arabic; phosphonic acid having amino group, such as 2-aminoethyl phosphonic acid; organo phosphonic acid, such as pheny-, naphthyl-, alkyl-, glycerol methglendi- and ethylendiphorphonic acid, which may have substituents; organo phosphoric acid ester such as phenyl, naphthyl, alkyl and glycero phosphate, which may have substituents; and organo phosphinic acid such as phenyl, naphthyl, alkyl and glycero phosphinic acid, which may have substituents; amino acid such as glycine and β-alanine; hydrochloride of amine having hydroxy group, such as triethanolamine hydrochloride.

A silane coupling agent having unsaturated group may be coated for the pore-sealing treatment. As silane coupling agents there are, for example, N-3-(acryloxy-2-hydroxypropyl)-3-aminopropyltriethoxysilane, (3-acryloxypropyl)dimethylmethoxysilane, (3-acryloxypropyl)methyldimethoxysilane, (3-acryloxypropyl)trimethoxysilane, 3-(N-allylamino) propyltrimethoxysilane, allyldimethoxysilane, allyltriethoxysilane, allyltrimethoxysilane, 3-butenyltriethoxysilane, 2-(chloromethyl)allyltrimethoxysilane, methacrylamidopropyltriethoxysilane, N-(3-methacryloxy-2-hydroxypropyl)-3-aminopropyltriethoxysilane, (methacryloxymethyl)dimethylethoxysilene, methacryloxymethyltriethoxysilane, methacryloxymethyltrime thoxysilane, methacryloxypropyldimethylethoxysilane, methacryloxypropyldimethylethoxysilane, methacryloxypropylmethyldiethoxysilane, methacryloxypropylmethyldimethoxysilane, methacryloxypropylmethyltriethoxysilane, methacryloxy propylmethyltrimethoxysilane, methacryloxypropyltris(methoxyethoxy)silane, methoxydimethyl-vinylsilane, 1-methoxy-3-(trimethylsiloxy)butdiene, stylyl-ethyltrim ethoxysilane, 3-(N-stylylmethyl-2-aminoethyl-amino)-propyltrimethoxysilane hydrochloride, vinyldimethylethoxysilane, vinyldiphenylethoxysilane, vinylmethyldiethoxysilane, vinylmethyldimethoxysilane, O-(vinyloxyethyl)-N-(triethoxysilylpropyl)urethane, vinyltriethoxysilane, vinyltrimethoxysilane, vinyltri-t-butoxysilane, vinyltriisopropoxysilane, vinyltriphenoxysilane, vinyltris(2-methoxyethoxy)silane, diallylaminopropylmethoxysilane. Above all, preferred is a silane coupling agent having methacroyl or acroyl group, of which unsaturated group exhibits a rapid reactivity.

In addition, examples of the pore-sealing treatment include: Sol-gel coating described in JP5-50779A; coating with phosphonic acid, described in JP5-246171A; treating backcoat material with coating, described in JP6-234284A, JP6-191173A and JP6-230563A; treatment with phosphonic acids, described in JP6-262872A; coating described in JP6-297875A; anodic oxidation described in JP10-109480A; and dipping treatment described in Japanese Patent Application No.10-252078(JP2000-81704A)and Japanese Patent Application No.10-253411(JP2000-89466A). Any one of these may be used.

<Hydrophilic Surface Treatment>

In this invention, the support for lithographic printing plate according to this invention, which is obtained by forming a hydrophilic film in the manner as mentioned above, may be subjected to the hydrophilic surface treatment by further dipping it in aqueous solution containing more the one hydrophilic compound. As hydrophilic compounds, suitable examples thereof include compounds having polyvinyl phosphonic acid or compounds having sulfonic acid group, sugar compounds, and silicate compounds.

Compounds having sulfonic acid group include aromatic sulfonic acids, aldehyde condensates thereof, there derivatives thereof and their salts.

As aromatic sulfonic acids, preferred are, for example, phenol sulfonic acid, catechol sulfonic acid, resorcinol sulfonic acid, benzene sulfonic acid, toluene sulfonic acid, lignin sulfonic acid, naphthalene sulfonic acid, acenaphthene-5-sulfonic acid, pheanthrene-2-sulfonic acid, benzaldehyde-2(or 3)-sulfonic acid, benzaldehyde-2,4-(or 3,5)-disulfonic acid, oxybenzyl sulfonic acids, sulfobenzoic acid, sulfanilic acid, naphthionic acid and taurine. Above all, benzene sulfonic acid, naphthalene sulfonic acid and ligmin sulfonic acid are preferred. The formaldehyde condensate of benzene, naphthalene and ligium sulfonic acids are also preferred.

Further, these compounds may be used as sulfonic acid salts. For example, there are mentioned sodium, potassium, lithium, calcium and magnesium salts. The sodium and potassium salts are especially preferred.

The pH value of aqueous solution containing compound having sulfonic acid group is preferably 4–6.5 and can be adjusted to the range as mentioned above by using sulfonic acid, sodium hydroxide, ammonia etc.

The sugar compounds include monosaccharides and their sugar alcohols, oligosaccharides, polysaccharides and glycosides.

As monosaccharides and their sugar alcohols, there are, for example, trioses such as glycerol and their sugar alcohols; tetroses such as threose, erythritol etc. and sugar alcohols thereof; pentoses such as arabinose, arabital etc. and sugar alcohols thereof; hexoses such as glucose, sorbitol etc. and sugar alcohols thereof; heptose such as D-glycero-D-galacto-heptose, D-glycero-D-galactoheptitol etc. and sugar alcohols thereof; octoses such as D-erythro-D-galactooctytol etc. and sugar alcohols thereof; nonoses such as D-erythro-L-gluconpremises etc. and sugar alcohols thereof.

As olygosaccharides, there are, for example, bioses such as saccharose, trehalose, lactose etc.; and trisaccharides such as raffinose.

As polysaccharides, there are, for example, amylose, arabinan, cyclodextrin, cellulose alginate etc. “Glycosides” in this invention means compounds in which the sugar section and non-sugar section are bound together through the ether-bound or the like.

The glycosides are classified by the non-sugar section. For example, there are alkyl glycoside, phenol glycoside, cumarim glycoside, oxycumarin glycoside, flavonoid glycosidese, anthraquinone glycoside, triterpene glycoside, steroid glycoside, mustered oil glycoside.

As the sugar section, there are monosaccharides as mentioned above and sugar alcohols thereof; olygosaccharides; and polysaccharides. Especially, monosaccharides and olygosaccharide are preferable, and monosaccharides and disaccharides are more preferable.

Example of preferred glycosides are the compounds represented by the following formula (I):

[Chemical formula 1]

(I)

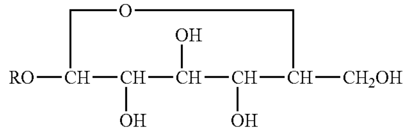

In the formula (I), R represents alkyl, alkenyl or alkynyl group having a linear or branched chain of 1–20 carbon atoms.

Examples of an alkyl group having 1–20 carbon atoms include methyl, ethyl, propyl, butyl, pentyl, hexyl, heptyl, octyl, nonyl, decyl, undecyl, dodecyl, tridecyl, tetradecyl, pentadecyl, hexadecyl, heptadecyl, oatadecyle, nonadecyl, and eicocyl group. These may be linear or branched, or cyclic alkyl.

Examples of an alkenyl group having 1–20 carbon atoms include allyl and 2-butenyl group, and these may be linear or branched, or cyclic alkenyl.

Examples of an alkynyl group having 1–20 carbon atoms include 1-pentynyl group, which may be linear or branched, or cyclic alkynyl.

Specific examples of the glucoside compounds represented by the formula (I) include methyl, ethyl, propyl, isopropyl, butyl, isobutyl, n-hexyl, octyl, capryl, decyl, 2-ethylhexyl, 2-pentylnonyl, 2-hexyldecyl, lauryl, myristyl, stearyl, cyclohexyl and 2-butynyl glucoside. These compounds are glucosides as a kind of glycoside, in which the hemiacetalhydroyl group of dextrose combines with other compound through the ether bond, and can be obtained, for example, by a known method in which glucose is reacted with alcohols. Some of these alkyl glucosides are on the market under the trade name of “GLUCOPON” by Henkel in Germany, which can be used in this invention.

Other examples of preferred glycosides are saponins, rutin trihydrate, hesperidin methyl chalcone, hesperidin, nalidin hydrate, phenol-β-D-glucopyranoside, salicin, 3',5,7-methoxy-7-rutinoside.

The pH value of aqueous solution containing sugar compound is preferably 8–11 and can be adjusted to be within the range mentioned above by using potassium hydroxide, sulforic acid, carbonic acid, sodium carbonate, phosphoric acid, sodium phosphate etc.

The concentration of aqueous solution of polyvinyl phosphonic acid is preferably 0.1–5 wt %, and more preferably 0.2–2.5 wt %. The dipping temperature is preferably 10–70° C., and more preferably 30–60° C. The dipping time is preferably 1–20 sec.

The concentration of aqueous solution of compound having sulforic acid group is preferably 0.02–0.2 wt %. The dipping temperature is preferably 60–100° C. The dipping time is preferably 1–300 sec, and more preferably 10–100 sec.

In addition, the concentration of sugar compound is preferably 0.5–10 wt %. The dipping temperature is preferably 40–70° C. The dipping time is preferably 2–300 sec, and more preferably 5–30 sec.

In this invention, as the aqueous solution containing hydrophilic compound other than the aqueous solution of organic compounds as mentioned above, an aqueous solution of inorganic compound such as aqueous solution containing alkali metal silicate, zirconium potassium fluoride ($K_2ZrF_6$), or phosphoric acid/inorganic fluoro compound is also used preferably.

The treatment using the aqueous solution of alkali metal silicate is performed by dipping a support in aqueous solution of alkali metal silicate, preferably at a temperature of 30–100° C., and more preferably at 50–90° C., for preferably 0.5–40 sec, and more preferably for 1–20 sec, the aqueous solution having a concentration of preferably 0.01–30 wt %, and more preferably 0.1–10 wt % and having a preferred pH value of 10–13 at 25° C.

Examples of the alkali metal silicates to be used in this invention include sodium silicate, potassium silicate, and lithium silicate. Especially, sodium or potassium silicate is preferable.

The aqueous solution of alkali metal silicate may contain a suitable amount of hydroxide such as sodium, potassium, and lithium hydroxide to raise the pH value. Especially, sodium or potassium hydroxide is preferable.

The aqueous solution of alkali metal silicate may contain alkali earth metal salts or the fourth group (IVB) metal salts. The alkaline earth metal salts are, for example, water soluble salts such as: nitrates such as potassium, strontium, magnesium, and barium nitrate; sulfate; hydrochloride; phosphate; acetate; oxalate; and borate. The fourth group (IVB) metal salts are, for example, titanium tetrachloride, titanium trichloride, titanium potassium fluoride, titanium potassium oxalate, titanium sulfate, titanium tetrachloride, zirconium chloroxide, zirconium dioxide, zirconium oxychloride, and zirconium tetrachloride etc. These alkaline earth metal salts and the fourth (IVB) metal salts may be used alone or in combination of more than two thereof.

The treatment with aqueous solution of zirconium potassium fluoride is performed by dipping a support at preferably 30–80° C. and for preferably 60–180 sec, in the aqueous solution of zirconium potassium fluoride whose concentration is preferably 0.1–10 wt %, and more preferably 0.5–2 wt %.

In the treatment with phosphate/inorganic fluoro compound, a support is dipped at preferably 20–100° C., more preferably at 40–80° C. and for preferably 20–300 sec, more preferably for 5–30 sec, in aqueous solution in which the concentration of phosphate compound is 5–20 wt % and the concentration of inorganic fluoro compound is 0.01–1 wt % and which preferably has a pH value of 3–5.

The phosphates to be used in this invention are, for example, phosphates of metal such as alkali metal, alkaline earth metal etc.

Specific examples thereof include zinc, aluminium, ammonium, hydrogen diammonium, dihydrogen ammonium, monoammonium, monopotassium monosodium, dihydrogen potassium, hydrogen dipottasium, calium, hydrogen ammonium sodium, hydrogen magnesium, magnesium, ferrous, ferric, dihydrogen sodium, sodium, hydrogen disodium, lead, diammonium, dihydrogen calcium and lithium phosphate; phosphotungstic acid; ammonium phosphotungstate, sodium phosphotungstate; ammonium phosphomolybdate; sodium phosphomolybdate; sodium phosphite; sodium tripolyphosphate; and sodium pyrophosphate. Especially, dihydrogen sodium phosphate, hydrogen disodium phosphate, dihydrogen potassium phosphate and hydrogen dipotassium pohosphate are preferred.

As inorganic fluoro compounds to be used in this invention, there may be preferably used metal fluorides.

Specific examples thereof include sodium fluoride, potassium fluoride, calcium fluoride, magnesium fluoride, hexafluoro zirconium sodium, hexafluoro zirconium potassium, sodium hexafluorotitanate, potassium hexafluorotitanate, hexafluoro zirconium hydro acid, hexafluoro titanium hydro acid, hexafluoro zirconium ammonium, hexafluoro ammonium titanate, hexafluoro silicic acid, nickel fluoride, iron fluoride, fluorinated phosphonic acid, and fluorinated ammonium phospohate.

The aqueous solution to be used for the phosphate/inorganic fluoro compound treatment may contain one or more than two of phosphate and fluoro compounds respectively.

The support is washed with water etc. after dipping it in aqueous solution containing these hydrophilic compounds as mentioned above and dried.

The problem of printing stain such as the deterioration of ink removal, which is caused in exchange for the improved sensitivity (improved press life in the case of a negative type sensitive layer) due to the pore-widening treatment performed after anodic oxidation, is solved by the hydrophilic surface treatment as mentioned above. That is, the hydrophilic surface treatment will alleviate the problem such that the removal of ink becomes difficult (i.e. deterioration of ink removal occurs) during the printing due to the widened pore diameter, especially at the restart of printing after the printing machine is stopped and the lithographic printing plate is left as it is on the machine.

<Undercoat Layer>

In this invention, for example, an inorganic undercoat layer of water soluble metal salt such as zinc borate or organic undercoat layer may be formed, if necessary, on the resulting support for a lithographic printing plate according to this invention, before forming a recording layer that is writable by exposure with infrared laser.

As organic compounds to be used for the organic undercoat layer, there are, for example, carboxymethyl cellulose; dextrine; gum arabic; polymer and copolymer having sulfonic acid group in a side chain; polyacrylic acid; phosphonic acids having an amino group such as di-aminoethyl phosphonic acid; organic phosphonic acid such as phenyl, naphthyl, alkyl, glycero, methylendi- and ethylendi-phosphonic acid, which may have substituent; organo phosphoric acid, such as phenyl, naphthyl, alkyl and glycero phosphoric acid, which may have substituent; organo phosphinic acid, such as phenyl, naphthyl, alkyl and glycero phosphinic acid, which may have substituent; amino acids such as glycine and β-alanine; hydrochloride of amine having hydroxyl group, such as triethandamine hydrochloride; and yellow dyes. These compounds may be used alone or in combination of more than two thereof.

The organic undercoat layer is formed by coating an aluminum plate with a solution plate with a solution in which organic compound such as mentioned above is dissolved in water or organic solvent such as methanol, ethanol, and methylethyl ketone, or in the mixed solvent thereof, and drying. The concentration of solution in which the organic compound is dissolved is preferably 0.005–10 wt %. The method for coating is not particularly limited; any method such as bar coater coating, rotary coating, spray coating, curtain coating may be used.

The amount of coat after drying the organic undercoat layer is preferably 2–200 mg/$m^2$, and more preferably 5–100 mg/$m^2$. An improved press life is obtained if it is set within the range as mentioned above.

<Backcoat Layer>

The resulting support may be provided on its back surface (surface without the recording layer) with a coat layer (called as "backcoat layer" hereinafter) of organic high molecular compound in order that the recording layers are not damaged when piled on top of each other on a lithographic printing original plate.

The main component of the backcoat layer is preferably at least one resin having a glass transition point of 20° C. or higher, which is selected from the group consisting of saturated copolymeric polyester resin, phenoxy resin, polyvinyl acetal resin and vinyliden chloride copolymeric resin.

The saturated copolymeric polyester resin is composed of a dicarboxylic acid unit and a diol unit. Examples of the discarboxylic acid unit include: an aromatic dicarboxylic acid such as phthalic, terephthalic, isophthalic, tetrabromophtalic, and tetrachlorophthalic acid; and a saturated aliphatic dicarboxylic acid such as adipic, azelaic, succimic, oxalic, subenic, subacic, malonic, and 1,4-cyclohexandicarboxylic acid.

The backcoat layer can contain suitably: dye and pigment for coloring; silane coupling agent, diazo resin of diazonium salt, organo phosphoric acid, and cationic polymer, for improving the adhesion to the support; wax, higher fatty acid, higher fatty acid amide, silicone compound of dimethylsiloxane, modified dimethylsiloxane, and polyethylene powder, which are conventionally used as slilding agents.

The thickness of the backcoat layer may be such that the recording layers to be described later are not easily damaged basically even without providing an interleaving sheet, and is preferably 0.01–8 μm. If the thickness is less than 0.01 μm, it is difficult to prevent the abrasion of recording layers when lithographic printing original plates are piled on top of one another. If the thickness exceeds 8 μm, the backcoat layer is swollen and its thickness is changed, due to chemicals used around the lithographic printing plate during printing. Thus the printing pressure is changed, whereby the printing property may deteriorate.

To form the backcoat layer on the back surface of the support, various methods can be used. For example, there are: a method wherein components for the backcoat layer are dissolved in a suitable solvent to apply it as a solution or as an emulsion dispersion and dried; a method wherein a film of the backcoat layer is formed in advance and adhered by means of adhesive or heat; and a method wherein a molten film is formed by means of melting extruder and is adhered onto a support.

To secure a preferable thickness of the backcoat layer, the most preferable method comprises dissolving the components for the backcoat layer in a suitable solvent and applying the resulting solution onto a support and then drying it. In this method, the organic solvents such as described in JP 62-251739 A may be used alone or as the mixture thereof.

In the manufacture of a lithographic printing original plate, either the backcoat layer on the back surface thereof or the recording layer on the front surface thereof may be formed first on the support, and both layers may also be simultaneously formed on the support.

[Original Forme for Lithographic Printing Plate]

The original forme for a lithographic printing plate according to this invention can be obtained by forming a recording layer that is writable by exposure with infrared laser, on the support for a lithographic printing plate according to this invention which is obtained as mentioned above.

<Recording Layer>

The recording layer in the lithographic printing original plate according to this invention is preferably a heat-sensitive layer containing (a) fine polymer particles having heat reactive functional group; or (b) micro capsules containing a compound having heat reactive functional group. When the heat reactive layer is used, the lithographic printing original plate thus obtained affords the on-press development process.

As a heat-reactive functional group that may be used commonly to (a) and (b) above, there are, for example, ethylenical unsaturated group for polymerization (e.g. acryloyl, methacryloyl, vinyl, and allyl group); isocyanate group for addition reaction or the blocked type thereof as well as functional group having active hydrogen atom as reactant thereto (e.g. amino, hydroxyl, and carboxyl group); epoxy group for addition reaction as well as amino group as reactant thereto; carboxyl and hydroxyl group; carboxyl or hydroxyl or amino group for condensation reaction; and acid anhydride and amino or hydroxyl group for ring-opening addition reaction. The heat reactive functional group to be used in this invention is not limited to the above-mentioned groups and any functional group may be used as long as chemical bond is formed.

As heat reactive functional group suitable for (a) fine polymer particles, there are, for example, acryloyl, methacryloyl, vinyl, allyl, epoxy, amino, hydroxyl, carboxyl, isocyanate, acid anhydride, and protected groups thereof. The introduction of heat reactive group into the polymer particles may be performed during the polymerization polymer or after the polymerization by utilizing a polymer reaction.

When the heat-reactive group is introduced during the polymerization of polymer, it is preferable to carry out the emulsion or suspension polymerization using monomer having the heat reactive group.

Specific examples of monomer having the heat reactive group include allyl methacrylate, allyl acrylate, vinyl methacrylate, vinyl acrylate, glycidyl methacrylate, glycidyl acrylate, 2-isocyanate ethyl methacrylate, blocked each of these isocyanates with alcohol, 2-isocyanate ethyl acrylate, blocked each of these isocyanates with alcohol, 2-amino ethyl methacrylate, 2-amino ethyl acrylate, 2-hydroxyethyl methacrylate, 2-hydroxy ethyl acrylate, acrylic acid, methacrylic acid, malaic anhydride, bifunctional acrylate, and bifunctional methacrylate. The monomer having the heat reactive group to be used in this invention is not limited to these.

Examples of the monomer which is copolymerizable with these monomers and has no heat reactive group include stylene, alkyl acrylate, alkyl methacrylate, acrylonitrile, and vinyl acetate. The monomer having no heat reactive group to be used in this invention is not limited to these.

As the polymer to be performed in the case where heat-reactive functional group is introduced after the polymerization of polymer, there is, for example, the polymer reaction described in WO 96/34316.

Preferably, the fine polymer particles described in (a) above are united by heat. More preferably, they have hydrophilic surfaces to allow their dispersion in water. It is also preferred that the contact angle (with waterdrop in air) of a film which is formed by coating only fine polymer particles and drying at a lower temperature than the freezing point, is smaller than the contact angle (with waterdrop in air) of a film which is formed at a higher temperature than the freezing point.

To make the surface of the fine polymer particles hydrophilic, as mentioned above, hydrophilic polymer or oligomers such as polyvinyl alcohol and polyethylen glycol, or hydrophilic low molecular compound may be adsorbed onto the surfaces of the fine polymer particles; however, the method is not limited thereto.

The freezing point of the fine polymer particles (a) is preferably 70° C. or higher, and more preferably 100° C. or higher in view of stability as to aging.

The mean particle size of the fine polymer particles (a) is preferably 0.01–20 μm, more preferably 0.05–2.0 μm, and especially preferably 0.1–1.0 μm. A good resolution and aging stability are obtained when it is set within the range mentioned above.

The addition amount of the fine polymer particles (a) is preferably 50 wt % or more, and more preferably 60 wt % or more based on the solid of the heat-sensitive layer.

Examples of the heat reactive functional group suitable for the microcapsules described in (b) above include: polymeric unsaturated group; hydroxyl, carboxyl, carboxylate, acid anhydride, amino, epoxy, or isocyanate group; and blocked type of isocyanate.

The compound having polymeric unsaturated group is preferably those having at least one, preferably more than two of ethylenical unsaturated bonds, for example, acryloyl, methacryloyl, vinyl and allyl. These compounds are widely known in this industrial field and may be used in this invention without any particular limitation thereon. From the viewpoint of chemical morphology, these compounds are monomer, prepolymer, namely dimer, trimer and oligomer, or the mixture and copolymer thereof.

Specific examples thereof include unsaturated carboxylic acid (e.g. acrylic, methacrylic, itaconic, crotonic, isocrotonic or maleic acid) and ester thereof, and unsaturated carboxylic acid amide. Especially, the ester of unsaturated carboxylic acid and aliphatic polyhydric alcohol and amide of unsaturated carboxylic acid and aliphatic polyfunctional amine are preferable.

The addition reaction product of unsaturated carboxylic acid ester or unsaturated carboxylic acid amide having nucleophilic substituent such as hydroxyl, amino and mercapto group with monofunctional or polyfunctional isocianate or epoxide as well as the dehydration condensation product of the ester or amide with monofunctional or polyfunctional carboxylic acid are used preferably. The addition reaction product of unsaturated carboxylic acid ester or amide having electrophilic substituent such as isocyanate and epoxy group with monofunctional or polyfunctional alcohol, amine or thiol, as well as the substitution reaction product of unsaturated carboxylic acid ester or amide having leaving substituent such as halogen and tosyloxy group with monofunctional or polyfunctional alcohol, amine or thiol are used preferably.

Further, another preferable examples thereof is a compound in which the above unsaturated phosphonic acid is substituted by unsaturated phosphonic acid or chloromethyl stylene.

Among polymeric compounds of ester of unsaturated carboxylic acid and aliphatic polyhydric alcohol, examples of the acrylic esters include ethylenglycol diacrylate, triethyleneglycol diacrylate, 1,3-butanediol diacrylate, tetramethyleneglycol diacrylate, propyreneglycol diacrylate, neopentylglycol diacrylate, trimethylolpropane diacrylate, trimethylelpropane triacrylate, trimethylolpropane tris (acryloyloxypropyl) ether, trimethylolethane triacrylate, hexanediol diacrylate, 1,4-cyclohexanediol diacrylate, tetraethylenglycol diacrylate, pentaerythritol diacrylate, pentaerythritol triacrylate, pentaerythritol tetracrylate, dipentaerythritol diacrylate, dipentaerythritol pentacrylate, dipentaerythritol hexacrylate, sorbitol triacrylate, sorbitol tetracrylate, sorbitol pentacrylate, sorbitol hexacrylate, tris (acroyloxyethyl) isocyanulate, polyester acrylate oligomer.

There are mentioned as methacrylic acid esters, for example, tetramethyleneglycol dimethacrylate, triethyleglycol dimethacrylate, neopentylglycol dimethacrylate, trimethylolpropane trimethacrylate, trimethyleolethane trimethacrylate, ethylenglycol dimethacrylate, 1,3-butanediol dimethacrylate, hexanediol dimethacrylate, pentaerythritol dimethacrylate, pentaerythritol trimethacrylate, pentaerythritol tetramethacrylate, dipentaerythritol dimethacrylate, dipentaerythritol hexamethacrylate, sorbitol trimethacrylate, sorbitol tetramethacrylate, bis[p-(3-methacryloyloxy-2-hydroxy-propoxy)phenyl] dimethylmethane, bis-[p-(methacryloyl-oxyethoxy)phenyl] dimethylmethane.

Examples of the itaconic acid esters include ethylenglycol diitaconete, propyleneglycol diitaconete, 1,3-butanediol diitaconete, 1,4-butanediol diitaconete, tetramethyleneglycol diitaconete, and pentaerythritol diitaconete; and sorbitol tetraitaconate.

There are mentioned as crotonic acid ester, for example, ethylenglycol dicrotonate, tetramethyleneglycol dicrotonate and pentaerythritol dicrotonate, and sorbitol tetracrotonate.

There are mentioned as isocrotonic acid ester, for example, ethylenglycol diisocrotonate and pentaerythritol diisocrotonate, and sorbitol tetraisocrotonate.

There are mentioned as maleic adic ester, for example, ethylenglycol dimalate, triethylenglycol dimalate and pentaerythritol dimalate, and sorbitol tetramalate.

There are mentioned as other ester, for example, esters of aliphatic alcohol based described in JP 46-27926 B, JP 51-47334 B and JP 57-196231 B; esters having aromatic skeleton described in JP 59-5240 A, JP 59-5241 A and JP 2-226149 A; and esters having amino group described in JP 1-165613 A.

Specific examples of monomer of amide between aliphatic polyfunctional amine compound and unsaturated carboxylic acid include methylene bis-acrylamide, methylene bis-methyacrylamide, 1,6-hexamethylene bis-acrylamide, 1,6-hexamethylene bis-methacrylamide, diethylenetriamine tris acrylamide, xylylene bis-acrylamide and xylylene bis-methyacrylamide.

There are mentioned as other preferable amide based monomers, for example, monomers having the cyclohexylene structure described in JP 54-21726 B.

Also preferred is polymeric addition compounds of urethane based, which is produced by using the addition reaction of isocyanate and hydroxyl groups. Specific examples thereof include an urethane compound containing more than two polymeric unsaturated groups in one molecule, which is obtained by adding the unsaturated monomer having hydroxyl group represented by the formula (II) below to a polyisocyanate compound having more than two isocyanate groups in the molecule which is described in JP 48-41708 B.

$$CH_2{=}C(R^1)COOCH_2CH(R^2)OH \qquad (II)$$

(wherein $R^1$ and $R^2$ each represents H or $CH_3$.)

Also preferred are: urethane acrylates described in JP 51-37193 A, JP 2-32293 B and JP 2-16765 B; and urethane compounds having the ethylene oxide skeleton described in JP 58-49860 B, JP 56-17654 B, JP 62-39417 B and JP 62-39418 B.

Also preferred are radical polymeric compounds having the amino and sulfide structures in the molecule, which are described in JP 63-277653 A, JP 63-260909 A and JP 1-105238 A.

Other preferable examples thereof include polyfunctional acrylates and methacrylates, such as polyacrylates, epoxyacrylates obtained by the reaction of epoxy resin and (metha) acrylic acid, described in JP 48-64183 A, JP 49-43191 B and JP 52-30490 B.

Also preferred are the specified unsaturated compounds described in JP 46-43946 B, JP 1-40337 B and JP 1-40336 B, and compounds of vinyl phosphoric acid described in JP 2-25493 A. In some cases, compounds containing perfluoroalkyl group described in JP 61-22048 A are also preferable. Further, photo setting monomers and oligomers reported in the "The Adhesion Society of Japan" Journal, vol. 20, No. 7, p.300–308 (1984) are also preferred.

Examples of suitable epoxy compounds include glycerine polyglycidylether, polyethyleneglycol diglycidylether, polypropylene diglycidylether, trimethylolpropane polyglycidylether, sorbitol polyglycidylether, and bisphenols or polyphenols or polyglycideyether as the hydrogenation product thereof.

There are mentioned as preferable isocyanate compounds, for example, tolylene diisocyanate, diphenylmethane diisocyanate, polymethylene polyphenyl polyisocyanate, xylylene diisocyanate, naphthalene diisocyanate, cyclohexane phenylen diisocyanate, isophoron diisocyanate, hexamethylene diisocyanate, cyclohexyl diisocyanate, or compounds in which these are blocked by alcohol or amine.

There are mentioned as preferable amine compounds, for example, ethylenediamine, diethylenetriamine, triethylenetetramine, hexamethylenediamine, propylenediamine, polyethyleneimine.

There are mentioned as preferable compounds having hydroxyl group, for example, compounds having terminal methylol group, polyhydnic alcohol such as pentaerythritol, bisphenol, polyphenols.

There are mentioned as preferable compounds having carboxylic group, for example, aromatic polybasic carboxylic acid such as pyromeritic, trimeritic and phthalic acid, aliphatic polybasic carboxylic acids such as adipic acid.

There are mentioned as preferable acid anhydrids, for example, pyromeritic and benzo phenonetetracarboxylic acid anhydride.

There are mentioned as preferable copolymers of ethylenical unsaturated compounds, for example, copolymers of allylmethacrylate. Specific examples thereof include allylmethacrylate/methacrylic acid copolymer, allylmethacrylate/ethylmethacrylate copolymer, and allylmethacrylate/butylmethacrylate copolymer.

As a method for the micro capsulation, known methods may be used. There are mentioned, for example, a method using coacervation described in U.S. Pat. Nos. 2,800,457 B and 2,800,458 B; a method using interfacial polymerization described in BP 990443 B, U.S. Pat. No. 3,287,154 B, JP 38-19574 B, JP 42-446 B and JP 42-711 B; a method using the separation of polymer described in U.S. Pat. No. 3,418,250 B and U.S. Pat. No. 3,660,304 B; a method using wall material of isocyanate polyol described in U.S. Pat. No. 3,796,669 B; a method using wall material of isocyanate described in U.S. Pat. No. 3,914,511 B; a method using wall material of urea-formaldehyde or urea-formaldehyde-resorcinol system described in U.S. Pat. Nos. 4,001,140 B, 4,087,376 B and 4,089,802 B; a method using wall material such as melamine-formaldehyde resin, hydroxycellulose etc. described in U.S. Pat. No. 4,025,445 B; in situ method using the monomer polymerization, described in JP 36-9163 B and JP 51-9079 B; a spray-drying method described in BP 930422 A and U.S. Pat. No. 3,111,407 B; a method using electrolytic dispersion cooling described in BP 952807 A and BP 967074 A. The method, however, is not limited to these in this invention.

The wall of microcapsule to be used preferably for (b) the microcapsules have three-dimensional bridges and are swollen with solvent. From this viewpoint, the wall material of microcapsule is preferably polyurea, polyurethane, polyester, polycarbonate, polyamide or the mixture thereof, and especially preferably polyurea and polyurethane. Compounds having heat reactive functional group may be introduced into the wall of microcapsule.

The mean particle size of (b) the microcapsule is preferably 0.01–20 μm, more preferably 0.05–20 μm, and especially preferably 0.10–1.0 μm. A good resolution and aging stability can be obtained when it is set within the range mentioned above.

The (b) microcapsules may be united by heat or may not be united at all. It is sufficient that, among the substances contained in microcapsules, those which penetrate onto the surface or out of the capsules or enter into the wall of the capsules during application thereof can cause a chemical reaction with heat. Alternatively, these may react with a hydrophilic resin added or low molecular compound added. Microcapsules may be reacted with each other by introducing heat-reactive functional groups, which are different from each other, into two kinds or more of microcapsules.

Accordingly, in view of image formation, it is preferred that the microcapsules be fused and united to each other by heat. However, this is not essential.

The amount of (b) the microcapsule added to the heat sensitive layer is preferably 10–60 wt %, and more preferably 15–40 wt %, based on reduced solid. A good on-press developability, sensitivity and presslife may be obtained if it is set within the range mentioned above.

(b) In a case where microcapsules are added to a heat-sensitive layer, a solvent in which the inclusion is dissolved and wall material swells may be added into the microcapsule dispersion. Such a solvent accelerates diffusion of the included compound having a heat-reactive functional group to outside the microcapsules.

Such a solvent may be readily selected from many commercially available solvents although it may vary depending on the microcapsule dispersant, material and thickness of the wall of microcapsule, and inclusion. For example, in a case of waster-dispersible microcapsules having a crosslinked polyurea or polyurethane wall, alcohols, ethers, acetals, esters, ketones, polyhydric alcohols, amides, amines, fatty acids and the like are preferred.

Specific examples thereof include methanol, ethanol, tertiary butanol, n-propanol, tetrahydrofuran, methyl lactate, ethyl lactate, methyl ethyl ketone, propylene glycol monomethyl ether, ethylene glycol diethyl ether, ethylene glycol monomethyl ether, γ-butyrolactone, N,N-dimethylformamide, N,N-dimethylacetamide, etc. The present invention is not limited to these. Also, two or more of these solvents may be used.

A solvent that does not dissolve in the microcapsule dispersion but dissolves in it when the above-mentioned solvent is mixed may also be used. The addition amount is determined depending on the combination of materials but usually it is preferably 5 to 95 wt %, more preferably 10 to 90 wt % and most preferably 15 to 85 wt % of the coating solution.

In a case where a heat-sensitive layer containing (a) particulates of a polymer having a heat-reactive functional group or (b) microcapsules including a compound having a heat-reactive functional group is used as the recording layer, a compound that initiates or accelerates the reaction of them may be added as necessary. Examples of the compound that initiates or accelerates the reaction include compounds that generate radicals or cations by heat. Specific examples thereof include roffin dimer, trihalomethylated compounds, peroxides, azo compounds, onium salts including diazonium salts or diphenyliodonium salts, acylphosphines, and imide sulfonates.

These compounds are added in amounts in the range of preferably 1 to 20 wt %, more preferably 3 to 10 wt % of the solids content of heat-sensitive layer. In the above range, on-press developability is not deteriorated and good reaction initiating or accelerating effect can be obtained.

The heat-sensitive layer may contain a hydrophilic resin. Addition of the hydrophilic resin not only provides good on-press developability but also improves film strength of the hat-sensitive layer itself.

As the hydrophilic resin, those having a hydrophilic group such as a hydroxyl, carboxyl, hydroxyethyl, hydroxypropyl, amino, aminoethyl, aminopropyl, or carboxymethyl are preferred.

Specific examples of the hydrophilic resin include gum arabic, casein, gelatin, starch derivatives, carboxymethylcellulose and sodium salt thereof, cellulose acetate, sodium alginate, vinyl acetate/maleic acid copolymers, styrene/maleic acid copolymers, polyacrylic acids and salts thereof, polymethacrylic acids and salts thereof, homopolymers and copolymers of hydroxyethyl methacrylate, homopolymers and copolymers of hydroxyethyl acrylate, homopolymers and copolymers of hydroxypropyl methacrylate, homopolymers and copolymers of hydroxypropyl acrylate, homopolymers and copolymers of hydroxybutyl methacrylate, homopolymers and copolymers of hydroxybutyl acrylate, polyethylene glycols, hydroxypropylene polymers, polyvinyl alcohols, hydrolyzed polyvinyl acetate having a degree of hydrolysis of at least 60 wt %, preferably at least 80 wt %, polyvinyl formal, polyvinyl butyral, polyvinyl pyrolidone homopolymers and copolymers of acrylamide, homopolymers and polymers of methacrylamide, and homopolymers and copolymers of N-methylolacrylamide.

The addition amount of the hydrophilic resin to the heat-sensitive layer is preferably 5 to 40 wt %, more preferably 10 to 30 wt % of the solids content of the heat-sensitive layer. In the above-mentioned range, good on-press developability and film strength can be obtained.

The heat-sensitive layer may contain a light-heat converting agent that absorbs infrared ray and generates heat in order to improve sensitivity. Such a light-heat converting agent may be a light absorbing substance having an absorbing band in at least a portion of 700 to 1,200 nm and various pigments, dyes and metal particulates may be used as the light-heat converting agent.

As for the kinds of pigment, black pigments, brown pigments, red pigments, violet pigments, blue pigments, green pigments, fluorescent pigments, metal powder pigments, and in addition polymer binding dyes are exemplified. Specific examples include insoluble azo pigments, azo lake pigments, condensed azo pigments, chelate azo pigments, phthalocyanine-based pigments, anthraquinone-based pigments, perylene- and perynone-based pigments, thioindigo-based pigments, quinacridone-based pigments, dioxazine-based pigments, isoindolinone-based pigments, quinophthalone-based pigments, dyeing lake pigments, azine pigments, nitroso pigments, nitro pigments, natural pigments, fluorescent pigments, inorganic pigments, and carbon black.

The pigments may be used without surface treatment or with surface treatment. Examples of the method of surface treatment include a method of surface-coating a hydrophilic resin or an ink receptive resin, a method of attaching a surfactant, and a method of binding a reactive substance (for example, silica sol, alumina sol, silane coupling agent, epoxy compound or isocyanate compound) to the surface of the pigment. The above-mentioned surface treatment methods are described in "Properties and Application of Metal Soaps" (Saiwai Shobo), "Printing Ink Technologies" (CMC Publishing, 1984), and "Current Pigment Application Technologies" (CMC Publishing, 1986). Among these pigments, those that absorb infrared rays are preferred for their applicability to lasers that emit infrared rays. As such a pigment absorbing an infrared ray, carbon black is preferred.

The particle size of pigment is in the range of preferably 0.01 to 1 μm, more preferably 0.01 to 0.5 μm.

As the dye, those available on the market and the known dyes described in literature (for example, "Manual of Dyes" ed. by Organic Synthetic Chemical Association, 1970, "Near infrared-absorbing pigments" in "Chemical Industry", May, 1986, p.45–51, "Development and trend in market of functional pigments during the 1990s", Chapter 2 section 2.3 (1990) CMC") or patents may be used.

Specifically, infrared-absorbing dyes such as azo dyes, metal complex salt azo dyes, pyrazolone azo dyes, anthraquinone dyes, phthalocyanine dyes, carbonium dyes, quinoneimine dyes, polymethyne dyes, and cyanine dyes are preferred.

Further examples thereof include cyanine dyes described in JP 58-125246 A, JP 59-84356 A, JP 60-78787 A, etc., methyne dyes described in JP 58-173696 A, JP 58-181690 A, JP 58-194595 A, etc., naphthoquinone dyes described in JP 58-112793 A, JP 58-224793 A, JP 59-48187 A, JP 59-73996 A, JP 60-52940 A, JP 60-63744 A, etc., squalylium dyes described in JP 58-112792 A, cyanine dyes described in BP 434,875 B, dyes described in U.S. Pat. No. 4,756,993 A, cyanine dyes described in U.S. Pat. No. 4,973,572 A, dyes described in JP 10-268512 A and phthalocyanine compounds described in JP 11-235883 A.

Also, as the dyes, near infrared-absorbing sensitizing agents described in U.S. Pat. No. 5,156,938 A are suitably used. In addition, substituted arylbenzo(thio)pyrylium salts described in U.S. Pat. No. 3,881,924 A, trimethynethiapyrylium salts described in JP 57-142645 A, pyrylium-based compounds described in JP 58-181051 A, JP 58-220143 A, JP 59-41363 A, JP 59-84248 A, JP 59-84249 A, JP 59-146063 A, and JP 59-146061 A, cyanine dyes described in JP 59-216146 A, pentamethynethiopyrylium salts described in U.S. Pat. No. 4,283,475 A and the like, pyrylium compounds described in JP 5-13514 B and JP 5-19702 B, Epolite III-178, Epolite III-130, Epolite III-125 (from Epoline Co.), and the like may be suitably used.

Hereinafter, some specific examples will be shown.

[Chemical formula 2]

(IR-1)

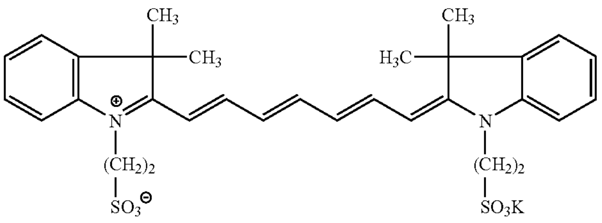

-continued
(IR-2)
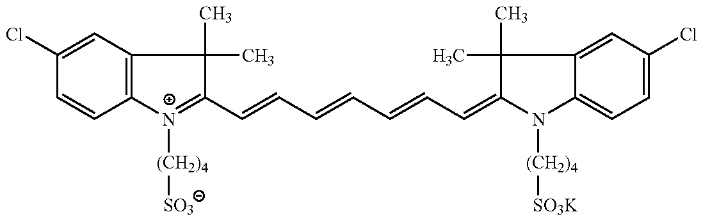
(IR-3)
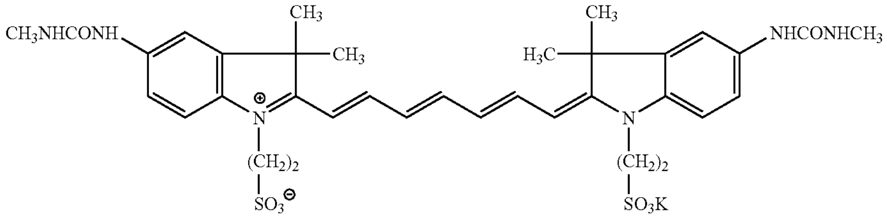
(IR-4)
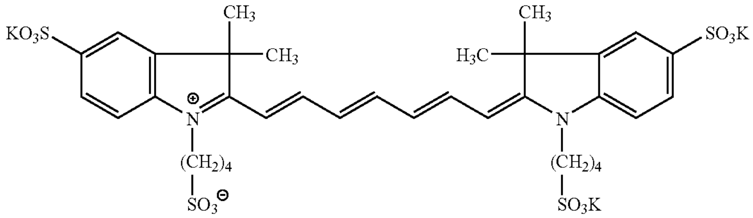
(IR-5)
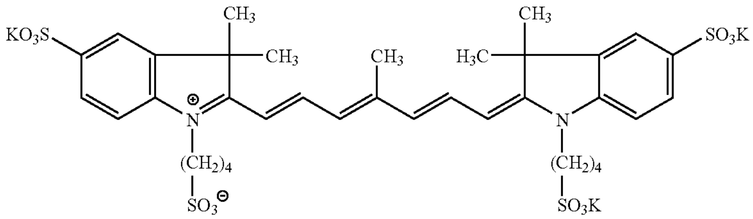
(IR-6)
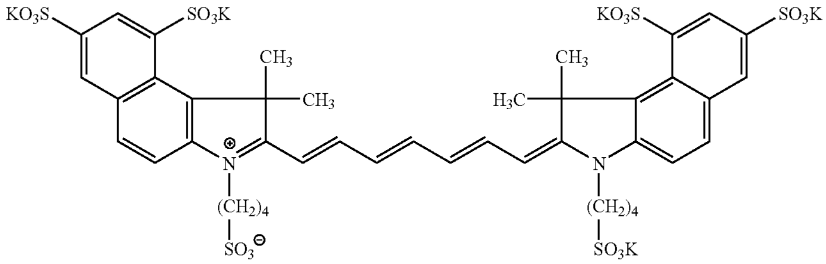
[Chemical formula 3]
(IR-7)
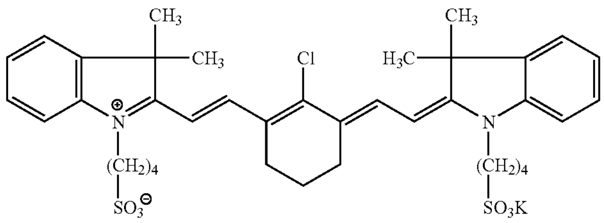

-continued
(IR-8)
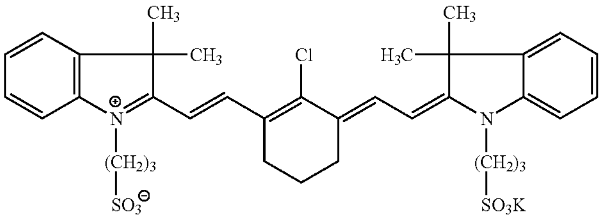
(IR-9)
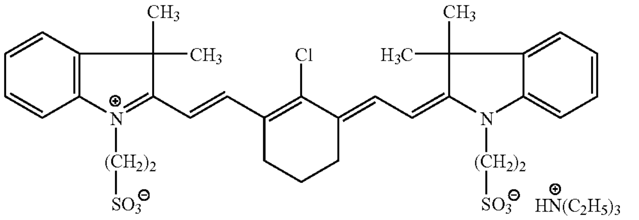
(IR-10)
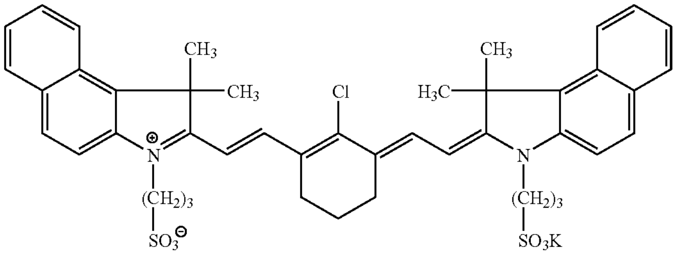
(IR-11)
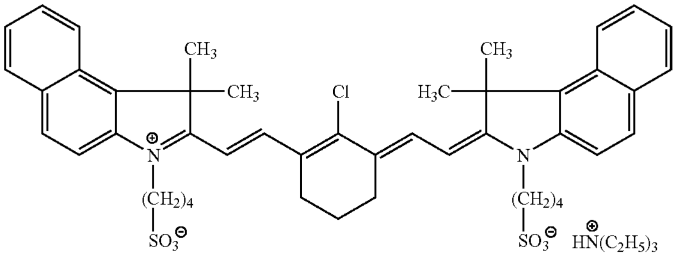
In a case where the light-heat converting agent is added in an ink receptive substance such as polymer particulates or microcapsules, the above-mentioned infrared-absorbing pigments or dyes may be used but those which are more ink receptive are preferred. Suitable dyes include those exemplified below.
[Chemical formula 4]
(IR-21)
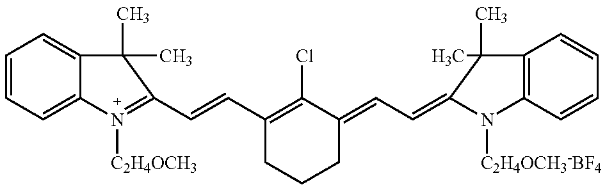

-continued
(IR-22)
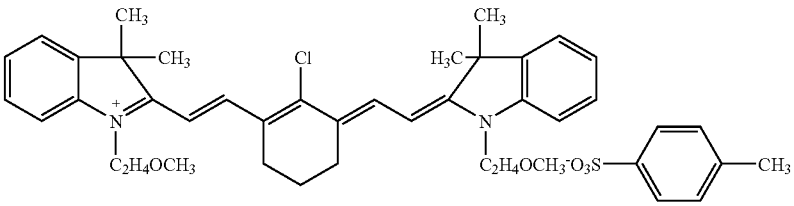
(IR-23)
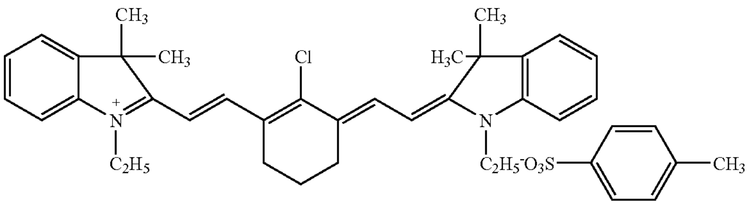
(IR-24)
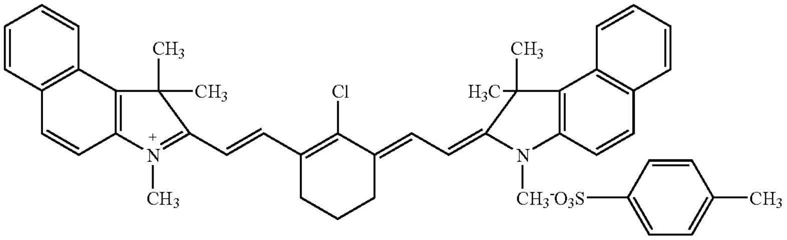
(IR-25)
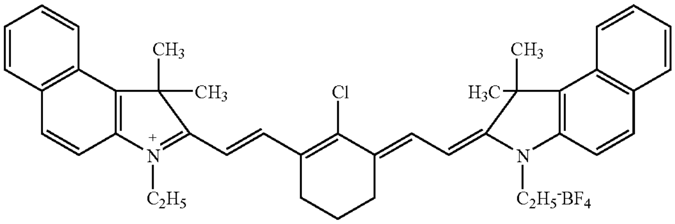
(IR-26)
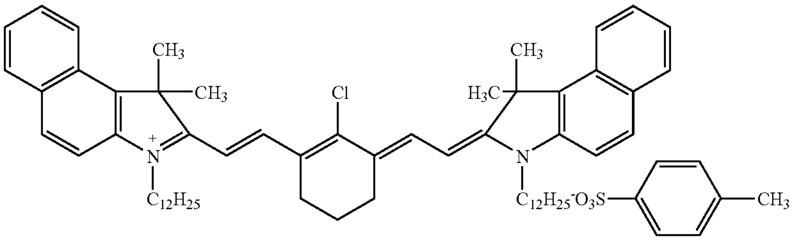
[Chemical formula 5]

-continued (IR-27)

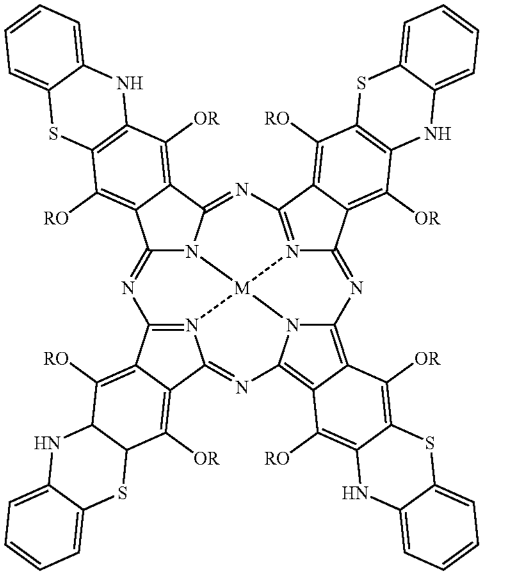

M = VO, R = i—$C_5H_{11}$ (IR-28)

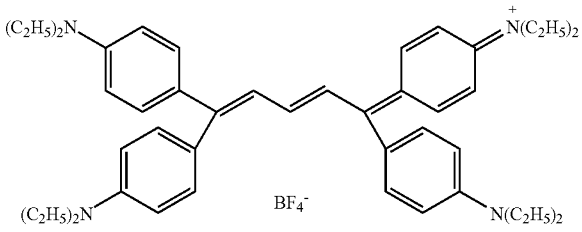

It is preferred that the above-mentioned organic light-heat converting agent is added in the range of up to 30 wt %, more preferably 5 to 25 wt % and most preferably 7 to 20 wt % in the heat-sensitive layer. In the above-mentioned range, good sensitivity can be obtained.

In the heat-sensitive layer, also metal particulates may be used as the light-heat converting agent. Most of the metal particulates are light-heat converting and self heat generating. Preferred metal particulates include particulates of simple elements such as Si, Al, Ti, V, Cr, Mn, Fe, Co, Ni, Cu, Zn, Y, Zr, Mo, Ag, Au, Pt, Pd, Rh, In, Sn, W, Te, Pb, Ge, Re, and Sb or alloy thereof or oxides or sulfides thereof.

Among the metals that constitute these metal particulates, preferred metals are those metals that tend to be united by heat upon light irradiation, have a melting point at about 1,000° C. or lower and absorb light in infrared, visible or ultraviolet regions, for example, Re, Sb, Te, Au, Ag, Cu, Ge, Pb, and Sn.

Particularly preferred are particulates of those metals that have relatively low melting points and relatively high absorbance for infrared rays, for example, Ag, Au, Cu, Sb, Ge, and Pb. Most preferred elements include Ag, Au, and Cu.

Also, the light-heat converting agent may be constituted by two or more light-heat converting substances, for example, use of a mixture of particulates of a low melting metal such as Re, Sb, Te, Au, Ag, Cu, Ge, Pb, or Sn and particulates of a self heat generation metal such as Ti, Cr, Fe, Co, Ni, W, or Ge. It is also preferable to use in combination minute particles of a metal species that has particularly high light absorption when it is rendered minute fragments, such as AG, Pt or Pd and minute fragments of other metal.

The particle size of these particles is preferably 10 μm or less, more preferably 0.003 to 5 μm and most preferably 0.01 to 3 μm. In the above range, good sensitivity and resolution can be obtained.

In the present invention, when these metal particulates are used as light-heat converting agents, the addition amount thereof is preferably 10 wt % or more, more preferably 20 wt % or more and most preferably 30 wt % or more of the solids content of the heat-sensitive layer. In the above range, high sensitivity can be obtained.

The light-heat converting agent may be contained in an undercoat layer adjacent to the heat-sensitive layer or a water soluble overcoat layer described later. Since at least one layer out of the heat-sensitive layer, undercoat layer and overcoat layer contains the light-heat converting agent, the efficiency of infrared ray absorption increases and sensitivity can be improved.

The heat-sensitive layer may contain various compounds beside those described above as necessary. For example, a polyfunctional monomer may be added into the matrix of heat-sensitive layer in order to further increase the impression capacity. As the polyfunctional monomer, the monomers exemplified as those that can be added in the microcapsules. Particularly preferred monomer may include trimethylolpropane triacrylate.

In the heat-sensitive layer, a dye having a strong absorption may be used as a coloring agent for an image in the visible range in order to make it easy to distinguish an image area from a non-image area after image formation. Specifically such a dye includes Oil Yellow #101, Oil Yellow #103, Oil Pink #312, Oil Green BG, Oil Blue BOS, Oil Blue #603, Oil Black BY, Oil Black BS, Oil Black T-505 (these being produced by Orient Chemical Industry Co., Ltd.), Victoria Pure Blue, Crystal Violet (CI42555), Methyl Violet (CI42535), Ethyl Violet, Rhodamine B (CI145170B), Malachite Green (CI42000), Methylene Blue (CI52015), and dyes described in JP 62-293247 A. In addition, pigments such as phthalocyanine-based pigments, azo-based pigments, and titanium oxide may be preferably used. It is preferred that the addition amount is 0.01 to 10 wt % of all the solids content of the coating solution for the heat-sensitive layer.

Also, in the present invention, in order to prevent unnecessary heat polymerization of ethylene unsaturated compounds during preparation or storage of a coating solution for the heat-sensitive layer, it is preferred to add a small amount of heat polymerization preventing agent. Examples of suitable heat polymerization preventing agent include hydroquinone, p-methoxyphenol, di-t-butyl-p-cresol, pyrogallol, t-butylcathecol, benzoquinone, 4,4'-thiobis(3-methyl-6-t-butylphenol), 2,2'methylenebis(4-methyl-6-t-butylphenol), and N-nitroso-N-phenylhydroxylamine aluminum salt. The addition amount of heat polymerization preventing agent is preferably about 0.01 to 5 wt % of the mass of total composition.

As necessary, in order to prevent inhibition of polymerization by oxygen, higher fatty acid or derivatives thereof such as behenic acid or behenic acid amide may be added so as to localize it on the surface of the heat-sensitive layer in the process of drying after coating. The addition amount of higher fatty acid or derivatives thereof is preferably about 0.1 to about 10 wt % of the solids content of the heat-sensitive layer.

Further, the heat-sensitive layer may contain a plasticizer as necessary in order to impart it flexibility and the like of the coating film. Examples of the plasticizer include polyethylene glycol, tributyl citrate, diethyl phthalate, dibutyl phthalate, dihexyl phthalate, dioctyl phthalate, tricresyl phosphate, tributyl phosphate, trioctyl phosphate, and tetrahydrofurfuryl oleate.

The heat-sensitive layer is formed by dissolving each of necessary components described above in a solvent to prepare a coating solution and coating it. Examples of the solvent used here include ethylene dichloride, cyclohexanone, methyl ethyl ketone, methanol, ethanol, propanol, ethylene glycol monomethyl ether, 1-methoxy-2-propanol, 2-methoxy ethyl acetate, 1-methoxy-2-propyl acetate, dimethoxyethane, methyl lactate, ethyl lactate, N,N-dimethylacetamide, N,N-dimethylformamide, tetramethylurea, N-methylpyrrolidone, dimethyl sulfoxide, sulfolane, y-butyrolactone, toluene, water and the like but is not limited to these. The solvents may be used singly or as mixtures. The solids concentration of the coating solution is preferably 1 to 50 wt %.

The coating amount of heat-sensitive layer (solids content) on the substrate obtained after coating and drying may vary depending on the purpose but generally it is preferably 0.5 to 5.0 $g/m^2$. If the coating mount is smaller than the above range, apparent sensitivity increases but the film property of the heat-sensitive layer that performs the function of image recording is decreased. As the coating method, various methods may be used. Examples thereof include bar coater coating, rotation coating, spray coating, curtain coating, dip coating, air knife coating, blade coating, and roll coating.

The coating solution of heat-sensitive layer may contain a surfactant for improving coatability, for example, a fluorine-based surfactant described in JP 62-170950 A. The addition amount is preferably 0.01 to 1 wt %, more preferably 0.05 to 0.5 wt % of the total solids content of the heat-sensitive layer.

In the original forme for a lithographic printing plate according to the present invention, in order to prevent an occurrence of contamination on the surface of the heat-sensitive layer by ink receptive substances, a water soluble overcoat layer may be provided on the heat-sensitive layer. The water soluble overcoat layer used in the present invention can be readily removed at the time of printing and contains a resin selected from water-soluble organic polymer compounds.

The water-soluble organic polymer compounds include those in which a coating sheet formed by coating followed by drying has a film forming property when they are coated and dried. Specific examples thereof include polyvinyl acetate (provided that it has a hydrolysis ratio of 65% or more); polyacrylic acid, and alkali metal salts or amine salts thereof; polyacrylic acid copolymers, and alkali metal salts or amine salts thereof; polymethacrylic acid, and alkali metal salts or amine salts thereof; polymethacrylic acid copolymers, and alkali metal salts or amine salts thereof; polyacrylamide, and copolymers thereof; polyhydroxyethyl acrylate; polyvinylpyrrolidone and copolymers thereof; polyvinyl methyl ether; vinyl methyl ether/maleic anhydride copolymer; poly-2-acrylamide-2-methyl-1-propanesulfonate and alkali metal salts or amine salts thereof; poly-2-acrylamide-2-methyl-1-propansulfonate copolymer, and alkali metal salts or amine salts thereof; gum arabic; cellulose derivatives (for example, carboxymethylcellulose, carboxyethylcellulose, methylcellulose) and modified products thereof; white dextrin; pullulan; and enzyme-decomposed etherated dextrin. Depending on the purpose, a mixture of two or more of these may be used.

The overcoat layer may contain the aforementioned water-soluble light-heat converting agent. Furthermore, when it is formed by coating a water-soluble solution for the purpose of maintaining evenness of coating, the overcoat layer may contain a nonionic surfactant such as polyoxyethylene nonyl phenyl ether, polyoxyethylene dodecyl ether or the like.

The dry coating amount of the overcoat layer is preferably 0.1 to 2.0 $g/m^2$. In this range, it is possible to effectively prevent occurrence of contamination on the surface of the heat-sensitive layer with ink receptive substance, such as fingerprint, without deteriorating the on-press developability.

In the original forme for a lithographic printing plate according to the present invention, the recording layer may be other than the aforementioned heat-sensitive layer containing (a) the polymer particles having a heat-reactive functional group or (b) microcapsules including a compound having a heat-reactive functional group. Examples of such a layer includes photosensitive layers such as a photosensitive layer using a negative-type infrared laser recording material, a photosensitive layer using a positive-type infrared laser recording material, and a photosensitive layer using a sulfonate-type infrared laser recording material.

In a case where the original forme for a lithographic printing plate according to the present invention is an original forme of a negative-type lithographic printing plate which may be exposed with infrared laser, that is, a so-called thermal negative-type lithographic printing original plate, the photosensitive layer may be suitably made of a negative-type infrared laser recording material.

As the negative-type infrared laser recording material, those compositions comprising (A) a compound that is decomposed by light or heat to generate acid, (B) a crosslinking agent that corsslinks with the acid, (C) an alkali-soluble resin, (D) an infrared absorbent, and (E) a compound represented by the general formula $(R^3—X)_n—Ar—(OH)$ m (wherein $R^3$ represents an alkyl group or alkenyl group having 6 to 32 carbon atoms, X represents a single chemical bond, O, S, COO or CONH, Ar represents an aromatic hydrocarbyl group, an aliphatic hydrocarbyl group, or a heterocyclic group, n is an integer of 1 to 3, and m is an integer of 1 to 3) are suitably used.

Generally, the thermal negative-type lithographic printing original plate has drawbacks such that fingerprints can be easily attached onto it after development and the strength of the image area is poor. Such drawbacks can be solved by forming the photosensitive layer from the above-mentioned composition.

Examples of the compound (A) which is decomposed by light or heat to generate an acid include compounds which are subjected to a photodecomposition to generate sulfonic acid, typified by iminosulfonates described in Japanese Patent Application No. 3-140109 (JP 04-365048 A) and compounds which generate an acid by exposure to light having a wavelength of 200 to 500 nm or by heating at 100° C. or more.

Preferred acid generating agents include photocationic polymerization initiators, photoradical polymerization initiators, and photocolor fading and photocolor changing agents of pigments. The acid generating agent is preferably added in an amount of 0.01 to 50 wt % based on the total solid content of a recording material.

Preferred examples of the crosslinking agent (B) for crosslinking by an acid include (i) aromatic compounds having an alkoxymethyl group or hydroxyl group as a substituent, (ii) compounds having an N-hydroxymethyl group, N-alkoxymethyl group or N-acyloxymethyl group and (iii) epoxy compounds.

Examples of the alkali soluble resin (C) include novolak resin and polymers having a hydroxyaryl group in the side chain.

Examples of the composition (D) comprising an infrared-absorbing agent include: commercially available dyes such as azo dyes, anthraquinone dyes and phthalocyanine dyes all of which absorb infrared ray having a wavelength of 760 to 1,200 nm effectively; and black pigments, red pigments, metal powder pigments and phthalocyanine-based pigments which are listed in color indices. An image coloring agent such as Oil Yellow or Oil Blue #603 is preferably added to make it easier to see an image. A plasticizer such as polyethylene glycol or phthalate may be added to improve the softness of a photosensitive layer coating film.

It is recommended to form a photosensitive layer from a positive type infrared laser recording material when the original forme for a lithographic printing plate of the present invention is to be changed to a positive type original forme for a lithographic printing plate which can be exposed to infrared laser light, a so-called thermal positive type lithographic printing original plate.

As the positive type infrared laser recording material may be advantageously used a positive type infrared laser recording material which comprises (A) an alkali-soluble polymer, (B) a compound which is compatible with the alkali-soluble polymer to reduce its alkali solubility, and (C) a compound which absorbs infrared laser light.

When this positive type infrared laser recording material is used, the poor solubility in an alkali developer of a non-image area can be solved and an original forme for a lithographic printing plate which is hardly scratched and has excellent alkali-resistant developability of an image area and development stability can be obtained.

Examples of the alkali-soluble polymer (A) include (i) polymer compounds having a phenolic hydroxyl group typified by phenolic resin, cresol resin, novolak resin and pyrogallol resin, (ii) compounds obtained by homopolymerizing a polymerizable monomer having a sulfonamide group or by copolymerizing it with another polymerizable monomer, and (iii) compounds having an active imide group typified by N-(p-toluenesulfonyl)methacrylamide or N-(p-toluenesulfonyl)acrylamide in the molecule.

Examples of the compound which is compatible with the above-mentioned component (A) to reduce its alkali solubility include compounds which interact with the above component (A), such as sulfone compounds, ammonium salts, sulfonium salts and amide compounds. When the above component (A) is a novolak resin, a cyanine pigment is suitably used as the component (B).

The compound which absorbs infrared laser light (C) is preferably a material which absorbs light having an infrared region of 750 to 1,200 nm and has photo thermal convertion function. Examples of the material having such a function include squalilium pigment, pyrylium pigment, carbon black, insoluble azo dye and anthraquinone-based dye. They are preferably as large as 0.01 to 10 μm.

The thermal positive type original forme for a lithographic printing plate can be obtained by dissolving this positive type infrared laser recording material in an organic solvent such as methanol or methyl ethyl ketone, adding a dye as required, applying this solution to a support to such a degree as being 1 to 3 $g/m^2$ in terms of mass after drying, and drying the coating film.

In the original forme for a lithographic printing plate of the present invention, a sulfonate-based infrared laser recording material may be used as a recording layer.

As the sulfonate-based infrared laser recording material may be used sulfonate compounds described in JP 270480 B and JP 2704872 B. A photosensitive material which generates sulfonic acid by heat generated upon irradiation with infrared laser light to become soluble in water, a photosensitive material whose surface polarity is changed by fixing a styrene sulfonic acid ester with sol-gel and applying thereto an infrared laser light, and photosensitive materials whose hydrophobic surface is turned hydrophilic by exposure to laser light as disclosed in Japanese Patent Application No. 9-89816 (JP 10-282646 A), No. 10-22406 (JP 11-218928 A) and No. 10-027655 (JP 10-282672 A) may also be used.

The following methods are preferably used in combination to further improve the characteristics of a photosensitive layer made of a polymer compound which can generate a sulfonic acid group by the above-mentioned heat. The methods include, for example, (1) one in which an acid or base generating agent is used together as disclosed in Japanese Patent Application No. 10-7062 (JP 11-202483 A), (2)one in which a particular intermediate layer is formed as disclosed in Japanese Patent Application No. 9-340358 (JP 11-174685 A), (3) one in which a particular crosslinking agent is used together as disclosed in Japanese Patent Application No. 9-248994 (JP 11-84658 A), and (4) one in which the photosensitive layer is used with the surface of a solid particle is modified as disclosed in Japanese Patent Application No. 10-115354 (JP 11-301131 A).

Other examples of the composition which changes the hydrophilic or hydrophobic nature of a photosensitive layer by heat generated upon exposure to laser light include, for example, a composition which comprises a Werner complex and turns hydrophobic by heat as disclosed in U.S. Pat. No. 2,764,085 B, a composition which turns hydrophilic upon exposure, such as a particular sugars or melamine formaldehyde resin disclosed in JP 46-27219 B, a composition which turns hydrophobic upon heat mode exposure as disclosed in JP 51-63704 A, a composition comprising a polymer which turns anhydrous or hydrophobic by heat, such as a phthalyl hydrazide polymer disclosed in U.S. Pat. No. 4,081,572 B, a composition which has a tetrazolium salt structure and turns hydrophilic by heat as disclosed in JP 3-58100 B, a composition which comprises a sulfonic acid modified polymer and turns hydrophobic upon exposure as disclosed in JP 60-132760 A, a composition which comprises an imide precursor polymer and turns hydrophobic upon exposure as disclosed in JP 64-3543 A, and a composition which comprises a carbon-fluorine polymer and turns hydrophilic upon exposure as disclosed in JP 51-74706 A. A recording layer can be formed from these compositions.

The above examples further include a composition which comprises a hydrophobic crystalline polymer and turns hydrophilic upon exposure as disclosed in JP 3-197190 A, a composition which comprises a polymer and photo thermal convertion agent and whose insolubilized side group turns hydrophilic by heat as disclosed in JP 7-186562 A, a composition which comprises a 3-D crosslinked hydrophilic binder containing microcapsules and turns hydrophobic upon exposure as disclosed in JP 7-1849 A, a composition which is subjected to a valence isomerization and isomerized by or proton shift as disclosed in JP 8-3463 A, a composition which undergoes a phase structural change (compatibilization) in layer by heat to change its hydrophilic/hydrophobic nature as disclosed in JP 8-141819 A, and a composition whose surface form or whose surface hydrophilic/hydrophobic nature is changed by heat as disclosed in JP 60-228 B. A recording layer can be formed from these compositions.

Other preferred examples of the recording material used in the recording layer in the present invention include a composition which changes adhesion between a photosensitive layer and a support by heat generated by high-power and high-density laser light, so-called “heat mode exposure”. Specifically, the composition is a composition which comprises a thermally fusible material or heat-reactive material as disclosed in JP 44-22957 B.

A description is subsequently given of the device for producing an aluminum support which is a preferred form of the support for lithographic printing plates of the present invention.

The process for producing an aluminum support which is a preferred form of the support for lithographic printing plates of the present invention preferably comprises (1) the step of winding off an aluminum plate which has been rolled and wound like a coil from a wind-off unit which is a multi-axis turret, (2) the step of drying the aluminum plate after the above treatments (mechanical surface roughening treatment, electrochemical surface roughening treatment, alkali etching, acid etching, desmutting, formation of a low thermally conductive hydrophilic coating film, pore widening (acid treatment or alkali treatment), pore-sealing, hydrophilic surface treatment, etc.), and (3) the step of winding up the aluminum plate like a coil by a wind-up unit which is formed from the above multi-axis turret or correcting the flatness of the aluminum plate, cutting it to a predetermined length and collecting cut pieces. As required, in the above process, the step of forming an undercoat layer or recording layer and drying it may be provided to prepare an original forme for a lithographic printing plate which is then wound up like a coil by the above wind-up unit.

Preferably, the production process of an aluminum support comprises at least one step of inspecting a surface defect in the aluminum plate continuously using a device for inspecting the defect and labeling an edge portion of a discovered defect for the purpose of marking. Further, in the step of winding off the aluminum plate and the step of winding up the aluminum plate in the production of the original forme for a lithographic printing plate of the present invention, even when the running of the aluminum plate is suspended for the exchange of an aluminum coil, a reserver unit for maintaining the running speed of the aluminum plate at a constant speed in each step is preferably used and the step of bonding the aluminum plate by ultrasonic waves or arc welding is preferably provided after the step of winding off the aluminum plate.

The apparatus used for the production of an aluminum support preferably comprises at least one unit for detecting the running position of the aluminum plate to correct the running position, and at least one drive unit for reducing the tension of the aluminum plate and controlling the running speed of the aluminum plate and at least one dancer roll unit for controlling the tension of the aluminum plate.

It is also preferred that a tracking unit be used to record whether the conditions of each step are desirable or not in order to label an edge portion of an aluminum web before the aluminum coil is wound up like a coil so that it can be judged later whether conditions of portions after labeled portion are desired or not.

In the present invention, it is preferred that the aluminum plate and an interleaving sheet be charged to be adsorbed to each other, cut to a predetermined length and/or slit. It is also preferred that based on information from the label as a mark pasted to the edge portion of the aluminum plate, the aluminum plate is divided into an acceptable portion and a defective portion after or before it is cut to a predetermined length so that only acceptable portion is collected.

In each step including the above wind-off step etc., it is important to set the optimum tension according to conditions such as the size (thickness and width) of the aluminum plate, the material of the aluminum plate or the running speed of the aluminum web. It is preferred to install a plurality of tension controllers for feed-back controlling a signal from a tension detector, making use of a drive unit for reducing tension and controlling the running speed and a dancer roll for controlling tension. The drive unit generally employs a control method which combines a DC motor and a main drive roller. The main drive roller is made from general rubber and a roller made of a nonwoven cloth laminate may be used in the step where the aluminum web is in a wet state. Although each pass roller is generally made from rubber or metal, a motor or decelerator may be connected to each pass roller and an auxiliary drive unit for controlling the revolution of the pass roller at a constant speed based on a signal from the main drive unit may be provided to prevent a slip between the pass roller and the aluminum web in such a portion that this slip is likely to occur.

In the aluminum support used in the present invention, as disclosed in JP 10-114046 A, when the arithmetic average roughness ($R_a$) in the rolling direction is represented by $R_1$ and the arithmetic average roughness ($R_a$) in the width direction is represented by $R_2$, $R_1$–$R_2$ is preferably 30% or less of $R_1$, the average curvature in the rolling direction is preferably $1.5\times10^{-3}$ $mm^{-1}$ or less, the average curvature in the width direction is preferably 1.5×10–3 $mm^{-1}$ or less, and the average curvature in a direction perpendicular to the rolling direction is preferably $1.0\times10^{-3}$ $mm^{-1}$ or less.

The aluminum support produced through the above surface roughening treatment etc. is preferably straightened with a straightening roll having a diameter of 20 to 80 mm and a rubber hardness of 50 to 90 degrees. Thereby, even in the step of automatically conveying a photosensitive lithographic printer, a flat aluminum coiled plate which is free from an exposure shift in an original forme for a lithographic printing plate can be supplied. JP 9-194093 A discloses a method of measuring the curl of a web and device therefor, a curl correcting method and device therefore, and a web cutting device all of which may be used in the present invention.

For the continuous production of an aluminum support, whether each step is carried out in suitable conditions is electrically monitored, whether the conditions of each step are desirable or not is recorded by a tracking unit, and the edge portion of an aluminum web is labeled before the aluminum coil is wound up so that it can be judged later whether a portion after the label is in desired conditions or not, thereby making it possible to judge whether the portion is acceptable or not at the time of cutting and collection.

The aluminum plate treating apparatus used for the above surface roughening treatment preferably maintains the concentration of a solution at a constant value through feedback control and/or feed forward control by measuring at least one of the temperature, specific gravity, conductivity and ultrasonic wave propagation velocity of the solution and obtaining the composition of the solution.

Components contained in the aluminum plate such as aluminum ions dissolve in an acidic aqueous solution contained in the above treating apparatus along with the proceeding of the surface treatment of the aluminum plate. To maintain the concentration of aluminum ion and the concentration of an acid or alkali at constant values, it is preferred that water and an acid, or water and an alkali be added intermittently to keep constant the composition of the solution. The concentration of the acid or alkali added is preferably 10 to 98 wt %.

To control the concentration of the above acid or alkali, for example, the following method is preferred.

A data table is first prepared by measuring the conductivity, specific gravity or ultrasonic wave propagation velocity for each component solution having a predetermined concentration to be used at each temperature. Then, the concentration of a component solution is obtained with reference to the previously prepared data table of the solution to be measured from data on the conductivity, specific gravity or ultrasonic wave propagation velocity of the solution to be measured and temperature data. The method of measuring the above ultrasonic wave propagation velocity at a high accuracy and high stability is disclosed in JP 6-235721 A. The concentration measuring system making use of the above ultrasonic wave propagation velocity is disclosed in JP 58-77656 A. The method of measuring concentration of a multi-component solution with reference to a data table which shows correlation among a plurality of physical quantity data for each solution component is disclosed in JP 4-19559 A.

When the above method of measuring the concentration using the ultrasonic wave propagation velocity is applied to the step of roughening the surface of an aluminum support by combining the conductivity and temperature value of a solution to be measured, process control can be carried out in a real-time accurately, thereby making it possible to produce products of fixed quality and improve yield. When the method of measuring the concentration of a multi-component solution with reference to a prepared data table which shows not only the correlation among temperature, ultrasonic wave propagation velocity and conductivity but also the correlation between temperature and specific gravity, the correlation between temperature and conductivity, or the correlation among temperature, conductivity and specific gravity, etc. in terms of physical quantity at each concentration and each temperature, the same effect as above is obtained.

The concentration of a slurry can also be measured quickly and accurately by obtaining the concentration of the slurry to be measured with reference to a data table previously prepared by measuring specific gravity and temperature.

Since the measurement of the above ultrasonic wave propagation velocity is easily affected by bubbles contained in the solution, it is more preferably carried out in a pipe installed vertically and having a flow of a solution going upward. The measurement of the above ultrasonic wave propagation velocity is preferably carried out at a pipe pressure of 1 to 10 $kg/cm^2$ and the frequency of ultrasonic waves is preferably 0.5 to 3 MHz.

Since the measurement of the above specific gravity, conductivity and ultrasonic wave propagation velocity is easily affected by temperature, it is preferably carried out in a pipe which is kept warm and whose temperature variations are controlled within ±0.3° C. Further, since conductivity and specific gravity or conductivity and ultrasonic wave propagation velocity are preferably measured at the same temperature, they are particularly preferably measured in the same pipe or the same pipe flow. As pressure variations during measurement lead to temperature variations, they are preferably as small as possible. A flow velocity distribution in a pipe to be measured is also as small as possible. Further, as the above measurement is easily affected by a slurry, dirt and bubbles, a solution which has passed through a filter or deaeration device is preferably measured.

An image is formed on the thus obtained lithographic printing original plate according to the present invention by heat. More specifically, an image is preferably directly recorded by a thermal recording head or the like and exposed by scanning with infrared laser light, high-illuminance flash from a xenon discharge lamp and solid high-output infrared laser light from an infrared lamp.

When the recording layer is a so-called heat-sensitive layer of the on-press development type which contains (a) a fine polymer particles having a heat-reactive functional group or (b) microcapsules containing a compound having a heat-reactive functional group, the original forme for a lithographic printing plate according to the present invention can be mounted to a printer without performing a further treatment thereon after exposure to print using an ink and/or a damping solution according to a normal procedure. As described in JP 2938398 B, after the original forme for a lithographic printing plate is mounted on the cylinder of a printer, it may be exposed by a laser mounted to the printer to perform on-press development by applying an ink and/or a damping solution. Since the heat-sensitive layer is removed by the ink and/or damping solution on the printer in this case, a separate development step is not needed and the printer does not need to be stopped for printing after development, thereby making it possible to carry out printing right after development.

That is, as for the plate-making and printing method for a lithographic printing plate according to the present invention, the original forme for a lithographic printing plate having a heat-sensitive layer of the on-press development type is exposed to laser light and directly mounted to the printer for printing, or mounted to a printer, exposed to laser light and then used for printing as it is. As the laser may be used a solid laser or semiconductor laser for irradiating infrared ray having a wavelength of 760 to 1,200 nm.

Even when the original forme for a lithographic printing plate has a heat-sensitive layer of the on-press development type, it can be used for printing after development with a developer which is water or suitable aqueous solution.

When the original forme for a lithographic printing plate of the present invention has a conventional thermal positive type or thermal negative type recording layer, it is exposed, developed with a developer and mounted to a printer for printing in accordance with a commonly used method.

The support of the present invention can be further used in a treatment-free lithographic printing original plate having an image forming layer composed of a water receptive layer which can be hydrophobilized by heat.

Such an original forme has a water receptive layer (image forming layer) which contains microcapsule particles containing thermoplastic polymer fine particles or an ink-receptive substance, including (a) the above-described fine polymer particles having a heat-reactive group or (b) microcapsules containing a compound having a heat-reactive functional group, or fine particles such as hydrophobic resin fine particles dispersed in a matrix such as a hydrophobic resin. When heat is applied to the water receptive layer, the hydrophilic substance contained in the fine particles escape from the fine particles and only a heat-irradiated portion of the surface of the water receptive layer is selectively converted to ink-receptive portion.

Using this surface consisting of an ink-receptive image area and a hydrophilic non-image area composed of an unheat-irradiated hydrophilic matrix as a printing surface, it is possible to perform lithographic printing using a damping solution, which does not require development and is completely treatment-free.

Further, in an infrared laser light scanning exposure recording system, the water receptive layer preferably contains a photo thermal converting agent.

Such a treatment-free lithographic printing original plate can be directly mounted to a printer without development after exposure, or exposed on a printer and used for printing as it is.

Use of the support having a specific thermal conductivity of the present invention makes it possible to form a high-accuracy image on an image area after image formation, improve printing ink-receptivity and print a large number of printing sheets.

Examples of the heat-sensitive original forme for a lithographic printing plate having a water receptive layer which can be hydrophobilized by heat include, for example, original formes having a heat-sensitive layer containing thermoplastic polymer fine particles dispersed in a hydrophilic resin as described in JP 59-174394 A, Research Disclosure No. 33303 issued on January, 1992 and JP 2001-47755 A, a water receptive layer (heat-sensitive layer) containing water self-dispersible hydrophobilized resin particles having a double-layer structure as described in the paragraphs [0057] to [0088] of JP 2001-315453 A, a water receptive layer containing hydrophobilized resin particles having a hydrophilic surface and containing surface hydrophobilized metal fine particles as described in the paragraphs [0021] to [0066] of JP 2002-29165 A, a water receptive layer containing hydrophobilized resin particles including a particular vinyloxy group-containing compound as described in the paragraphs [0008] to [0038] of JP 2002-36745 A, and a water receptive layer containing a hydrophilic polymer having a silanol group and a metal oxide as described in the paragraphs [0033] to [0047] of JP 2002-6504 A.

The contents of the treatment-free lithographic printing original plate according to the present invention are not limited to the above examples. The contents of all the public documents and pending patent applications described in this specification are hereby incorporated into this specification by reference.

EXAMPLES

The following examples are provided for the purpose of further illustrating the present invention but are in no way to be taken as limiting.

[Production Examples of Aluminum Substrates]

Aluminum substrates used in Examples were produced from a 0.24 mm-thick JIS1050-based aluminum plate by carrying out a pre-treatment, surface roughening treatment, hydrophilic film formation and optionally post-treatment in the mentioned order. The surface roughening treatment was carried out in accordance with any one of A to J below, and the hydrophilic film formation and the post-treatment were carried out by the methods described in the Production Examples of Substrates.

<surface roughening treatments A, B and C>

The aluminum plate was immersed in a 1% aqueous solution of sodium hydroxide maintained at 50° C. to carry out a dissolution treatment until the amount of dissolution became 2 $g/m^2$. After rinsing, the aluminum plate was immersed in an aqueous solution having the same composition as an electrolyte used in the subsequent electrochemical surface roughening treatment for 10 seconds to be neutralized, and then rinsed.

This aluminum substrate material was subjected to a plurality of electrochemical surface roughening treatments using a sine wave alternating current with a current density of 50 $A/dm^2$ and a quiescent time therebetween. Table 1 shows the composition of the electrolyte, the amount of electricity for each treatment, the number of electrolytic treatments and the quiescent time. After the electrochemical surface roughening treatments, the aluminum substrate material was immersed in a 1% aqueous solution of sodium hydroxide maintained at 50° C. to dissolve in an alkali until the amount of dissolution became 2 $g/m^2$, rinsed, immersed in a 10% aqueous solution of sulfuric acid maintained at 25° C. for 10 seconds to be neutralized and then rinsed.

TABLE 1

Table 1 Conditions of surface roughening treatments A, B and C

| Type of surface roughening treatment | Composition of electrolyte: Hydrochloric acid (g/l) | Composition of electrolyte: Acetic acid (g/l) | Amount of electricity for each treatment ($C/dm^2$) | Number of electro-lytic treatments | Quiescent time (seconds) |
|---|---|---|---|---|---|
| A | 10 | 0 | 80 | 6 | 1.0 |
| B | 10 | 0 | 40 | 12 | 4.0 |
| C | 10 | 20 | 100 | 2 | 0.8 |

<Surface Roughening Treatment D>

The aluminum plate was immersed in a 10% aqueous solution of sodium hydroxide maintained at 50° C. for 20 seconds to be degreased and etched, washed with running water, neutralized with a 25% aqueous solution of sulfuric acid for 20 seconds and rinsed. Thereafter, the aluminum plate was subjected to an electrolytic surface roughening treatment at 20° C. using a 1% aqueous solution of hydrochloric acid (containing 0.5% of aluminum ions) and trapezoidal rectangular waves having a time (TP) required for the current value to reach a peak from 0 of 2 msec, a frequency of 60 Hz and a duty ratio of 1:1 and carbon electrodes as counter electrodes so that the average current density at the time of aluminum anode became 27 $A/dm^2$ (ratio of current density at the time of aluminum anode to the time of aluminum cathode of 1:0.95) and the amount of quantity of electricity at the time of aluminum anode became 350 $C/dm^2$. Thereafter, the aluminum plate was etched by spraying an aqueous solution containing 26% of sodium hydroxide and 6.5% of aluminum ions at a liquid temperature of 45° C. until the total amount of etching including smuts became 0.7 $g/m^2$. Then, desmutting was carried out by spraying a 25% aqueous solution of nitric acid (containing 0.3% of aluminum ions) at 60° C. for 10 seconds.

<Surface Roughening Treatment E>

The surface of the aluminum plate was roughened using a nylon brush having a bristle diameter of 0.72 mm and a bristle length of 80 mm and a water suspension of pumice powder having an average particle size of about 15 to 35 μm and rinsed well. Thereafter, the aluminum plate was immersed in a 10% aqueous solution of sodium hydroxide at 70° C. for 30 seconds to be etched, washed with running water, neutralized with a 20% aqueous solution of nitric acid and rinsed. Thus, the aluminum plate whose surface had been roughened mechanically was further subjected to the following electrochemical surface roughening treatment.

AC was applied to the aluminum plate whose surface had been roughened mechanically in an aqueous solution of hydrochloric acid having a hydrochloric acid concentration of 7.5 g/l and an aluminum ion concentration of 5 g/l prepared by adding aluminum chloride to hydrochloric acid, using a radial cell shown in FIG. 2, at a liquid temperature of 35° C. to carry out AC electrolysis. Sine waves generated by regulating the current and voltage of commercial AC having a frequency of 60 Hz by means of an induction voltage regulator and a transformer were used as AC. The total amount of electricity when the aluminum plate was an anode was 50 C/dm and Qc/Qa at one cycle of the above AC was 0.95.

The hydrochloric acid concentration and aluminum ion concentration of the above aqueous solution of hydrochloric acid were maintained at constant values by obtaining the relationship among temperature, conductivity, ultrasonic wave propagation velocity, the concentration of hydrochloric acid and the concentration of aluminum ion and by adding a concentrated hydrochloric acid having a concentration of 35% and water to an electrolytic tank from a circulation tank and overflowing an excess of the aqueous solution of hydrochloric acid so that the temperature, conductivity and ultrasonic wave propagation velocity of the aqueous solution of hydrochloric acid became predetermined values. Thereafter, an alkali solution containing 5% of sodium hydroxide and 0.5% of aluminum ion and having a liquid temperature of 45° C. was used as a treating solution to etch the aluminum plate until the dissolution amount of the roughened surface of the aluminum plate became 0.1 $g/m^2$ and the dissolution amount of the opposite surface became 0.05 $g/m^2$.

The both sides of the etched aluminum plate were sprayed with an aqueous solution of sulfuric acid having a sulfuric acid concentration of 300 g/l and an aluminum ion concentration of 5 g/l and a liquid temperature of 50° C. for desmutting.

<Surface Roughening Treatment F>

After the surface roughening treatment A, the following electrolytic surface roughening treatment was further carried out in an aqueous solution of nitric acid.

The aluminum plate was subjected to an electrolytic surface roughening treatment at 50° C. using a 1% solution of nitric acid (containing 0.5% of aluminum ions) and trapezoidal rectangular waves having a time (TP) required for the current value to reach a peak from "0" of 2 msec, a frequency of 60 Hz and a duty ratio of 1:1 and carbon electrodes as counter electrodes so that the average current density at the time of aluminum anode became 27 $A/dm^2$ (ratio of current density at the time of aluminum anode to the time of aluminum cathode of 1:0.95) and the amount of quantity of electricity at the time of aluminum anode became 350 $C/dm^2$, using a radial cell shown in FIG. 2 Thereafter, the aluminum plate was etched by spraying an aqueous solution containing 26% of sodium hydroxide and 6.5% of aluminum ions at a liquid temperature of 45° C. until the total amount of etching including smuts became 0.2 $g/m^2$. Then, desmutting was carried out by spraying a 25% aqueous solution of nitric acid (containing 0.3% of aluminum ions) at 60° C. for 10 seconds.

<Surface Roughening Treatment G>

Out of the surface roughening treatment E, a treatment excluding an electrochemical surface roughening treatment and the subsequent treatments (i.e. a treatment including mechanical surface roughening, alkali etching, neutralization and rinsing) is designated as surface roughening treatment G.

<Surface Roughening Treatment H>

The aluminum plate was immersed in a 1% aqueous solution of sodium hydroxide maintained at 50° C. to carry out a dissolution treatment until the amount of dissolution became 2 $g/m^2$. After rinsing, the aluminum plate was immersed in an aqueous solution having the same composition as an electrolyte used in the subsequent electrochemical surface roughening treatment for 10 seconds to be neutralized, and then rinsed.

This aluminum substrate material was then subjected to electrochemical surface roughening treatments using a 1% aqueous solution of nitric acid (containing 0.5% of aluminum ion) and sine wave AC with a current density of 50

A/dm$^2$ and a quiescent time of 0.5 second each and an electricity amount of 250 C/dm$^2$ for each treatment, totaling 500 C/dm$^2$, and then rinsed. After the electrochemical roughening treatments, the aluminum substrate material was immersed in a 1% aqueous solution of sodium hydroxide maintained at 50° C. to dissolve in an alkali until the amount of dissolution became 5 g/m$^2$, rinsed, immersed in a 10% aqueous solution of sulfuric acid maintained at 25° C. for 10 seconds to be neutralized and then rinsed.

<Surface Roughening Treatment I>

The same surface roughening treatment as the surface roughening treatment H was carried out except that an alkali dissolution treatment was not carried out after the electrochemical surface roughening treatment.

<Surface Roughening Treatment J>

(1) Mechanical Surface Roughening Treatment

A mechanical surface roughening treatment was carried out using a brush roller having rotating nylon brushes while a suspension of silica sand having a specific gravity of 1.12 (abrasive having an average particle size of 25 um) and water was supplied as an abrasive slurry solution to the surface of the aluminum plate by a spray tube.

The nylon brushes used were made from 6,10-nylon and had a bristle length of 50 mm and a bristle diameter of 0.48 mm. The nylon brushes were manufactured by making holes in a stainless cylinder having a diameter of 300 mm and transplanting bristles densely.

Three nylon brushes were used in the brush roller and the interval between two support rollers (diameter of 200 mm) below the brushes was 300 mm.

The above brush roller was pressed against the aluminum plate to ensure that the arithmetical mean roughness ($R_a$) of the roughened aluminum plate became 0.45 μm by controlling the load of a drive motor for rotating the brushes based on the load before the nylon brushes were pressed against the aluminum plate. The rotation direction of the brushes was the same as the moving direction of the aluminum plate. Thereafter, the aluminum plate was rinsed.

The concentration of the abrasive was obtained from temperature and specific gravity with reference to a table prepared based on the relationship among the concentration of the abrasive, temperature and specific gravity, and water and the abrasive were added by feed-back control in order to maintain the concentration of the abrasive at a constant value. Since the surface form of the roughened aluminum plate is changed when the abrasive was ground to reduce its size, an abrasive having a small size was continuously removed to the outside of the system by a cyclone. The particle size of the abrasive was in the range of 1 to 35 um.

(2) Alkali Etching

Alkali etching was carried out by spraying the aluminum plate with an aqueous solution containing 27 wt % of NaOH and 6.5 wt % of aluminum ion and having a liquid temperature of 70° C. with a spray tube. The dissolution amount on the surface of the aluminum plate to be electrochemically roughened later was 8 g/m$^2$ and the dissolution amount on the rear surface thereof was 2 g/m$^2$.

The concentration of an etching solution used for alkali etching was maintained at a constant value by obtaining the concentration of an etching solution from temperature, specific gravity and conductivity with reference to a table prepared on advance based on the relationship among the concentration of NaOH, the concentration of aluminum ion, temperature, specific gravity and the conductivity of the solution and by adding water and a 48 wt % aqueous solution of NaOH by feed-back control. Thereafter, the aluminum plate was rinsed.

(3) Desmutting

The aluminum plate was sprayed with an aqueous solution of nitric acid having a liquid temperature of 35° C. by using a spray to carry out desmutting for 10 seconds. The aqueous solution of nitric acid was waste water overflown from an electrolytic cell used in the subsequent step. Then, spray tubes for spraying a desmutting solution were installed at several locations to prevent the surface of the aluminum plate from being dried until the following step was carried out.

(4) Electrochemical Surface Roughening Treatment

An electrochemical surface roughening treatment was carried out continuously using trapezoidal AC shown in FIG. 1 and two electrolytic cells shown in FIG. 2. The acidic aqueous solution was an aqueous solution of nitric acid having 1 wt % of nitric acid(containing 0.5 wt % of aluminum ion and 0.007 wt % of ammonium ion). The temperature of the solution was 50° C. As for AC, the times TP and TP' required for the current value to reach a peak from "0" were 1 msec and carbon electrodes were used as counter electrodes. The current density at the time of an AC peak was 50 A/dm$^2$ when the aluminum plate was an anode or a cathode. Further, the ratio ($Q_c/Q_a$) of the amount of electricity ($Q_C$) when AC was a cathode to the amount of electricity ($Q_A$) when AC was an anode, duty, frequency and the total amount of electricity at the time of aluminum anode are shown below. Thereafter, the aluminum plate was rinsed by spraying.

Duty: 0.50

Frequency: 60 Hz

Total amount QA of electricity at the time of aluminum anode: 180 C/dm$^2$

Ratio $Q_C/Q_A$ of amount of electricity: 0.95

The control of the concentration of the aqueous solution of nitric acid was carried out by adding 67 wt % nitric acid concentrate solution and water in proportion to the amount of applied electricity and overflowing the same amount of an acidic aqueous solution (nitric acid aqueous solution) as the total volume of nitric acid and water added from the electrolytic cell continuously to discharge it to the outside of the electrolytic cell. With reference to a table prepared based on the relationship among the concentration of nitric acid, the concentration of aluminum ion, temperature, the conductivity of the solution and the ultrasonic wave propagation velocity of the solution, the concentration of the nitric acid aqueous solution was obtained from the temperature, conductivity and ultrasonic wave propagation velocity of the nitric acid aqueous solution to perform controlling so as to adjust the adding amounts of nitric acid concentrate solution and water continuously in order to maintain the concentration at a constant value.

(5) Alkali Etching

Alkali etching was carried out by spraying the aluminum plate with an aqueous solution containing 26 wt % of NaOH and 6.5 wt % of aluminum ion and having a liquid temperature of 45° C., by using a spray tube. The dissolution amount of the aluminum plate was 1 g/m$^2$. The concentration of an etching solution was maintained at a constant value by obtaining the concentration of an etching solution from temperature, specific gravity and conductivity with reference to a table prepared on advance based on the relationship among the concentration of NaOH, the concentration of aluminum ion, temperature, specific gravity and the conductivity of the solution and by adding water and a 48 wt % aqueous solution of NaOH by feed-back control. Thereafter, the aluminum plate was rinsed.

(6) Acid Etching:

Sulfuric acid (sulfuric acid concentration: 300 g/l, aluminum ion concentration: 15 g/l) was used as an acid etching solution and sprayed onto the aluminum plate from a spray tube at 80° C. for 8 seconds to carry out acid etching. The concentration of the acid etching solution was maintained at a constant value by obtaining the concentration of the acid etching solution from temperature, specific gravity and conductivity with a reference to a table prepared in advance based on the relationship among the concentration of sulfuric acid, the concentration of aluminum ion, temperature, specific gravity and the conductivity of the solution and by adding water and 50 wt % of sulfuric acid by feed-back control. Thereafter, the aluminum plate was rinsed.

<Production of Substrates 1 to 6 and 20>

The surface roughened substrates A to F and J were anodized by an anodizing device at a sulfuric acid concentration of 170 g/l (containing 0.5% of aluminum ion), a liquid temperature of 40° C. and a current density of 30 A/$dm^2$ for 20 seconds and rinsed. Thereafter, they were immersed in an aqueous solution of sodium hydroxide having a pH of 13 and a temperature of 30° C. for 70 seconds and rinsed. They were then immersed in a 1% aqueous solution of colloidal silica (Snowtex ST-N of Nissan Chemical Industries, Ltd., having a particle size of about 20 nm) at 70° C. for 14 seconds and rinsed. Subsequently, they were immersed in a 2.5% aqueous solution of No. 3 sodium silicate at 70° C. for 14 seconds and rinsed to produce substrates 1 to 6 and 20.

<Production Of Substrate 7>

The aluminum plate which had been subjected to a surface roughening treatment E was anodized in a 50 g/l solution of oxalic acid at 30° C. and at a current density of 12 A/$dm^2$ for 2 minutes and rinsed to form a 4 g/$m^2$ anodized film. Thereafter, the aluminum plate was immersed in an aqueous solution of sodium hydroxide having a pH of 13 and a temperature of 50° C. for 2 minutes and rinsed. It was then immersed in a 2.5% aqueous solution of No. 3 sodium silicate at 70° C. for 14 seconds and rinsed to produce a substrate 7.

<Production of Substrate 8>

The aluminum plate which had been subjected to a surface roughening treatment E was anodized at a sulfuric acid concentration of 170 g/l (containing 0.5% of aluminum ion), a solution temperature of 30° C. and a current density of 5 A/$dm^2$ for 70 seconds and rinsed. Thereafter, the aluminum plate was immersed in an aqueous solution of sodium hydroxide having a pH of 13 and a temperature of 30° C. for 30 seconds and rinsed. It was then treated with sodium silicate in the same manner as in Production Example 7 and rinsed to produce a substrate 8.

<Production of Substrates 9 to 13>

Substrates 9 to 13 were produced in the same manner as in Production Example 5 except that the anodic oxidation time of Production Example 5 (substrate 5) in which the substrate which had been subjected to a surface roughening treatment E was used was changed to 12 seconds, 16 seconds, 24 seconds, 44 seconds and 90 seconds, respectively.

<Production of Substrate 14>

A substrate 14 was produced in the same manner as in Production Example 5 of substrate 5 except that immersion in an aqueous solution of colloidal silica was not carried out.

<Production of Substrate 15>

A substrate which had been subjected to a surface roughening treatment E was anodized using an electrolyte having a sulfuric acid concentration of 100 g/l and an aluminum ion concentration of 5 g/l at a solution temperature of 51° C. and a current density of 30 A/$dm^2$ and rinsed to form a 2 g/$m^2$ anodized film. Thereafter, it was anodized using an electrolyte having a sulfuric acid concentration of 170 g/l and an aluminum ion concentration of 5 g/l at a solution temperature of 40° C. and a current density of 30 A/$dm^2$ so that a total amount of an anodized film becomes 4.0 g/$m^2$ and rinsed to form an anodized film. It was then immersed in a 2.5% aqueous solution of No. 3 sodium silicate at a solution temperature of 70° C. for 14 seconds and rinsed to produce a substrate 15.

<Production of Substrate 16>

A substrate which had been subjected to a surface roughening treatment E was anodized using an electrolyte having a sulfuric acid concentration of 170 g/l and an aluminum ion concentration of 5 g/l at a solution temperature of 43° C. and a current density of 30 A/$dm^2$ and rinsed to form a 2 g/$m^2$ anodized film. Thereafter, it was anodized using an electrolyte having a phosphoric acid concentration of 170 g/l and an aluminum ion concentration of 5 g/l at a solution temperature of 40° C. and a current density of 18 A/$dm^2$ and rinsed. It was then immersed in a 2.5% aqueous solution of No. 3 sodium silicate at a solution temperature of 70° C. for 14 seconds and rinsed to produce a substrate 16.

<Production of Substrates 17 to 19>

Substrates 17 to 19 were produced in the same manner as in Production Example 14 except that substrate which had been subjected to surface roughening treatments G, H and I were used in place of the surface roughened substrate of Production Example 14 (substrate 14), respectively.

Production of comparative substrate (Comparative Example 1)

A comparative substrate 1 was produced in the same manner as in Production Example 7 except that the treatment time with sodium hydroxide in Production Example 7 (substrate 7) was changed to 3 minutes.

Production of Comparative Substrate (Comparative Example 2)

A substrate which had been subjected to a surface roughening treatment A was anodized using an electrolyte having a sulfuric acid concentration of 200 g/l and an aluminum ion concentration of 5 g/l at a solution temperature of 45° C., a voltage of about 10 V and a current density of 1.5 A/$dm^2$ for about 300 seconds to form a 3 g/$m^2$ anodized film and rinsed. Thereafter, it was post-treated with an aqueous solution of sodium bicarbonate having a concentration of 20 g/l at a solution temperature of 40° C. for 30 seconds, rinsed with 20° C. water for 120 seconds and dried. The obtained substrate was immersed in a 5% aqueous solution of citric acid for 60 seconds, rinsed and dried at 40° C. to produce a comparative substrate 2.

The shapes of the roughened surfaces and the physical property values of the hydrophilic films of the aluminum substrates obtained in the above production examples are shown in Table 2. The methods for measuring each of the physical property values are as follows. The method of measuring density is described above.

<Methods of Measuring the Average Opening Diameter of Large Undulations, the Average Opening Diameter of Small Pits, the Ratio of Average Depth of Small Pits to Average Opening Diameter of Small Pits>

The above values were measured by taking a SEM photomicrograph of the surface of an aluminum substrate. The average opening diameter $d_2$ (μm) of large undulations was obtained by measuring the long diameter and short diameter of each undulation whose outline could be clearly recognized from a 1000× SEM photomicrograph, averaging the measurement values as the opening diameter of each undulation and dividing the total of opening diameters of large undulations measured in the SEM photomicrograph by the number of measured large undulations (50). SEM was the T-20 of JEOL Ltd.

The average opening diameter $d_1$ (μm) of small pits was measured by the same technique as used for measuring the opening diameters of large undulations using a 30000× SEM photomicrograph. SEM used in this case was the S-900 of Hitachi, Ltd.

The ratio $h/d_1$ of the average depth h (μm) of small pits to the average opening diameter $d_1$ (μm) of small pits was obtained by averaging 50 measurement values obtained by using a 30000× SEM photomicrograph of the section of each pit.

<Method of Measuring Thermal Conductivity in Film Thickness Direction of Hydrophilic Film>

First, two aluminum substrates which differed only in the thickness of a hydrophilic film from each of the aluminum substrates 1 to 20 of the present invention and the comparative substrates 1 and 2 were prepared in addition to the aluminum substrates 1 to 20 of the present invention and the comparative substrates 1 and 2. The aluminum substrates that differed only in the film thickness were produced in the same manner as the aluminum substrates shown in production examples except that the anodizing time was 0.5 time and 2 times the anodizing time of each of the aluminum substrates 1 to 20 of the present invention and the comparative substrates 1 and 2.

Three different aluminum substrates which differed in film thickness were provided for measurement using a device shown in FIG. 3 to calculate thermal conductivity in the thickness direction of the hydrophilic film from the above equation (1). The measurement was made at different 5 points on each sample and the average value of the measurement data was used.

As for the thickness of the hydrophilic film, the cross section of the hydrophilic film was observed through the T-20 SEM of JEOL Ltd., the actual film thicknesses at 50 locations were measured, and the average value of the measurement data was used.

<Method of Measuring Pore Diameter of Micropores in Anodic Oxide Film>

As for the pore diameter of micropores in the anodized film, the diameters of pores in the surface layer and the diameters of pores at a depth of 0.4 μm from the surface layer were measured. The surface of the anodized film was observed in the case of the diameters of pores in the surface layer and the side surface of a cracked portion generated by bending the anodized aluminum substrate was observed through a super high-resolution SEM (S-900 of Hitachi, Ltd.) in the case of the diameters of pores at a depth of 0.4 um from the surface layer. Observation was carried out at a relatively low acceleration voltage of 12 V and a magnification of 150,000X without an evaporation treatment for imparting conductivity. The average value of the measurement data of 50 pores selected at random was used for both diameters. The standard deviation was ±10% or less for both diameters.

<Method of Measuring Porosity>

The porosity of the anodized film was obtained from the following equation.

$$\text{Porosity }(\%)=\{1-(\text{density of anodized film}/3.98)\}\times 100$$

wherein 3.98 is the density of aluminum oxide according to Kagaku Binran.

TABLE 2

Production conditions and characteristic properties of aluminum substrate

| Substrate No | Surface roughening treatment | Electrochemical surface roughening electrolyte | Large undulations (μm) | Average opening diameter of small pits (μm) | Ratio of depth to diameter of pits | Anodization Electrolyte | Anodization Coating amount ($g/m^2$) |
|---|---|---|---|---|---|---|---|
| 1 | A | Hydrochloric acid | 4.8 | 0.6 | 0.15 | Sulfuric acid | 5.0 |
| 2 | B | Hydrochloric acid | 3.5 | 0.6 | 0.18 | Sulfuric acid | 5.0 |
| 3 | C | Hydrochloric acid + Acetic acid | 5.0 | 0.8 | 0.20 | Sulfuric acid | 5.0 |
| 4 | D | Hydrochloric acid | 4.5 | 0.3 | 0.25 | Sulfuric acid | 5.0 |
| 5 | E | Hydrochloric acid | 17 | 0.05 | 0.20 | Sulfuric acid | 5.0 |
| 6 | F | Hydrochloric acid → Nitric acid | 4.8 | 2.8 | 0.50 | Sulfuric acid | 5.0 |
| 7 | E | Hydrochloric acid | 17 | 0.05 | 0.20 | Oxialic acid | 4.0 |
| 8 | E | Hydrochloric acid | 17 | 0.05 | 0.20 | Sulfuric acid | 4.0 |
| 9 | E | Hydrochloric acid | 17 | 0.05 | 0.20 | Sulfuric acid | 3.2 |
| 10 | E | Hydrochloric acid | 17 | 0.05 | 0.20 | Sulfuric acid | 4.0 |
| 11 | E | Hydrochloric acid | 17 | 0.05 | 0.20 | Sulfuric acid | 6.0 |
| 12 | E | Hydrochloric acid | 17 | 0.05 | 0.20 | Sulfuric acid | 10.0 |
| 13 | E | Hydrochloric acid | 17 | 0.05 | 0.20 | Sulfuric acid | 20.0 |

TABLE 2-continued

| Production conditions and characteristic properties of aluminum substrate | | | | | | | |
|---|---|---|---|---|---|---|---|
| 14 | E | Hydrochloric acid | 17 | 0.05 | 0.20 | Sulfuric acid | 5.0 |
| 15 | E | Hydrochloric acid | 17 | 0.05 | 0.20 | Sulfuric acid → Sulfuric acid | 4.0 |
| 16 | E | Hydrochloric acid | 17 | 0.05 | 0.20 | Sulfuric acid → Phosphoric acid | 4.0 |
| 17 | G | None | 17 | None | None | Sulfuric acid | 4.0 |
| 18 | H | Nitric acid | None | 3.4 | 0.18 | Sulfuric acid | 4.0 |
| 19 | I | Nitric acid | None | 2.1 | 0.60 | Sulfuric acid | 4.0 |
| 20 | J | Nitric acid | 10 | 1.4 | 0.15 | Sulfuric acid | 5.0 |
| Comparative example 1 | E | Hydrochloric acid | 17 | 0.1 | 0.20 | Sulfuric acid | 4.0 |
| Comparative example 2 | A | Hydrochloric acid | 4.8 | 0.6 | 0.15 | Sulfuric acid | 3.0 |

| | | | | Pore diameter (nm) | | | |
|---|---|---|---|---|---|---|---|
| Substrate No | Thermal conductivity (W/mK) | Density ($kg/m^3$) | Porosity (%) | Surface layer | 0.4 μm from surface layer | Sealing | Thickness of hydrophilic film (μm) |
| 1 | 0.4 | 2000 | 50 | 0 | 30 | Yes | 2.5 |
| 2 | 0.4 | 2000 | 50 | 0 | 30 | Yes | 2.5 |
| 3 | 0.4 | 2000 | 50 | 0 | 30 | Yes | 2.5 |
| 4 | 0.4 | 2000 | 50 | 0 | 30 | Yes | 2.5 |
| 5 | 0.4 | 2000 | 50 | 0 | 30 | Yes | 2.5 |
| 6 | 0.4 | 2000 | 50 | 0 | 30 | Yes | 2.5 |
| 7 | 0.05 | 1050 | 70 | 40 | 50 | No | 3.8 |
| 8 | 0.5 | 3150 | 20 | 20 | 20 | No | 1.3 |
| 9 | 0.4 | 2000 | 50 | 0 | 24 | Yes | 1.6 |
| 10 | 0.4 | 2000 | 50 | 0 | 27 | Yes | 2.0 |
| 11 | 0.4 | 2000 | 50 | 0 | 32 | Yes | 3.0 |
| 12 | 0.4 | 1800 | 55 | 0 | 35 | Yes | 5.6 |
| 13 | 0.4 | 1600 | 60 | 0 | 38 | Yes | 12.5 |
| 14 | 0.4 | 2000 | 50 | 20 | 30 | No | 2.5 |
| 15 | 0.4 | 3000 | 25 | 10 | 20 | No | 1.3 |
| 16 | 0.3 | 2500 | 40 | 15 | 200 | No | 1.6 |
| 17 | 0.4 | 2000 | 50 | 30 | 30 | No | 2.0 |
| 18 | 0.4 | 2000 | 50 | 30 | 30 | No | 2.0 |
| 19 | 0.4 | 2000 | 50 | 30 | 30 | No | 2.0 |
| 20 | 0.4 | 2000 | 50 | 0 | 30 | Yes | 2.5 |
| Comparative example 1 | 0.03 | 800 | 80 | 50 | 60 | No | 5.0 |
| Comparative example 2 | 0.7 | 3400 | 15 | 7 | 10 | No | 0.9 |

Production Example 1 of Polymer Fine Particles (Thermoplastic Polymer Fine Particles)

15.0 g of styrene and 20 ml of an aqueous solution (concentration of $1.48\times10^{-2}$ mol/l) of polyoxyethylene nonylphenyl ether (average number of mols of ethylene oxide added of 10) were added and stirred at 250 rpm and the inside of the system was substituted by nitrogen gas. After this solution was made to be at 25° C., 10 ml of an aqueous solution (concentration of $0.984\times10^{-3}$ mol/l) of a cerium (IV) ammonium salt was added. An aqueous solution of ammonium nitrate (concentration of $58.8\times10^{-3}$ mol/l) was added to adjust pH to 1.3 to 1.4. Thereafter, the solution was stirred for 8 hours. The solids concentration of the thus obtained polystyrene fine particle dispersion was 6.7% and the average particle size of the polystyrene fine particles was 0.1 μm.

Production Example 2 of Polymer Fine Particles (Light-Heat Converting Agent/Color Coupler Incorporating Fine Particles)

7.5 g of polystyrene (weight average molecular weight of 10,000), 1.5 g of an infrared-absorbing dye (IR-24), 0.2 g of the Pergascript Blue SRB leuco dye (of Ciba Geigy Co., Ltd.), 0.1 g of 4-(p-N-(p-hydroxybenzoyl)aminophenyl)2,6-bis(trichloro)-s-triazine and 0.1 g of an anionic surfactant (Pionin A41C of Takemoto Oil & Fat Co., Ltd.) were dissolved in 12.0 g of ethyl acetate and 6.0 g of methyl ethyl ketone as an oil phase component. A solution obtained by adding 9.6 g of pure water to 25. 4 g of a 4% aqueous solution of polyvinyl alcohol (PVA205 of Kuraray Co., Ltd.) was prepared as a water phase component. The oil phase component and the water phase component were mixed together and emulsified by a homogenizer at 15,000 rpm. Thereafter, 20 g of water was added and stirred at room temperature for 30 minuets and at 40° C. for 3 hours to evaporate ethyl acetate. The solids concentration of the thus obtained polymer fine particles was 15.0% and the average particle size thereof was 0.20 μm.

Production Example 3 of Polymer Fine Particles (Polymer Fine Particles Having a Heat-Reactive Group)

A fine particle dispersion having a heat-reactive group was obtained in the same manner as in Production Example 1 of polymer fine particles except that 15.0 g of styrene of Production Example 1 of polymer fine particles was changed to 7.5 g of glycidyl methacrylate and 7.5 g of butyl methacrylate. The solids concentration of this solution was 6.7% and the average particle size of the fine particles was 0.08 µm.

Production Example 1 of Microcapsule (Color Coupler Incorporating Microcapsules)

40 g of the Takenate D-110N (an ethyl acetate solution of polisocyanate manufactured by Takeda Chemical Industries, Ltd.), 10 g of trimethylolpropane diacrylate, 10 g of a copolymer (molar ratio of 7/3, weight average molecular weight of 20,000) of allyl methacrylate and butyl methacrylate, 0.2 g of the Pergascript Blue SRB leuco dye (of Ciba Geigy Co., Ltd.), 0.1 g of a triazine compound structural (formula 1) and 0.1 g of Pionin A41C (of Takemoto Oil & Fat Co., Ltd.) were dissolved in 40 g of ethyl acetate and 20 g of acetonitrile as an oil phase component. 120 g of a 4% aqueous solution of PVA205 (of Kuraray Co., Ltd.) was prepared as a water phase component. The oil phase component and the water phase component were emulsified by a homogenizer at 15,000 rpm. Thereafter, 40 g of water was added and stirred at room temperature for 30 minutes and at 40° C. for 3 hours to evaporate ethyl acetate. The solids concentration of the thus obtained microcapsule dispersion was 30% and the average particle size of the microcapsules was 0.20 µm.

Production Example 2 of Microcapsules (Light-Heat Converting Agent Incorporating Microcapsules)

Microcapsules were produced in the same manner as in Production Example 1 of microcapsules except that 4.0 g of a light-heat converting agent (IR-24 dye described in this specification) was added to the oil component in Production Example 1 of microcapsules. The solids concentration of the thus obtained microcapsule dispersion was 30% and the average particle size of the microcapsules was 0.20 µm.

Production Example 4 of Water Self-Dispersible Hydrophobilized Resin Fine Particles (Synthesis of Acrylic Polymer Fine Particles)

400 g of methyl ethyl ketone was fed to a 1-liter four-necked flask equipped with a stirrer, reflux unit, nitrogen feed pipe, dropping unit and thermometer and heated up to 80° C. A solution prepared by mixing together 80 g of styrene, 300 g of methyl methacrylate, 24.5 g of methacrylic acid and 8 g of 2,2'-azobis(isobutyric acid)dimethyl (V-601, polymerization initiator of Wako Pure Chemical Industries, Ltd.) well was added dropwise to the flask in 2 hours. After 8 hours of agitation, 0.5 g of V-601 was added and further stirred for 8 hours to obtain an acrylic polymer having a dry solids ratio of 50%, an acid value of 39.2 and a number average molecular weight of 20,000. 100 g of the above acrylic polymer solution was neutralized with 2.71 g of triethylamine and water was added dropwise to the solution while being stirred. The viscosity of the solution increased gradually and greatly reduced after about 150 g of water was added dropwise to complete phase inversion. After 150 g of water was further added, the obtained dispersion was heated up to 40° C. to remove an organic solvent and an excess of water under reduced pressure so as to obtain a water dispersion of acrylic polymer fine particles having a dry solids ratio of 33.7% and an average particle size of 0.12 pm.

Examples 1 to 16 and Comparative Examples 1 and 2

An image recording layer coating solution 1 having the following composition was applied onto the aluminum substrate shown in Table 3 so that a dry coating amount becomes 0.8 g/m$^2$ and it was dried in an oven at 60° C. for 150 seconds.

| (image recording layer coating solution 1) | |
|---|---|
| polymer fine particles of Production Example 1 in terms of solid content | 5 g |
| polyacrylic acid (weight average molecular weight of 25,000) | 0.5 g |
| light-heat converting agent (IR-11 in this specification) | 0.3 g |
| water | 100 g |

The thus obtained lithographic printing original plate that affords on-press development was exposed by using the Trendsetter 3244 VFS at a outer drum revolution of 210 rpm, a plate surface energy of 200 mJ/cm$^2$ and a resolution of 2,400 dpi, the plate was attached to the plate cylinder of the SOR-M printer of Hidelberg Co., Ltd. without a development, and after supplying a damping solution, ink and then paper were fed to execute the printing. On-press development and printing were possible with all the printing plates without a problem and the printing results obtained with the printing plates are shown in Table 3.

<Evaluation of Lithographic Printing Plate>

(1) The term "the number of sheets printed until complete on-press development" refers to the number of paper sheets printed until a complete on-press development was attained, which indicates the difficulty of the on-press development.

(2) stain-resistance after non-usage period

The term "the number of sheets printed until stain-free printing" refers to the number of paper sheets printed until a clean, stain-free sheet is obtained upon resuming the printing after stopping the printer upon printing 10,000 sheets and leaving the printer at room temperature for 1 hour, with the printing plate being kept attached to the plate cylinder as it is. It indicates a stain resistance of the printing plate.

TABLE 3

Table 3 Printing results of Examples 1 to 20 and Comparative Examples 1 and 2

| | Used substrate | Number of printed sheets (unit: 10,000 sheets) | Number of sheets printed until complete on-press development | Number of sheets printed until stain-free printing |
|---|---|---|---|---|
| Example 1 | 1 | 1.3 | 20 | 25 |
| Example 2 | 2 | 1.3 | 20 | 25 |
| Example 3 | 3 | 1.3 | 20 | 25 |
| Example 4 | 4 | 1.3 | 20 | 25 |
| Example 5 | 5 | 1.5 | 20 | 25 |
| Example 6 | 6 | 1.3 | 20 | 25 |
| Example 7 | 7 | 1.9 | 30 | 40 |
| Example 8 | 8 | 1.2 | 25 | 30 |
| Example 9 | 9 | 1.4 | 20 | 25 |
| Example 10 | 10 | 1.5 | 20 | 25 |
| Example 11 | 11 | 1.5 | 20 | 25 |

TABLE 3-continued

Table 3 Printing results of Examples 1 to 20 and Comparative Examples 1 and 2

| | Used substrate | Number of printed sheets (unit: 10,000 sheets) | Number of sheets printed until complete on-press development | Number of sheets printed until stain-free printing |
|---|---|---|---|---|
| Example 12 | 12 | 1.8 | 20 | 25 |
| Example 13 | 13 | 2.0 | 20 | 25 |
| Example 14 | 14 | 1.5 | 20 | 40 |
| Example 15 | 15 | 1.4 | 20 | 25 |
| Example 16 | 16 | 1.3 | 20 | 30 |
| Example 17 | 17 | 1.2 | 20 | 25 |
| Example 18 | 18 | 1.3 | 20 | 25 |
| Example 19 | 16 | 1.8 | 20 | 25 |
| Example 20 | 20 | 1.2 | 20 | 25 |
| Comparative Example 1 | Comparative Example 1 | 2.5 | 70 | 130 |
| Comparative Example 2 | Comparative Example 2 | 0.2 | 20 | 30 |

Examples 21 to 40 and Comparative Examples 3 and 4

An image recording layer coating solution 2 having the following composition was applied onto the aluminum substrate shown in Table 4 so that a dry coating amount becomes 0.8 $g/m^2$ and it was dried in an oven at 60° C. for 150 seconds. Then, the thus obtained original forme for a lithographic printing plate was exposed and used for printing in the same manner as in Example 1 and the obtained printing results are shown in Table 4.

| (image recording layer coating solution 2) | |
|---|---|
| polymer fine particles of Production Example 2 in terms of solid content | 5 g |
| water | 100 g |

TABLE 4

Table 4 Printing results of Examples 21 to 40 and Comparative Examples 3 and 4

| | Used substrate | Number of printed sheets (unit: 10,000 sheets) | Number of sheets printed until complete on-press development | Number of sheets printed until stain-free printing |
|---|---|---|---|---|
| Example 21 | 1 | 1.5 | 25 | 40 |
| Example 22 | 2 | 1.5 | 25 | 40 |
| Example 23 | 3 | 1.5 | 25 | 40 |
| Example 24 | 4 | 1.5 | 25 | 40 |
| Example 25 | 5 | 2.0 | 25 | 40 |
| Example 26 | 6 | 1.4 | 25 | 40 |
| Example 27 | 7 | 2.5 | 35 | 60 |
| Example 28 | 8 | 1.3 | 30 | 50 |
| Example 29 | 9 | 1.7 | 25 | 40 |
| Example 30 | 10 | 1.9 | 25 | 40 |
| Example 31 | 11 | 2.0 | 25 | 40 |
| Example 32 | 12 | 2.2 | 25 | 40 |
| Example 33 | 13 | 2.6 | 25 | 40 |
| Example 34 | 14 | 2.0 | 40 | 45 |
| Example 35 | 15 | 1.8 | 25 | 40 |

TABLE 4-continued

Table 4 Printing results of Examples 21 to 40 and Comparative Examples 3 and 4

| | Used substrate | Number of printed sheets (unit: 10,000 sheets) | Number of sheets printed until complete on-press development | Number of sheets printed until stain-free printing |
|---|---|---|---|---|
| Example 36 | 16 | 1.6 | 30 | 45 |
| Example 37 | 17 | 1.4 | 25 | 40 |
| Example 38 | 18 | 1.4 | 25 | 40 |
| Example 39 | 16 | 1.8 | 25 | 40 |
| Example 40 | 20 | 1.4 | 25 | 40 |
| Comparative Example 3 | Comparative Example 1 | 2.5 | 120 | 100 |
| Comparative Example 4 | Comparative Example 2 | 0.2 | 25 | 40 |

Examples 41 to 60 and Comparative Examples 5 and 6

An image recording layer coating solution 3 having the following composition was applied onto the aluminum substrate shown in Table 5 so that a dry coating amount becomes 0.8 $g/m^2$ and it was dried in an oven at 60° C. for 150 seconds. Then, the thus obtained original forme for a lithographic printing plate was exposed and used for printing in the same manner as in Example 1 and the obtained printing results are shown in Table 5.

| (image recording layer coating solution 3) | |
|---|---|
| polymer fine particles in Production Example 3 in terms of solid content | 5 g |
| polyacrylic acid (weight average molecular weight of 25,000) | 0.5 g |
| light-heat converting agent (IR-11 in this specification) | 0.3 g |
| water | 100 g |

TABLE 5

Table 5 Printing results of Examples 41 to 60 and Comparative Examples 5 and 6

| | Used substrate | Number of printed sheets (unit: 10,000 sheets) | Number of sheets printed until complete on-press development | Number of sheets printed until stain-free printing |
|---|---|---|---|---|
| Example 41 | 1 | 2.0 | 20 | 30 |
| Example 42 | 2 | 2.0 | 20 | 30 |
| Example 43 | 3 | 2.0 | 22 | 30 |
| Example 44 | 4 | 2.0 | 20 | 30 |
| Example 45 | 5 | 2.5 | 23 | 30 |
| Example 46 | 6 | 1.8 | 20 | 30 |
| Example 47 | 7 | 3.0 | 30 | 40 |
| Example 48 | 8 | 1.5 | 25 | 35 |
| Example 49 | 9 | 2.2 | 20 | 30 |
| Example 50 | 10 | 2.4 | 20 | 30 |
| Example 51 | 11 | 2.5 | 20 | 30 |
| Example 52 | 12 | 2.8 | 20 | 30 |
| Example 53 | 13 | 3.0 | 20 | 30 |
| Example 54 | 14 | 2.5 | 20 | 37 |
| Example 55 | 15 | 2.0 | 20 | 30 |

TABLE 5-continued

Table 5 Printing results of Examples 41 to 60 and Comparative Examples 5 and 6

| | Used substrate | Number of printed sheets (unit: 10,000 sheets) | Number of sheets printed until complete on-press development | Number of sheets printed until stain-free printing |
|---|---|---|---|---|
| Example 56 | 16 | 2.0 | 20 | 33 |
| Example 57 | 17 | 1.4 | 25 | 30 |
| Example 58 | 18 | 1.4 | 20 | 30 |
| Example 59 | 16 | 2.5 | 25 | 40 |
| Example 60 | 20 | 1.4 | 25 | 30 |
| Comparative Example 5 | Comparative Example 1 | 3.0 | 70 | 70 |
| Comparative Example 6 | Comparative Example 2 | 0.5 | 20 | 30 |

Examples 61 to 80 and Comparative Examples 7 and 8

The following image recording layer coating solution 4 containing the microcapsules was used to form an image recording layer on the substrates shown in Table 6. The image recording layer was dried in an oven at 100° C. for 60 seconds and the dry coating amount was 0.7 g/m$^2$.

| (image recording layer coating solution 4) | |
|---|---|
| microcapsules in Production Example 1 in terms of solid content | 5 g |
| trimethylolpropane triacrylate | 3 g |
| infrared-absorbing dye (IR-11 in this specification) | 0.3 g |
| water | 60 g |
| 1-methoxy-2-propanol | 40 g |

The thus obtained original forme for a lithographic printing plate was exposed by the Luxel T-9000CTP equipped with a multi-channel laser head of Fuji Photo Film Co., Ltd. at an output per beam of 250 mW, an outer drum revolution of 800 rpm and a resolution of 2,400 dpi. Printing was carried out in the same manner as in Example 1 and the printing results are shown in Table 6.

TABLE 6

Table 6 Printing results of Examples 61 to 80 and Comparative Examples 7 and 8

| | Used substrate | Number of printed sheets (unit: 10,000 sheets) | Number of sheets printed until complete on-press development | Number of sheets printed until stain-free printing |
|---|---|---|---|---|
| Example 61 | 1 | 1.6 | 20 | 23 |
| Example 62 | 2 | 1.5 | 20 | 24 |
| Example 63 | 3 | 1.6 | 20 | 25 |
| Example 64 | 4 | 1.6 | 20 | 23 |
| Example 65 | 5 | 2.0 | 23 | 25 |
| Example 66 | 6 | 1.3 | 20 | 25 |
| Example 67 | 7 | 2.5 | 30 | 40 |
| Example 68 | 8 | 1.2 | 25 | 30 |
| Example 69 | 9 | 1.8 | 20 | 25 |
| Example 70 | 10 | 2.0 | 18 | 26 |

TABLE 6-continued

Table 6 Printing results of Examples 61 to 80 and Comparative Examples 7 and 8

| | Used substrate | Number of printed sheets (unit: 10,000 sheets) | Number of sheets printed until complete on-press development | Number of sheets printed until stain-free printing |
|---|---|---|---|---|
| Example 71 | 11 | 2.0 | 20 | 25 |
| Example 72 | 12 | 2.2 | 19 | 26 |
| Example 73 | 13 | 2.6 | 20 | 26 |
| Example 74 | 14 | 2.0 | 20 | 44 |
| Example 75 | 15 | 1.8 | 21 | 25 |
| Example 76 | 16 | 1.6 | 20 | 30 |
| Example 77 | 17 | 1.6 | 20 | 20 |
| Example 78 | 18 | 1.5 | 20 | 25 |
| Example 79 | 16 | 1.8 | 30 | 40 |
| Example 80 | 20 | 1.5 | 20 | 30 |
| Comparative Example 7 | Comparative Example 1 | 2.5 | 80 | 130 |
| Comparative Example 8 | Comparative Example 2 | 0.2 | 20 | 30 |

Examples 81 to 100 and Comparative Examples 9 and 10

The following image recording layer coating solution 5 containing the microcapsules obtained in Production Example 2 of microcapsules was used to form an image recording layer on the substrates shown in Table 7. The image recording layer was dried in an oven at 100° C. for 60 seconds and the dry coating amount was 0.7 g/m$^2$. The thus obtained original forme for a lithographic printing plate was exposed in the same manner as in Example 1 and used for printing. The printing results are shown in Table 7.

| (image recording layer coating solution 5) | |
|---|---|
| microcapsules in Production Example 2 in terms of solid content | 5 g |
| water | 60 g |

TABLE 7

Table 7 Printing results of Examples 81 to 100 and Comparative Examples 9 and 10

| | Used substrate | Number of printed sheets (unit: 10,000 sheets) | Number of sheets printed until complete on-press development | Number of sheets printed until stain-free printing |
|---|---|---|---|---|
| Example 81 | 1 | 2.5 | 20 | 30 |
| Example 82 | 2 | 2.5 | 20 | 30 |
| Example 83 | 3 | 2.5 | 22 | 30 |
| Example 84 | 4 | 2.5 | 20 | 30 |
| Example 85 | 5 | 3.0 | 23 | 30 |
| Example 86 | 6 | 2.2 | 20 | 30 |
| Example 87 | 7 | 3.5 | 30 | 40 |
| Example 88 | 8 | 2.0 | 25 | 35 |
| Example 89 | 9 | 2.7 | 20 | 30 |
| Example 90 | 10 | 2.9 | 18 | 30 |
| Example 91 | 11 | 3.0 | 20 | 30 |
| Example 92 | 12 | 3.3 | 20 | 30 |
| Example 93 | 13 | 3.5 | 20 | 30 |

TABLE 7-continued

| Table 7 Printing results of Examples 81 to 100 and Comparative Examples 9 and 10 | Used substrate | Number of printed sheets (unit: 10,000 sheets) | Number of sheets printed until complete on-press development | Number of sheets printed until stain-free printing |
|---|---|---|---|---|
| Example 94 | 14 | 3.0 | 20 | 37 |
| Example 95 | 15 | 2.5 | 20 | 30 |
| Example 96 | 16 | 2.5 | 20 | 33 |
| Example 97 | 17 | 2.5 | 20 | 35 |
| Example 98 | 18 | 3.0 | 20 | 30 |
| Example 99 | 16 | 3.0 | 20 | 35 |
| Example 100 | 20 | 2.5 | 20 | 30 |
| Comparative Example 9 | Comparative Example 1 | 3.4 | 70 | 70 |
| Comparative Example 10 | Comparative Example 2 | 0.5 | 20 | 30 |

Examples 101 to 120 (Thermal Positive Type Image Recording Layer) and Comparative Examples 11 and 12

An undercoating solution having the following composition was applied to the substrates (supports) shown in Table 8 and dried at 80° C. for 15 seconds to form coating films. The coating amount of the dried coating film was 10 mg/$m^2$. The thus obtained original formes for lithographic printing plates were exposed under the following conditions and used for printing. The printing results are shown in Table 8.

| <composition of undercoating solution> | |
|---|---|
| * following polymer compound | 0.2 g |
| * methanol | 100 g |
| * water | 1 g |

[Chemical formula 6]

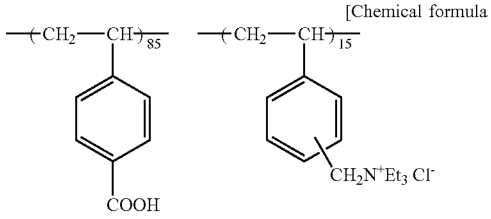

MOLECULAR WEIGHT
28 THOUSANDS

Further, a coating solution for a heat-sensitive layer having the following composition was prepared and applied to an undercoated support for a lithographic printing plate so that a coating amount after drying (heat-sensitive layer coating amount) becomes 1.7 g/$m^2$ and dried to form a heat-sensitive layer (thermal positive type image recording layer) so as to obtain an original forme for a lithographic printing plate.

| <composition of coating solution for the heat-sensitive layer> | |
|---|---|
| * novolak resin (m-cresol/p-cresol = 60/40, | 1.0 g |
| weight average molecular weight of 7,000, containing 0.5 wt % of unreacted cresol) | |
| * cyanine dye A represented by the following structural formula | 0.1 g |
| * tetrahydrophthalic anhydride | 0.05 g |
| * p-toluenesulfonic acid | 0.002 g |
| * ethyl violet having 6-hydroxy-β-naphthalenesulfonic acid as a counter ion | 0.02 g |
| * fluorine-based surfactant (Megaface F-177 of Dainippon Ink and Chemicals, Inc.) | 0.05 g |
| * methyl ethyl ketone | 12 g |

[Chemical formula 7]

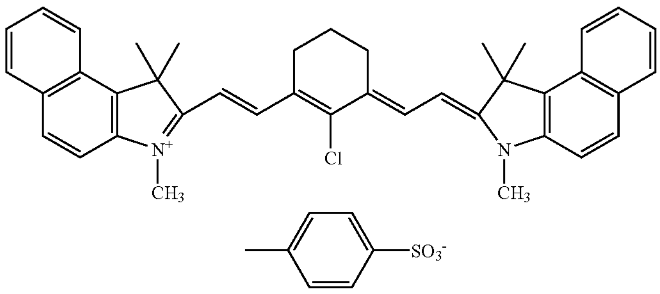

CYANINE DYE A

Exposure and Development

The thermal positive type image recording layer on each original forme for a lithographic printing plate obtained above was exposed and developed by the following methods to obtain a lithographic printing plate.

The original forme for a lithographic printing plate was exposed by the Trendsetter 3244 equipped with a semiconductor laser having an output of 500 mW, a wavelength of 830 nm and a beam diameter of 17 um ($1/e^2$) of CREO Co., Ltd. at a main scanning speed of 5 m/sec and a plate surface energy amount of 50 $mJ/cm^2$.

Thereafter, the original forme was developed with an alkali developer prepared by adding 1 g of $C_{12}H_{25}N(CH_2CH_2COONa)_2$ to 1 liter of an aqueous solution containing 5.0 wt % of a potassium salt consisting of D-Sorbit/potassium oxide $K_20$ which is a combination of a nonreducing sugar and a base and 0.015 wt % of Olfine AK-02 (of Nisshin Chemical Industry., Ltd.). Development was carried out with the PS900NP automatic developer filled with the above alkali developer (of Fuji Photo Film Co., Ltd.) at a development temperature of 25° C. for 12 seconds. After development, the plate was rinsed and treated with gum (FP-2W (1:1)) or the like to obtain a lithographic printing plate in which prepress processing was completed.

<Evaluation of Lithographic Printing Plate >

The stain resistance, stain-resistance after non-usage period, press life and appearance after the application of a damping solution of the obtained lithographic printing plate were evaluated by the following methods.

(3) Stain Resistance

Printing was performed using DIC-GEOS (s) red ink by the Mitsubish Dia type F2 printer (of Mitsubishi Heavy Industries, Ltd.) to print 10,000 sheets. Then, the stain of a blanket after printing was evaluated with the eyes.

The evaluation results are shown in Table 8. Stain resistance was evaluated in 10 levels according to a degree of the stain of the blanket. The larger the figure, the more superior the stain resistance is.

(4) Press Life

Printing was performed using DIC-GEOS (N) black ink of Dainippon Ink and Chemicals, Inc. by the Risron printer of Komori Corporation and the press life was evaluated by means of obtaining the number of printed sheets at which it was confirmed visually that the density of a solid image began to decrease.

The results are shown in Table 8.

TABLE 8

Table 8 Printing results of Examples 101 to 120 and Comparative Examples 11 and 12

| | Used substrate | stain resistance | Number of sheets printed until stain-free printing | Number of printed sheets |
|---|---|---|---|---|
| Example 101 | 1 | 10 | 20 | 4.5 |
| Example 102 | 2 | 10 | 20 | 4.5 |
| Example 103 | 3 | 10 | 20 | 4.5 |
| Example 104 | 4 | 10 | 18 | 4.5 |
| Example 105 | 5 | 10 | 18 | 4.5 |
| Example 106 | 6 | 10 | 18 | 5.0 |
| Example 107 | 7 | 9 | 22 | 4.5 |
| Example 108 | 8 | 10 | 23 | 4.5 |
| Example 109 | 9 | 10 | 19 | 4.5 |
| Example 110 | 10 | 10 | 21 | 4.5 |
| Example 111 | 11 | 10 | 21 | 4.5 |
| Example 112 | 12 | 10 | 21 | 4.6 |
| Example 113 | 13 | 10 | 20 | 4.4 |
| Example 114 | 14 | 9 | 22 | 4.7 |
| Example 115 | 15 | 9 | 21 | 4.7 |
| Example 116 | 16 | 9 | 20 | 4.7 |
| Example 117 | 17 | 9 | 24 | 4.0 |
| Example 118 | 18 | 9 | 24 | 4.5 |
| Example 119 | 16 | 8 | 25 | 5.0 |
| Example 120 | 20 | 10 | 20 | 4.8 |
| Comparative Example 11 | Comparative Example 1 | 1 | 50 | 4.5 |
| Comparative Example 12 | Comparative Example 2 | 3 | 40 | 4.5 |

Example 121

An image recording layer coating solution having the following composition was applied to the substrate 20 of the present invention obtained above and dried in an oven at 60° C. for 150 seconds to obtain the original forme for a lithographic printing plate of Example 121. The dry coating amount of the image recording layer coating solution was 3.0 $g/m^2$.

| (image recording layer coating solution 6) | |
|---|---|
| * sol-gel prepared solution | 7.0 g |
| (a prepared mixture of 9.2 g of tetramethoxysilane, of ethanol, 10.2 g of deionized water and an aqueous solution of nitric acid having a concentration of 0.1 mol/l) | 16.2 g |
| * 20% aqueous solution of colloidal silica (average particle size of 20 nm) | 4.0 g |
| * water self-dispersible hydrophobilized resin fine particles described in Production Example 4 (aqueous solution having a dry solids ratio of 11%) | 10.0 g |
| * 1.5% aqueous solution of a light-heat converting agent (IR having the following structure) | 10.0 g |
| * deionized water | 5 g |

[Chemical formula 8]

-continued (image recording layer coating solution 6)

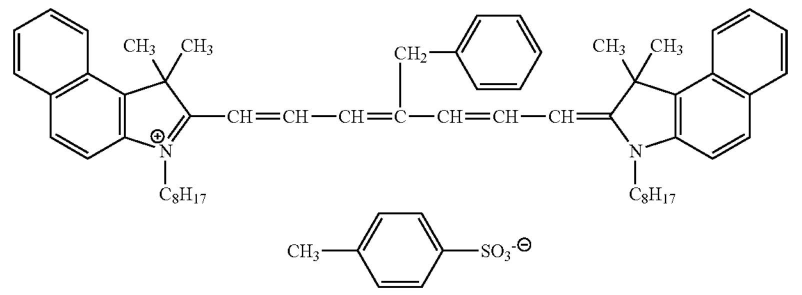

Printing was directly carried out in the same manner as in Example 1 without development. As for the printing quality of the printed sheet, the obtained print was clear and free from scumming, and press life was excellent with over 20,000 or more sheets printed.

According to the present invention, there is provided an original forme for a lithographic printing plate which can be mounted directly to a printer for printing without performing a development thereon after exposure by scanning with infrared ray based on a digital signal, which is used for a heat-sensitive lithographic printing plate and exhibits not only excellent on-press developability, high sensitivity and a long press life, but also superior stain resistance and ink removal during the printing. Also, there is provided an original forme for a lithographic printing plate which comprises a conventional thermal type heat-sensitive layer and is developed after exposure to infrared ray, which is used for a heat-sensitive lithographic printing plate and exhibits not only high sensitivity and a long press life but also superior stain resistance and ink removal during the printing.

What is claimed is:

1. A support for a lithographic printing plate, which comprises a hydrophilic film formed on a metallic base whose surface has been roughened, the thickness of said hydrophilic film is 0.1–5 μm and said hydrophilic film having a heat conductivity of 0.05–0.5 W/(m·K) in the direction of its film thickness.

2. An original forme for a lithographic printing plate, which comprises a recording layer formed on said support for a lithographic printing plate as set forth in claim 1, said recording layer being writable by exposure with infrared laser.

3. An original forme for a lithographic printing plate, comprising a recording layer which is writable by exposure with infrared laser and which is formed on a metallic base whose surface has been roughened by an electrochemical roughening treatment with an aqueous solution containing hydrochloric acid, and the surface of the metallic base comprises a hydrophilic film having a heat conductivity of 0.05–0.5 W/(m·K), wherein said hydrophilic film is an anodic oxide film.

4. An original forme for a lithographic printing plate, comprising a recording layer which is writable by exposure with infrared laser and which is formed on a support for a lithographic printing plate, said support being subjected to electrochemical roughening treatment with an aqueous solution containing hydrochloric acid and including a hydrophilic film having a density of 1000–3200 kg/m$^3$ and/or a porosity of 20–70%, wherein said hydrophilic film is an anodic oxide film.

5. An original forme for a lithographic printing plate, comprising a recording layer which is writable by exposure with infrared laser and which is formed on a support for a lithographic printing plate having a hydrophilic film, said support having a mean opening diameter of roughened small pits of 0.01–3 μm, and a ratio of mean depth to mean opening diameter of the roughened small pits of 0.1–0.5, and said hydrophilic film having a heat conductivity of 0.05–0.5 W/(m·K), wherein said hydrophilic film is an anodic oxide film.

6. An original forme for a lithographic printing plate, comprising a recording layer which is writable by exposure with infrared laser and which is formed on a support for a lithographic printing plate having a hydrophilic film, said support having a mean opening diameter of roughened small pits of 0.01–3 μm, and a ratio of mean depth to mean opening diameter of the roughened small pits of 0.1–0.5, and said hydrophilic film having a density of 1000–3200 kg/in$^3$ and/or a porosity of 20–70%, wherein said hydrophilic film is an anodic oxide film.

7. An original forme for a lithographic printing plate according to claim 3, wherein the mean opening diameter of large undulation of said support for a lithographic printing plate is 3–20 μm.

8. An original forme for a lithographic printing plate according to claim 3, wherein the amount of said anodic oxide film formed is 3.2 g/m$^2$ or more than 3.2 g/m$^2$.

9. An original forme for a lithographic printing plate according to claim 3, wherein the pore diameter on the surface layer of said anodic oxide film is 40 nm or less than 40 nm.

10. An original forme for a lithographic printing plate according to claim 3, wherein said anodic oxide film is pore-sealed.

11. An original forme for a lithographic printing plate according to claim 3, wherein a layer of particles having a mean particle size of 8–800 nm is formed on said anodic oxide film.

12. An original forme for a lithographic printing plate according to claim 3, wherein said anodic oxide film is formed by anodic oxidation that consists of more than two steps.

13. An original forme for a lithographic printing plate according to claim 12, wherein the anodic oxidation is performed with an electrolyte containing sulfuric acid in the first step and then with an electrolyte containing phosphoric acid in the second and subsequent steps.

14. An original forme for a lithographic printing plate according to claim 2, wherein said recording layer is a heat-sensitive layer containing one of: (a) fine polymer particles having a heat reactive functional group; and (b) microcapsules including a compound having heat reactive functional group.

15. A plate-making and printing method for a lithographic printing plate, wherein said original forme for a lithographic printing plate as set forth in claim 2 is printable by one of: exposing it to a laser beam and then directly mounting it to a printing machine; and directly exposing it to a laser beam after mounting it to a printing machine.

* * * * *

UNITED STATES PATENT AND TRADEMARK OFFICE

CERTIFICATE OF CORRECTION

PATENT NO. : 7,118,848 B2
APPLICATION NO. : 10/112729
DATED : October 10, 2006
INVENTOR(S) : Hisashi Hotta, Yoshinori Hotta and Kazuo Maemoto It is certified that error appears in the above-identified patent and that said Letters Patent is hereby corrected as shown below:

Column 72, line 39, please delete "$kg/in^3$" and insert --$kg/m^3$--.

Signed and Sealed this

Second Day of January, 2007

JON W. DUDAS
*Director of the United States Patent and Trademark Office*